(12) United States Patent
Sonoyama et al.

(10) Patent No.: US 10,557,046 B2
(45) Date of Patent: Feb. 11, 2020

(54) FILM-FORMING INK, FILM FORMATION METHOD, DEVICE WITH FILM, AND ELECTRONIC APPARATUS

(71) Applicant: SEIKO EPSON CORPORATION, Tokyo (JP)

(72) Inventors: Takuya Sonoyama, Fujimi-machi (JP); Koji Imamura, Shiojiri (JP); Shotaro Watanabe, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 87 days.

(21) Appl. No.: 15/531,904

(22) PCT Filed: Nov. 30, 2015

(86) PCT No.: PCT/JP2015/005948
§ 371 (c)(1),
(2) Date: May 31, 2017

(87) PCT Pub. No.: WO2016/088352
PCT Pub. Date: Jun. 9, 2016

(65) Prior Publication Data
US 2017/0267880 A1  Sep. 21, 2017

(30) Foreign Application Priority Data
Dec. 2, 2014 (JP) .................................. 2014-244520

(51) Int. Cl.
*C09D 11/03* (2014.01)
*C09D 11/50* (2014.01)
(Continued)

(52) U.S. Cl.
CPC .............. *C09D 11/033* (2013.01); *B05D 7/24* (2013.01); *C09D 11/102* (2013.01); *C09D 11/30* (2013.01);
(Continued)

(58) Field of Classification Search
None
See application file for complete search history.

(56) References Cited

U.S. PATENT DOCUMENTS 9,508,935 B2 * 11/2016 Watanabe ........... H01L 51/0007
9,647,211 B2 *  5/2017 Watanabe .............. C09D 11/50
(Continued)

FOREIGN PATENT DOCUMENTS

EP     1 083 775 A1   3/2001
GB     2460216 A     11/2009
(Continued)

OTHER PUBLICATIONS

Feb. 23, 2016 International Search Report issued with International Patent Application No. PCT/JP2015/005948.
(Continued)

*Primary Examiner* — Helene Klemanski
(74) *Attorney, Agent, or Firm* — Oliff PLC

(57) ABSTRACT

To provide a film-forming ink and a film formation method, capable of making the dimensional accuracy of a film to be formed excellent by increasing the apparent liquid droplet amount of a film-forming ink to be supplied as a liquid droplet into an opening part included in a partition wall, and also to provide a device with a film and an electronic apparatus, each of which has a film formed using the film formation method. A film-forming ink of the invention includes a film-forming material and a liquid medium in which the film-forming material is dissolved or dispersed, wherein the liquid medium contains a first component which has a boiling point at an atmospheric pressure of 200° C. or higher and a second component which has a boiling point at an atmospheric pressure lower than the first component.

14 Claims, 10 Drawing Sheets

(51) Int. Cl.

| | | |
|---|---|---|
| C09D 11/106 | (2014.01) | |
| C09D 11/36 | (2014.01) | |
| C09D 11/38 | (2014.01) | |
| C09D 11/52 | (2014.01) | |
| H01L 51/00 | (2006.01) | |
| G02B 5/20 | (2006.01) | |
| C09D 11/033 | (2014.01) | |
| H05B 33/22 | (2006.01) | |
| H01L 51/50 | (2006.01) | |
| H05B 33/10 | (2006.01) | |
| B05D 7/24 | (2006.01) | |
| H05B 33/12 | (2006.01) | |
| C09D 11/102 | (2014.01) | |
| C09D 11/30 | (2014.01) | |
| C23C 14/06 | (2006.01) | |
| H01L 27/32 | (2006.01) | |
| H01L 51/56 | (2006.01) | |

(52) U.S. Cl.
CPC ............. *C09D 11/36* (2013.01); *C09D 11/38* (2013.01); *C09D 11/50* (2013.01); *C09D 11/52* (2013.01); *C23C 14/06* (2013.01); *G02B 5/20* (2013.01); *H01L 27/322* (2013.01); *H01L 27/3244* (2013.01); *H01L 51/0005* (2013.01); *H01L 51/0007* (2013.01); *H01L 51/0012* (2013.01); *H01L 51/0026* (2013.01); *H01L 51/0039* (2013.01); *H01L 51/50* (2013.01); *H01L 51/56* (2013.01); *H05B 33/10* (2013.01); *H05B 33/12* (2013.01); *H05B 33/22* (2013.01); *H01L 51/5012* (2013.01); *H01L 51/5056* (2013.01)

(56) References Cited

U.S. PATENT DOCUMENTS

| | | | | |
|---|---|---|---|---|
| 10,125,282 | B2* | 11/2018 | Watanabe | C09D 11/033 |
| 10,184,056 | B2* | 1/2019 | Sonoyama | H01L 51/0005 |
| 2005/0058770 | A1 | 3/2005 | Kiguchi et al. | |
| 2006/0045959 | A1* | 3/2006 | Yasukawa | C09D 11/30 |
| | | | | 427/66 |
| 2008/0038488 | A1 | 2/2008 | Yamamoto | |
| 2008/0213493 | A1 | 9/2008 | Mizutani et al. | |
| 2008/0265214 | A1* | 10/2008 | Steiger | H01L 51/0007 |
| | | | | 252/500 |
| 2009/0033208 | A1* | 2/2009 | Nagayama | H01L 51/0007 |
| | | | | 313/504 |
| 2010/0243960 | A1* | 9/2010 | Matsue | H01L 51/0007 |
| | | | | 252/301.35 |
| 2010/0277526 | A1 | 11/2010 | Chen et al. | |
| 2013/0069020 | A1 | 3/2013 | May et al. | |
| 2013/0082249 | A1 | 4/2013 | Kawanami et al. | |
| 2013/0256636 | A1* | 10/2013 | Watanabe | H01L 51/0007 |
| | | | | 257/40 |
| 2014/0138655 | A1 | 5/2014 | Sonoyama et al. | |
| 2014/0232788 | A1 | 8/2014 | Ohashi et al. | |
| 2015/0232746 | A1* | 8/2015 | Sonoyama | H01L 51/0005 |
| | | | | 257/40 |
| 2015/0361282 | A1 | 12/2015 | Nakagawa et al. | |
| 2017/0335126 | A1* | 11/2017 | Watanabe | C09D 11/033 |

FOREIGN PATENT DOCUMENTS

| | | |
|---|---|---|
| JP | H11-054270 A | 2/1999 |
| JP | 2008-239964 A | 10/2008 |
| JP | 2011-507991 A | 3/2011 |
| JP | 2014-077046 A | 5/2014 |
| JP | 2014-132044 A | 7/2014 |
| JP | 2014-156045 A | 8/2014 |
| JP | 2014-198824 A | 10/2014 |
| JP | 2014-205770 A | 10/2014 |
| JP | 2014-218035 A | 11/2014 |
| WO | 02/069119 A1 | 9/2002 |
| WO | 2005/123856 A1 | 12/2005 |
| WO | 2010/127548 A1 | 11/2010 |

OTHER PUBLICATIONS

Apr. 24, 2018 Extended Search Report issued in European Patent Application No. 15864668.7.

* cited by examiner

FILM-FORMING INK, FILM FORMATION METHOD, DEVICE WITH FILM, AND ELECTRONIC APPARATUS

TECHNICAL FIELD

The present invention relates to a film-forming ink, a film formation method, a device with a film, and an electronic apparatus.

BACKGROUND ART

As a film formation method, for example, there has been known a method for forming a film by supplying a film-forming ink obtained by dissolving a film-forming material in a solvent onto a base material using a liquid droplet ejection method, and removing the solvent from the film-forming ink on the base material (see, for example, PTL 1).

It has been proposed that by using this film formation method, for example, an organic layer (for example, a light-emitting layer, a hole transport layer, etc.) of an organic electroluminescence (organic EL) element, a colored layer of a color filter, a conductor pattern of a wiring board, etc. are formed.

Patterning (film formation method) of such an organic layer or a film of a conductor pattern or the like is performed by forming a partition wall (bank) including a concave part corresponding to the shape of a film to be formed to ensure a film-forming region, and then, supplying a film-forming ink into the opening part, and thereafter removing a solvent.

In a film formation method for a film having such a configuration, a film-forming ink (liquid droplet) is supplied into an opening part according to the volume of the opening part surrounded by a partition wall, that is, within such a range that the film-forming ink does not overflow from the opening part.

Here, for example, in the organic EL element, pixel miniaturization has progressed due to the recent demand for high definition, and as a result, accompanying the miniaturization of the volume of the opening part, a solid amount necessary for forming a film is required to be obtained with a small number of liquid droplets.

As a method of solving such a problem, for example, a method of increasing the concentration of a film-forming material (a solute) contained in the film-forming ink is conceivable.

However, this method has a problem that depending on the type of the film-forming material, the concentration thereof cannot be increased due to the limit on the solubility thereof, or the viscosity of the film-forming ink increases as the concentration thereof increases, which causes ejection failure when the film-forming ink is ejected by a liquid droplet ejection method, and so on.

CITATION LIST

Patent Literature

PTL 1: JP-A-11-54270

SUMMARY OF INVENTION

Technical Problem

An object of the invention is to provide a film-forming ink and a film formation method, capable of making the dimensional accuracy of a film to be formed excellent by increasing the apparent liquid droplet amount of a film-forming ink to be supplied as a liquid droplet into an opening part included in a partition wall, and also to provide a device with a film and an electronic apparatus, each of which has a film formed using the film formation method.

Solution to Problem

Such an object is achieved by the following invention.

A film-forming ink of the invention is characterized by including a film-forming material and a liquid medium in which the film-forming material is dissolved or dispersed, wherein the liquid medium contains a first component which has a boiling point at an atmospheric pressure of 200° C. or higher and a second component which has a boiling point at an atmospheric pressure lower than the first component.

By using the film-forming ink having such a configuration, the apparent liquid droplet amount of the film-forming ink to be supplied as a liquid droplet into an opening part included in a partition wall can be increased, and therefore, the dimensional accuracy of a film to be formed is improved.

In the film-forming ink of the invention, it is preferred that the second component has a boiling point at an atmospheric pressure of 50° C. or higher and 170° C. or lower.

By setting the boiling point within such a range, the second component is reliably volatilized after the film-forming ink is ejected as a liquid droplet, and the volume thereof when the liquid droplet lands can be reliably made smaller as compared with the volume thereof when the liquid droplet is ejected.

In the film-forming ink of the invention, it is preferred that the first component has a boiling point at an atmospheric pressure of 250° C. or higher and 340° C. or lower.

According to this, undesirable drying of the film-forming ink (first component) in an atmospheric pressure (normal pressure) can be accurately suppressed, and therefore, the storage stability of the film-forming ink is improved.

In the film-forming ink of the invention, it is preferred that the first component and the second component have a difference in boiling point at an atmospheric pressure of 30° C. or more.

According to this, undesirable volatilization and removal of the first component along with the second component when the second component is removed by volatilization from the film-forming ink can be accurately suppressed or prevented.

In the film-forming ink of the invention, it is preferred that the first component has a solubility capable of dissolving the film-forming material in an amount of 0.5 wt % or more of the first component.

By having a solubility within such a range, it can be said that the first component can sufficiently dissolve the film-forming material, and even if the second component is volatilized after the film-forming ink is ejected, in the film-forming ink, the deposition (elution) of the film-forming material can be accurately suppressed or prevented. Therefore, in the opening part, the film-forming ink can be made to uniformly wet and spread in a state where the film-forming material is homogeneously dissolved in the film-forming ink. Due to this, a film having excellent dimensional accuracy is formed.

In the film-forming ink of the invention, it is preferred that the content of the second component with respect to the total amount of the film-forming ink is 5.0 wt % or more and 50 wt % or less.

According to this, after the film-forming ink is ejected as a liquid droplet, the volume of the liquid droplet can be made sufficiently small, and the apparent liquid droplet amount (supply amount) of the film-forming ink to be supplied as a liquid droplet into the opening part can be increased.

In the film-forming ink of the invention, it is preferred that the film-forming ink is supplied as a liquid droplet to an opening part included in a wall part on a substrate, followed by drying, thereby forming a film.

According to this, a film having excellent dimensional accuracy is formed.

In the film-forming ink of the invention, it is preferred that the liquid droplet has a weight of 2 ng or more and 12 ng or less when it is ejected.

According to this, a liquid droplet having a uniform weight can be ejected from a liquid droplet ejection head.

In the film-forming ink of the invention, it is preferred that the volume of the liquid droplet is set such that the volume thereof at the time of landing is smaller than the volume thereof at the time of ejection by volatilization of the second component after the ejection.

According to this, the apparent liquid droplet amount of the film-forming ink to be supplied as a liquid droplet into the opening part included in the partition wall can be increased, and therefore, the dimensional accuracy of a film to be formed is improved.

A film formation method of the invention is characterized by including a step of supplying the film-forming ink of the invention as a liquid droplet into an opening part (concave part) included in a partition wall provided on a base material, thereby forming a liquid coating film, and a step of drying the liquid coating film by heating, thereby forming a film in the opening part.

According to the film formation method having such a configuration, a film which is homogeneous and has a uniform thickness can be formed with excellent film formation accuracy in an opening part included in the partition wall.

A device with a film of the invention is characterized by including a film formed by the film formation method of the invention or a film obtained by treating the film.

Such a device with a film includes a film having excellent dimensional accuracy, and therefore has excellent reliability.

An electronic apparatus of the invention is characterized by including the device with a film of the invention.

Such an electronic apparatus includes the device with a film having excellent reliability, and therefore has excellent reliability.

DESCRIPTION OF EMBODIMENTS

Figure 1A:
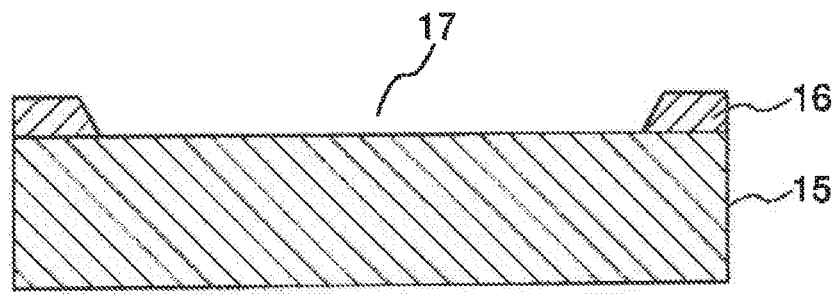
FIG. 1 is a view for illustrating a film formation method of the invention.

Hereinafter, preferred embodiments of the invention will be described in detail.
(Film-Forming Ink)

A film-forming ink of the invention includes a film-forming material and a liquid medium in which the film-forming material is dissolved or dispersed.

In particular, the film-forming ink of the invention is characterized in that the liquid medium contains a first component which has a boiling point at an atmospheric pressure of 200° C. or higher and a second component which has a boiling point at an atmospheric pressure lower than the first component. As will be described in detail later, such a film-forming ink is supplied as a liquid droplet into an opening part (concave part) included in a partition wall provided on a base material, but is configured such that the volume of the liquid droplet at the time of landing in the opening part is smaller than the volume thereof at the time of ejection by volatilization of the second component after ejection. Due to this, the apparent liquid droplet amount (supply amount) of the film-forming ink to be supplied as a liquid droplet into the opening part can be increased, and therefore, a film to be formed can be formed with excellent dimensional accuracy.

Hereinafter, the respective components of the film-forming ink of the invention will be described in detail.
(Film-Forming Material)

The film-forming material contained in the film-forming ink of the invention is a constituent material of a film to be formed or a precursor thereof.

Such a film-forming material is determined according to the type of a film to be formed and is not particularly limited, and various organic materials, various inorganic materials, and mixtures thereof can be used. For example, examples of the film-forming material include a constituent material of each layer (particularly, an organic layer) of an organic electroluminescence (organic EL) element or a precursor thereof, a constituent material of a conductor pattern of a wiring board or a precursor thereof, and a constituent material of a colored layer of a color filter or a precursor thereof, which will be described later.

In this manner, by using a constituent material of an organic layer of an organic electroluminescence element or a precursor thereof as the film-forming material, an organic layer (for example, a hole transport layer, a hole injection layer, a light-emitting layer, an intermediate layer, or the like) of an organic electroluminescence element can be formed. Further, by using a constituent material of a conductor pattern of a wiring board or a precursor thereof as the film-forming material, a conductor pattern of a wiring board can be formed. In addition, by using a constituent material of a colored layer of a color filter or a precursor thereof as the film-forming material, a colored layer of a color filter can be formed. Incidentally, these materials will be described in detail later.

Further, as the film-forming material, for example, two or more types of components selected from the above-mentioned materials may be used in combination.

Incidentally, in the film-forming ink, the film-forming material may be a material which is dissolved in the below-mentioned liquid medium or may be a material which is dispersed therein, however, in the case where the film-forming material is a material which is dispersed in the liquid medium, the average particle diameter of the film-forming material is preferably from 20 to 100 nm, more preferably from 5 to 50 nm. According to this, the dispersion stability of the film-forming material in the film-forming ink can be made excellent.

Further, in the case where the film-forming material contains an organic material as a main material, by appropriately selecting the first component and the second component, the film-forming material can be dissolved in the liquid medium.

On the other hand, in the case where the film-forming material contains an inorganic material or the case where the film-forming material is insoluble in the liquid medium even if the film-forming material is an organic material, the film-forming material may be dispersed in the liquid medium.

The content of the film-forming material in the film-forming ink is determined according to the use of the film-forming ink and is not particularly limited, but is, for example, preferably from 0.01 to 10 wt %, more preferably from 0.05 to 5 wt %. When the content of the film-forming material is a value within the above range, the ejection property (ejection stability) from a liquid droplet ejection head (inkjet head) for film formation can be made particularly excellent.

(Liquid Medium)

The liquid medium contained in the film-forming ink of the invention contains a first component and a second component, and is a component in which the above-mentioned film-forming material is dissolved or dispersed, that is, it is a solvent or a dispersion medium. This liquid medium is such a material that almost the entire amount (the most part) thereof is volatilized and removed by heating in the below-mentioned film formation method (film formation process).

In particular, the liquid medium contained in the film-forming ink of the invention contains a first component which has a boiling point at an atmospheric pressure (normal pressure) (hereinafter also simply referred to as "boiling point") of 200° C. or higher and a second component which has a boiling point at an atmospheric pressure lower than the first component.

In such a film-forming ink, the second component is a component which has a boiling point lower than the first component and has high volatility. Due to this, when the film-forming ink is ejected as a liquid droplet, this second component is volatilized by the time the liquid droplet lands in the opening part included in the partition wall provided on the substrate, and therefore, the volume of the liquid droplet at the time of landing becomes smaller than at the time of the ejection. As a result, the apparent liquid droplet amount (supply amount) of the film-forming ink to be supplied as a liquid droplet into the opening part can be increased.

Further, the first component has a boiling point at an atmospheric pressure of 200° C. or higher and has low volatility, and therefore remains without volatilization from the inside of the film-forming ink even after the liquid droplet lands. Due to this, the film-forming ink supplied as a liquid droplet maintains a liquid state, and thus can wet and spread in the opening part. Then, by heating and drying the film-forming ink in this wet and spread state, a film having excellent dimensional accuracy is formed.

Such a first component and a second component are not particularly limited as long as they have a boiling point relationship as described above and the film-forming ink can dissolve or disperse the film-forming material, and various solvents or various dispersion media can be used. Incidentally, in the following description, a case where at least the first component of the first component and the second component is a solvent capable of dissolving the film-forming material will be described as one example.

Incidentally, in this description, the "normal pressure" refers to a pressure equivalent to the atmospheric pressure, and is specifically, $10^5$ Pa (1013 mbar). Further, the "normal temperature" refers to a range of 20° C.±15° C. (that is, 5° C. or higher and 35° C. or lower).

Further, as the liquid medium, a most suitable medium is selected and can be used according to the type of the film-forming material or the use of the film to be formed.

Further, as the liquid medium, a medium which has the lowest possible aggressiveness to the film-forming material or other components contained in the film-forming ink is preferably used. According to this, alteration or deterioration of the film-forming ink can be reliably suppressed or prevented.

Further, in the case where the liquid medium may remain in the film after film formation, it is preferred to use a medium which least inhibits the properties according to the use of the film as the liquid medium. For example, in the case where the film-forming ink is used for forming an organic layer of an organic EL element, it is preferred to select each component of the liquid medium by also considering the electrical properties. Further, in the case where the film-forming ink is used for forming a colored layer of a color filter, it is preferred to select each component of the liquid medium by also considering the optical properties.

Hereinafter, the first component and the second component will be described in detail.

[First Component]

The first component is a component which has a boiling point at normal pressure (an atmospheric pressure) of 200° C. or higher. Further, in this embodiment, the first component is a component which shows a dissolution property of dissolving the film-forming material.

The first component has low volatility in this manner, and therefore remains without volatilization from the inside of the film-forming ink even after the liquid droplet lands. Then, the film-forming material shows solubility in this first component, and therefore, the film-forming material maintains a state of being dissolved in the first component, that is, in the film-forming ink, and wets and spreads in the opening part in this state. Therefore, a film is formed by heating and drying the film-forming ink thereafter, however, this film can be made to have excellent dimensional accuracy.

Incidentally, this first component is a component which is in the form of a liquid at normal temperature and normal pressure in a state where the above-mentioned second component is dissolved, and is in the form of a liquid also in a state where it exists alone or coexists with the film-forming material. According to this, also in the film-forming ink after the second component is volatilized, the film-forming ink is in the form of a liquid. As a result, the film-forming ink can reliably wet and spread in the opening part, and therefore, a film can be formed with excellent dimensional accuracy.

Such a first component is not particularly limited, however, examples thereof include A-1) 1,1-bis(3,4-dimethylphenyl)ethane (boiling point: 333° C.), A-2) benzyl benzoate (boiling point: 324° C.), A-3) 4-(3-phenylpropyl) pyridine (boiling point: 322° C.), A-4) α,α-dichlorodiphenylmethane (boiling point: 305° C.), A-5) 4-isopropylbiphenyl (boiling point: 298° C.), A-6) N-methyldiphenylamine (boiling point: 297° C.), A-7) dibenzyl ether, (boiling point: 295° C.), A-8) 2,3,5-tri-methyl biphenyl ether (2,3,5-tri-methyl diphenyl ether, 235TMDPE, boiling point: 295° C.), A-9) 2,2,5-tri-methyl biphenyl ether (2,2,5-tri-methyl diphenyl ether, 225TMDPE, boiling point: 290° C.), A-10) ethyl 2-naphthyl ether (boiling point: 282° C.), A-11) 1-propyl-4-phenyl benzene (NPBP, boiling point: 280° C.), A-12) 2-phenoxy 1,4-dimethyl benzene (25DM-DPE, boiling point: 280° C.), A-13) tetraethyleneglycol dimethyl ether (boiling point: 275° C.), A-14) 2-phenoxytetrahydrofuran (2-phenoxytetrahydropuran, boiling point: 274.7° C.), A-15) 2-phenylanisole (boiling point: 274° C.), A-16) 3-phenoxytoluene (boiling point: 273° C.), A-17) 3-phenylpyridine (boiling point: 272° C.), A-18) dimethyl benzyl ether (boiling point: 270° C.), A-19) 2-phenylpyridine (boiling point: 268° C.), A-20) 2-phenoxytoluene (MDPE, boiling point: 265° C.), A-21) diphenyl methane (boiling point: 265° C.), A-22) 1,2-dimethoxy-4-(1-propenyl)benzene (boiling point: 264° C.), A-23) triethyleneglycol butylmethyl ether (boiling point: 261° C.), A-24) diphenyl ether (boiling point: 259° C.), A-25) 4,4'-difluorodiphenylmethane (boiling point: 258° C.), A-26) diethyleneglycol dibutyl ether (boiling point: 256° C.), A-27) 4-methoxybenzaldehyde dimethyl acetal (boiling point: 253° C.), A-28) 1,3-dipropoxybenzene (boiling point: 251° C.), A-29) cyclohexylbenzene (CHB, boiling point: 236° C.), A-30) diethyleneglycol monobutyl ether (boiling point: 230° C.), A-31) 1,3-dimethyl-2-imidazolidinone (DMI, boiling point: 220° C.), A-32) p-tolunitrile (boiling point: 218° C.), A-33) triethyleneglycol dimethyl ether (boiling point: 216° C.), A-34) tripropyleneglycol dimethyl ether (boiling point: 215° C.), A-35) diethyleneglycol butylmethyl ether (boiling point: 212° C.), and A-36) o-toluenitrile (boiling point: 205° C.), and it is possible to use one type or two or more types in combination among these.

This first component is a component which has a boiling point at an atmospheric pressure of 200° C. or higher, but preferably has a boiling point at an atmospheric pressure of 250° C. or higher and 340° C. or lower. According to this, undesirable drying of the film-forming ink (first component) in an atmospheric pressure (normal pressure) can be accurately suppressed, and therefore, the storage stability of the film-forming ink is improved.

Further, the first component is a solvent capable of dissolving the film-forming material in this embodiment, and preferably has a solubility capable of dissolving the film-forming material in an amount of 0.5 wt % or more, more preferably 1.5 wt % or more and 4.5 wt % or less of the first component. By having a solubility within such a range, it can be said that the first component can sufficiently dissolve the film-forming material, and even if the second component is volatilized after the film-forming ink is ejected, in the film-forming ink, the deposition (elution) of the film-forming material can be accurately suppressed or prevented. Therefore, in the opening part, the film-forming ink can be made to uniformly wet and spread in a state where the film-forming material is homogeneously dissolved in the film-forming ink. Due to this, a film having excellent dimensional accuracy is formed.

[Second Component]

The second component is a component which has a boiling point at an atmospheric pressure lower than the first component.

The second component has high volatility in this manner, and therefore, when the film-forming ink is ejected as a liquid droplet, the second component is volatilized by the time the film-forming ink lands in the opening part included in the partition wall provided on the substrate, that is, in a compartment (region) defined by the partition wall. As a result, the volume of the liquid droplet at the time of landing becomes smaller than at the time of the ejection, and therefore, the apparent liquid droplet amount (supply amount) of the film-forming ink to be supplied as a liquid droplet into the opening part can be increased. That is, the supply amount of the film-forming material contained in the film-forming ink into the opening part can be increased.

Further, by including the second component in the film-forming ink, the viscosity of the film-forming ink at the time of ejection can be set to a value suitable for ejection of the film-forming ink, and therefore, the liquid droplet with a uniform size can be ejected with excellent accuracy. Incidentally, specifically, the viscosity of the film-forming ink is preferably set to, for example, about 3 cP or more and 20 cP or less.

Due to the two advantages as described above, even if the opening part to which the film-forming ink is supplied is small, the film-forming material required for forming a film can be uniformly supplied into each opening part.

Incidentally, the second component is preferably a component which is in the form of a liquid at normal temperature and normal pressure. According to this, after the film-forming ink is ejected as a liquid droplet, the second component can be more smoothly volatilized from the film-forming ink.

Further, the second component and the first component are required to be homogeneous throughout the entire film-forming ink also during the long-term storage of the ink, and therefore, components having compatibility with each other are selected, respectively.

Such a second component is not particularly limited, however, examples thereof include B-1) 1,2,4-trimethylbenzene (boiling point: 169° C.), B-2) 1,3,5-trimethylbenzene (boiling point: 165° C.), B-3) anisole (boiling point: 154° C.), B-4) 3-fluoro-o-xylene (boiling point: 150° C.), B-5) 4-heptane (boiling point: 150° C.), B-6) 3-heptane (boiling point: 148° C.), B-7) 2-fluoro-m-xylene (boiling point: 147° C.), B-8) 2-heptane (boiling point: 145° C.), B-9) ethylene glycol monomethyl ether acetate (boiling point: 145° C.), B-10) o-xylene (boiling point: 144° C.), B-11) 2,6-lutidine (boiling point: 144° C.), B-12) 1,2,4-trimethylcyclohexane (boiling point: 142° C.), B-13) m-xylene (boiling point: 139° C.), B-14) p-xylene (boiling point: 138° C.), B-15) 1-pentanol (boiling point: 138° C.), B-16) 2-hexanol (boiling point: 135° C.), B-17) chlorobenzene (boiling point: 131° C.), B-18) cyclopentanone (boiling point: 130° C.), B-19) octane (boiling point: 126° C.), B-20) 1,2-dimethylcyclohexanone (boiling point: 124° C.), B-21) 1,3-dimethylcyclohexanone (boiling point: 124° C.), B-22) ethylene glycol monomethyl ether (boiling point: 124° C.), B-23) 1,4-dimethylcyclohexane (boiling point: 120° C.), B-24) propylene glycol monomethyl ether (boiling point: 120° C.), B-25) 1-butanol (boiling point: 118° C.), B-26) 4-fluorotoluene (boiling point: 116° C.), B-27) 3-pentanol (boiling point: 116° C.), B-28) pyridine (boiling point: 115° C.), B-29) 2-fluorotoluene (boiling point: 114° C.), B-30) 3-fluorotoluene (boiling point: 113° C.), B-31) toluene (boiling point: 111° C.), B-32) 3-pentanone (boiling point: 102° C.), B-33) dioxane (boiling point: 101° C.), B-34) methylcyclohexanone (boiling point: 101° C.), B-35) 1,4-dioxane (boiling point: 101° C.), B-36) 2-pentanone (boiling point: 100° C.), B-37) water (boiling point: 100° C.), B-38) 2-butanol (boiling point: 98° C.), B-39) heptane (boiling point: 98° C.), B-40) 1-propanol (boiling point: 97° C.), B-41) propylene glycol dimethyl ether (boiling point: 97° C.), B-42) acetonitrile (boiling point: 88° C.), B-43) ethylene glycol dimethyl ether (boiling point: 85° C.), B-44) 2-propanol (boiling point: 82° C.), B-45) tert-butanol (boiling point: 82° C.), B-46) cyclohexane (boiling point: 81° C.), B-47) 2-butanone (boiling point: 80° C.), B-48) ethanol (boiling point: 78° C.), B-49) 1,3-dioxolane (boiling point: 76° C.), B-50) hexane (boiling point: 69° C.), B-51) tetrahydrofuran (boiling point: 66° C.), B-52) methanol (boiling point: 65° C.), B-53) acetone (boiling point: 57° C.), and B-54) tert-butyl methyl ether (boiling point: 55° C.), and it is possible to use one type or two or more types in combination among these.

This second component may be any as long as it has a boiling point at an atmospheric pressure lower than the first component, but preferably has a boiling point at an atmospheric pressure of 50° C. or higher and 170° C. or lower, more preferably 100° C. or higher and 170° C. or lower, further more preferably 130° C. or higher and 170° C. or lower. By setting the boiling point within the above preferred range, the second component is reliably volatilized after the film-forming ink is ejected as a liquid droplet, and the volume thereof when the liquid droplet lands can be reliably made smaller than when the liquid droplet is ejected. Further, by setting the boiling point within the above more preferred range, the stability of the film-forming ink when it is stored in the air can also be improved. Further, by setting the boiling point within the above further more preferred range, the ejection stability of the film-forming ink as a liquid droplet can also be enhanced.

Further, the difference in boiling point between the first component and the second component is preferably 30° C. or more and more preferably 60° C. or more. According to this, when the second component is removed by volatilization from the film-forming ink, undesirable volatilization and removal of the first component along with the second component can be accurately suppressed or prevented.

Further, the content of the second component with respect to the total amount of the film-forming ink is preferably 5.0 wt % or more and 50 wt % or less, and preferably 10 wt % or more and 50 wt % or less. When the content is less than the above lower limit, the volume of a liquid droplet after the film-forming ink is ejected as a liquid droplet cannot be made sufficiently small, and depending on the size of the opening part, the effect that the apparent liquid droplet amount (supply amount) of the film-forming ink to be supplied as a liquid droplet into the opening part can be increased may not be able to be sufficiently obtained. Further, when the content exceeds the above upper limit, depending on the type of the first component, the content of the first component is decreased, which causes a decrease in the dissolution ratio of the film-forming material in the film-forming ink, and as a result, the dimensional accuracy of the film may be deteriorated.

Further, the second component is preferably a solvent in which the film-forming material shows solubility, and preferably has a solubility capable of dissolving the film-forming material in an amount of 0.1 wt % or more, more preferably 0.5 wt % or more and 1.0 wt % or less of the second component. According to this, the stability of the film-forming ink during storage is improved.

Incidentally, the liquid medium as described above may contain another component other than the above-mentioned second component and first component as long as the component shows compatibility in the film-forming ink, and more specifically, may contain one type or two or more types of components having a boiling point at an atmospheric pressure lower than the boiling point of the first component and higher than the boiling point of the second component. Incidentally, as this another component, the same component as that described as the first component and the second component can be used.

The film-forming ink as described above is used in a film formation method using an inkjet method (a liquid droplet ejection method) as described later. According to the inkjet method, a uniform number (a uniform liquid droplet amount) of liquid droplets with a uniform size can be relatively easily and reliably supplied into the opening part formed on the substrate.

Hereinafter, the film formation method by an inkjet method using this film-forming ink will be described.

(Film Formation Method)

Next, the film formation method using the above-mentioned film-forming ink, that is, the film formation method of the invention will be described.

Figure 1B:
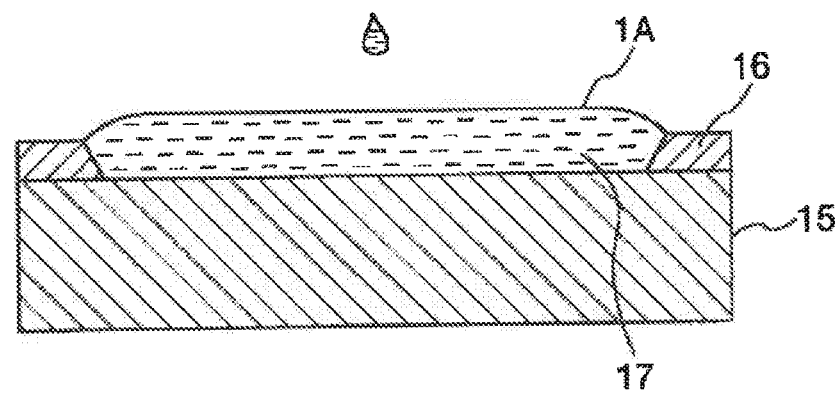
Figure 1C:
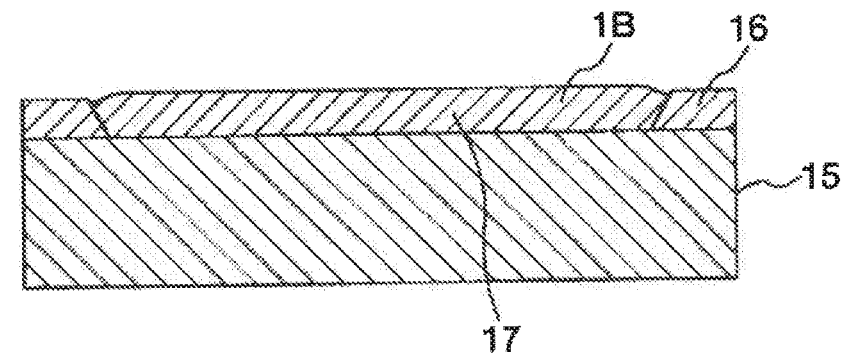
Figure 2:
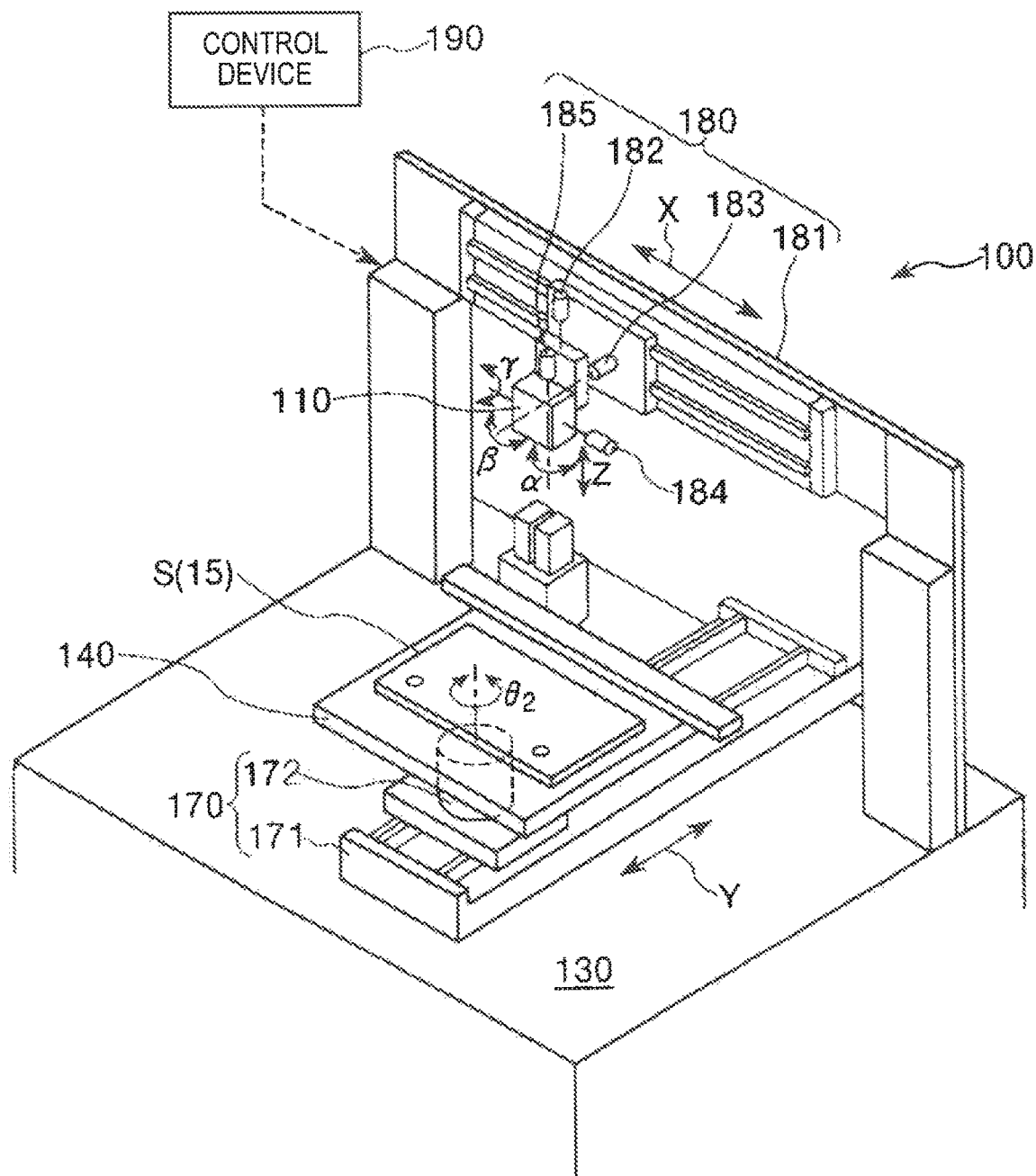
FIG. 2 is a perspective view showing a schematic configuration of a liquid droplet ejection device to be used in the film formation method of the invention.
Figure 3:
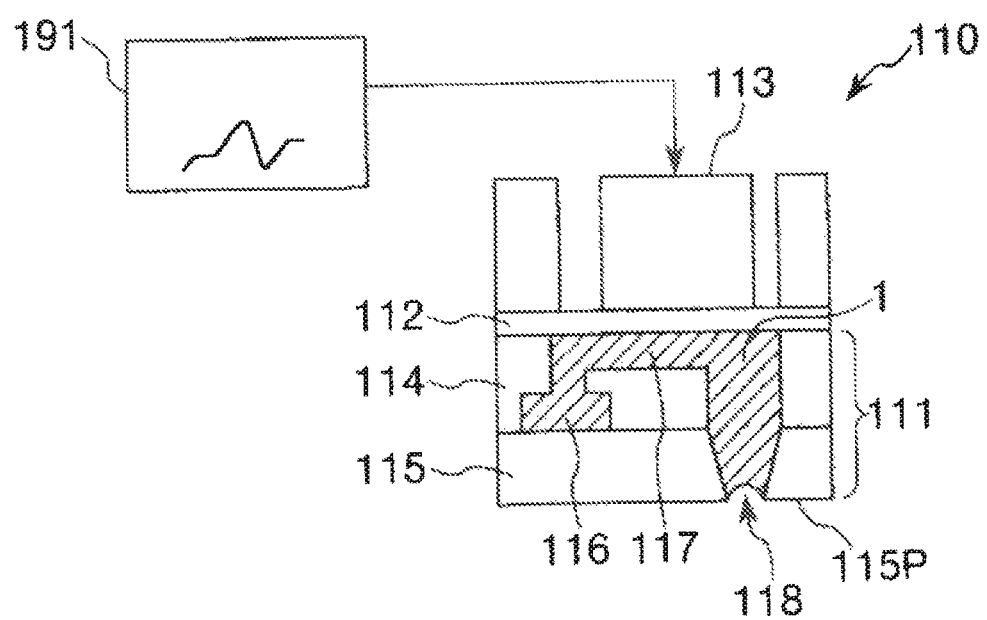
FIG. 3 is a schematic view for illustrating a schematic configuration of a liquid droplet ejection head included in the liquid droplet ejection device shown in FIG. 2.

FIG. 1 is a view for illustrating the film formation method of the invention, FIG. 2 is a perspective view showing a schematic configuration of a liquid droplet ejection device to be used in the film formation method of the invention, and FIG. 3 is a schematic view for illustrating a schematic configuration of a liquid droplet ejection head included in the liquid droplet ejection device shown in FIG. 2.

The film formation method (film production method) of the invention includes [1] a step of supplying the above-mentioned film-forming ink as a liquid droplet into an opening part included in a partition wall provided on a base material, thereby forming a liquid coating film (ink application step), and [2] a step of drying the liquid coating film by heating the liquid coating film, thereby forming a film containing the film-forming material as a main component (drying step).

According to the film formation method having such a configuration, a film which is homogeneous and has a uniform thickness can be formed with excellent film formation accuracy in the opening part included in the partition wall.

Hereinafter, the respective steps of the film formation method of the invention will be sequentially described in detail.

[1] Ink Application Step 1-1

First, as shown in FIG. 1(*a*), a base material 15 provided with a partition wall 16 on the upper surface thereof is prepared.

This base material 15 is an object on which a film to be formed is formed and is not particularly limited, and for example, various substrates, materials obtained by subjecting various substrates to a treatment, a process, or the like, etc. can be used.

Further, the partition wall 16 can be obtained by forming a layer constituted by any of various materials on almost the entire upper surface of the base material 15, and thereafter forming an opening part 17 by patterning this layer.

1-2

Subsequently, as shown in FIG. 1(*b*), in the opening part 17 included in the partition wall 16 provided on the base material 15, the above-mentioned film-forming ink 1 is supplied. By doing this, a liquid coating film 1A composed of the film-forming ink 1 is formed in the opening part 17.

In this embodiment, the film-forming ink 1 is supplied into the opening part 17 by a liquid droplet ejection method. That is, by using a liquid droplet ejection device which ejects the film-forming ink, the film-forming ink 1 is ejected as a liquid droplet, and the film-forming ink 1 is supplied into the opening part 17.

Here, a preferred embodiment of the liquid droplet ejection device will be described.

As shown in FIG. 2, a liquid droplet ejection device 100 includes a liquid droplet ejection head (inkjet head, hereinafter simply referred to as "head") 110, a base 130, a table 140, an ink reservoir part (not shown), a table positioning unit 170, a head positioning unit 180, and a control device 190.

The base 130 is a stand which supports the respective constituent members of the liquid droplet ejection device 100 such as the table 140, the table positioning unit 170, and the head positioning unit 180.

The table 140 is installed in the base 130 through the table positioning unit 170. The table 140 is a member on which the base material 15 is placed.

Further, on the rear surface of the table 140, a rubber heater (not shown) is disposed. The entire upper surface of the base material 15 placed on the table 140 can be heated to a predetermined temperature by the rubber heater.

The table positioning unit 170 includes a first moving unit 171 and a motor 172. The table positioning unit 170 positions the table 140 in the base 130, and thereby the position of the base material 15 in the base 130 is determined.

The first moving unit 171 includes two rails provided substantially parallel to the Y direction, and a support stand which moves on the rails. The support stand of the first moving unit 171 supports the table 140 through the motor 172. Then, by moving the support stand on the rails, the table 140 on which the base material 15 is placed is moved and positioned in the Y direction.

The motor 172 supports the table 140 and swings and positions the table 140 in the $\theta_2$ direction.

The head positioning unit 180 includes a second moving unit 181, a linear motor 182, and motors 183, 184, and 185. The head positioning unit 180 positions the head 110.

The second moving unit 181 includes two support pillars provided vertically from the base 130, a rail stand provided between the support pillars and supported by the support pillars and having two rails, and a support member (not shown) which can move along the rails and supports the head 110. Then, by moving the support member along the rails, the head 110 is moved and positioned in the X direction.

The linear motor 182 is provided near the support member, and can move and position the head 110 in the Z direction.

The motors 183, 184, and 185 swing and position the head 110 in the α, β, and γ directions, respectively.

By the table positioning unit 170 and the head positioning unit 180 as described above, the liquid droplet ejection device 100 is configured to be able to accurately control the relative position and posture between an ink ejection surface 115P of the head 110 and the base material 15 on the table 140.

As shown in FIG. 3, the head 110 ejects the film-forming ink 1 from a nozzle (ejecting part) 118 by an inkjet system (liquid droplet ejection system). In this embodiment, the head 110 uses a piezo system in which an ink is ejected using a piezo element 113 as a piezoelectric element. The piezo system does not apply heat to the film-forming ink 1, and therefore has an advantage that it does not affect the composition of the material, etc.

The head 110 includes a head main body 111, a vibrating plate 112, and a piezo element 113.

The head main body 111 includes a main body 114 and a nozzle plate 115 on the lower end surface thereof. Then, by sandwiching the main body 114 between the plate-shaped nozzle plate 115 and the plate-shaped vibrating plate 112, a reservoir 116 as a space and a plurality of ink chambers 117 branched from the reservoir 116 are formed.

To the reservoir 116, the film-forming ink 1 is supplied from the below-mentioned ink reservoir part. The reservoir 116 forms a flow path for supplying the film-forming ink 1 to each ink chamber 117.

Further, the nozzle plate 115 is attached to the lower end surface of the main body 114, and constitutes the ink ejection surface 115P. In this nozzle plate 115, a plurality of nozzles 118 for ejecting the film-forming ink 1 are opened corresponding to each ink chamber 117. Then, the ink flow path is formed from each ink chamber 117 to the corresponding nozzle (ejection part) 118.

The vibrating plate 112 is attached to the upper end surface of the head main body 111, and constitutes the wall surface of each ink chamber 117. The vibrating plate 112 can vibrate according to the vibration of the piezo element 113.

The piezo element 113 is provided corresponding to each ink chamber 117 on the opposite side to the head main body 111 of the vibrating plate 112. The piezo element 113 is configured such that a piezoelectric material such as quartz is sandwiched between a pair of electrodes (not shown). The pair of electrodes are connected to a driving circuit 191.

Then, when an electrical signal is input to the piezo element 113 from the driving circuit 191, the piezo element 113 is expanded and deformed or contracted and deformed. When the piezo element 113 is contracted and deformed, the pressure in the ink chamber 117 is decreased, and the film-forming ink 1 flows in the ink chamber 117 from the reservoir 116. Further, when the piezo element 113 is expanded and deformed, the pressure in the ink chamber 117 is increased, and the film-forming ink 1 is ejected from the nozzle 118. Incidentally, by changing the applied voltage, the deformation amount of the piezo element 113 can be controlled. Further, by changing the frequency of the applied voltage, the deformation speed of the piezo element 113 can be controlled. That is, by controlling the applied voltage to the piezo element 113, the ejection conditions for the film-forming ink 1 can be controlled.

The control device 190 controls the respective parts of the liquid droplet ejection device 100. For example, by adjusting the waveform of the applied voltage generated by the driving circuit 191, the ejection conditions for the film-forming ink 1 are controlled, or by controlling the head positioning unit 180 and the table positioning unit 170, the ejection position of the film-forming ink 1 to the base material 15 is controlled.

The ink reservoir part (not shown) reserves the film-forming ink 1.

The ink reservoir part (not shown) is connected to the head 110 (reservoir 116) through a conveyance path (not shown).

By using the liquid droplet ejection device 100 as described above, from the head 110, the film-forming ink 1 is ejected as a liquid droplet and lands in the opening part 17 included in the partition wall 16, whereby the film-forming ink 1 is supplied into the opening part 17.

At this time, the second component contained as the liquid medium in the film-forming ink 1 has a boiling point at an atmospheric pressure lower than the first component and has high volatility. Due to this, when the film-forming ink 1 is ejected as a liquid droplet, the second component is volatilized by the time the liquid droplet lands in the opening part 17. As a result, the volume of the liquid droplet at the time of landing becomes smaller than at the time of ejection from the head 110 (see FIG. 1(*b*)). Therefore, the apparent liquid droplet amount (supply amount) of the film-forming ink 1 to be supplied as a liquid droplet into the opening part 17 can be increased. As a result, even if the size of the opening part 17 is small, the film-forming material necessary for forming the film 1B is reliably supplied. Further, it is possible to supply a larger number of liquid droplets into the partition wall 16 by reducing the size of the liquid droplet after the ejection, and therefore, the total liquid amount of the film-forming ink 1 to be supplied into a plurality of partition walls can be easily made uniform. Due to this, the uniformity of the thickness of the film 1B to be formed in each opening part 17 can be improved.

Further, by including the second component in the film-forming ink 1, the viscosity of the film-forming ink 1 at the time of ejection from the head 110 can be set to a value suitable for ejection of the film-forming ink 1, and therefore, the liquid droplet with a uniform size can be ejected with excellent accuracy. Due to this, the supply amount of the film-forming ink 1 to be supplied to each opening part 17 can be made uniform.

Accordingly, the film-forming material required for forming the film 1B can be uniformly supplied into each opening part 17 in which the film 1B is to be formed.

This liquid droplet preferably has a weight of 2 ng or more and 12 ng or less, more preferably has a weight of 5 ng or more and 8 ng or less when it is ejected. According to this, a liquid droplet having a uniform weight can be ejected from the liquid droplet ejection head.

Incidentally, the volume of the film-forming ink at the time of landing becomes smaller than at the time of ejection by volatilization of the second component by the time the liquid droplet lands in the opening part 17 after the liquid droplet is ejected from the head 110. However, such a decrease in the volume continues also after landing, and also continues when the film-forming ink 1 wets and spreads in the opening part 17 and the liquid coating film 1A is formed. The apparent liquid droplet amount (supply amount) of the film-forming ink 1 to be supplied as a liquid droplet into the opening part 17 can be increased also by the decrease in the volume while the ink wets and spreads in this manner.

Then, when the liquid droplet lands in the opening part 17, that is, when the film-forming ink 1 is supplied thereto, this film-forming ink 1 wets and spreads in the opening part 17, and as a result, a liquid coating film 1A composed of the film-forming ink 1 is formed in the opening part 17 (see FIG. 1(*b*)).

At this time, the first component contained as the liquid medium in the film-forming ink 1 has a boiling point at normal pressure (an atmospheric pressure) of 200° C. or higher and has low volatility. Due to this, the first component remains without volatilization from the inside of the film-forming ink 1 even after the liquid droplet lands. Then, the film-forming material shows solubility in this first component, and therefore, the film-forming material maintains a state of being dissolved in the first component, that is, in the film-forming ink 1, and wets and spreads in the opening part 17 in this state, whereby the film-coating film 1A is formed.

The temperature and pressure in the atmosphere in this ink application step [1] are each determined according to the composition of the film-forming ink 1 or the boiling points and the melting points of the first component and the second component, respectively, and are not particularly limited as long as the film-forming ink 1 can be applied into the opening part 17, but are preferably normal temperature and normal pressure. Therefore, it is preferred to use the film-forming ink 1 capable of applying the film-forming ink 1 into the opening part 17 under normal temperature and normal pressure. According to this, the ink application step [1] can be more easily performed.

[2] Drying Step

Subsequently, the liquid coating film 1A (film-forming ink 1) formed in the opening part 17 is heated.

By doing this, the first component is removed from the liquid coating film, and the liquid coating film is dried, whereby as shown in FIG. 1(*c*), a film 1B containing the film-forming material as a main component is formed.

At this time, in the liquid coating film 1A, the first component remains as the liquid medium, and this first component shows a dissolution property of the film-forming material, and therefore, the film-forming material is in a state of being homogeneously dissolved in the liquid coating film 1A. Therefore, the film 1B to be formed by heating and drying this liquid coating film 1A is formed as a film which is homogeneous and has a uniform thickness.

Incidentally, in the case where the second component remains in the liquid coating film, the boiling point of this second component is lower than the boiling point of the first component, and therefore, the second component is also simultaneously removed when the first component is removed by this heating.

The temperature and pressure in the atmosphere in the drying step [2] are each determined according to the composition of the film-forming ink 1 or the boiling points and the melting points of the first component and the second component, respectively, and are not particularly limited as long as the first component can be removed from the liquid coating film 1A on the base material 15. However, the heating temperature is preferably higher than the boiling point of the first component, more preferably higher than the boiling point of the first component by about 5 to 30° C. Further, the pressure is preferably reduced pressure, and more preferably about $10^0$ Pa or more and $10^{-7}$ Pa or less.

Further, the heating and pressure reduction time is not particularly limited, but is set to about 1 minute or more and 30 minutes or less.

Further, the method for heating the liquid coating film 1A is not particularly limited, but can be performed using a hot plate or an infrared ray, or the like, and further, may be performed using a rubber heater provided on the table 140 of the above-mentioned liquid droplet ejection device 100.

Incidentally, the film 1B obtained as described above is a film constituted by a constituent material of a film to be formed or a precursor thereof.

Then, in the case where a precursor is used as the film-forming material, the film 1B is subjected to a predetermined treatment as needed. For example, in the case where the film-forming material is a low-molecular weight compound, by performing a treatment of causing a polymerization reaction of the low-molecular weight compound, a film constituted by including a high-molecular weight compound can be obtained. Further, in the case where the film-forming material is a resin material, by performing a treatment of causing a crosslinking reaction of the resin material, a film constituted by including a high-molecular weight compound can be obtained. Further, in the case where the film-forming material contains metal particles and a binder (resin material), by subjecting the film 1B to a firing treatment, a film constituted by a metal can be obtained.

By undergoing the steps as described above, the film 1B which is homogeneous and has a uniform thickness can be formed with excellent film formation accuracy in the opening part 17.

(Display Device)

Next, a device with a film of the invention will be described.

Figure 4:
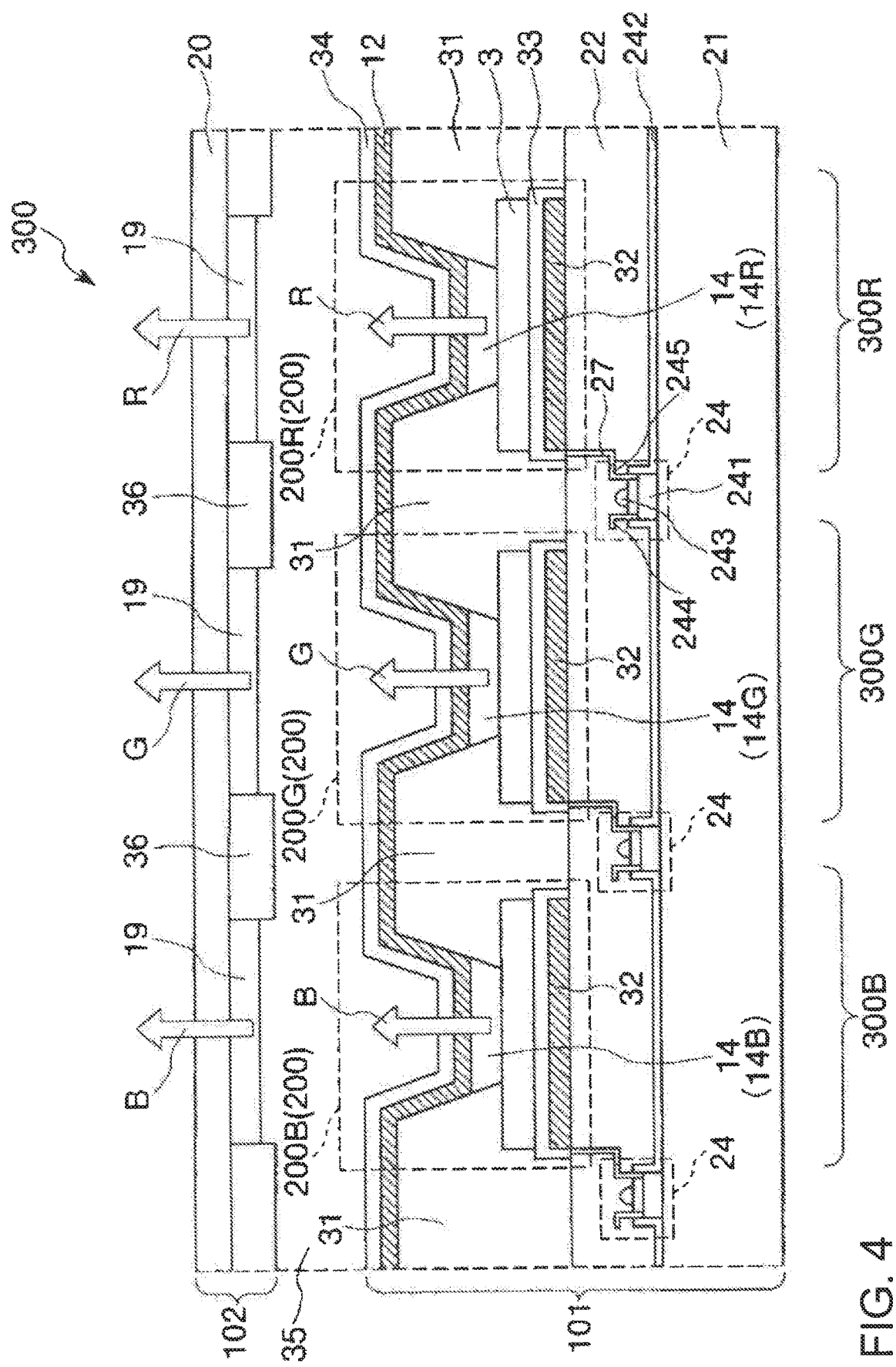
FIG. 4 is a cross-sectional view showing a display device including a light-emitting device and a color filter being one example of a device with a film of the invention.
Figure 5:
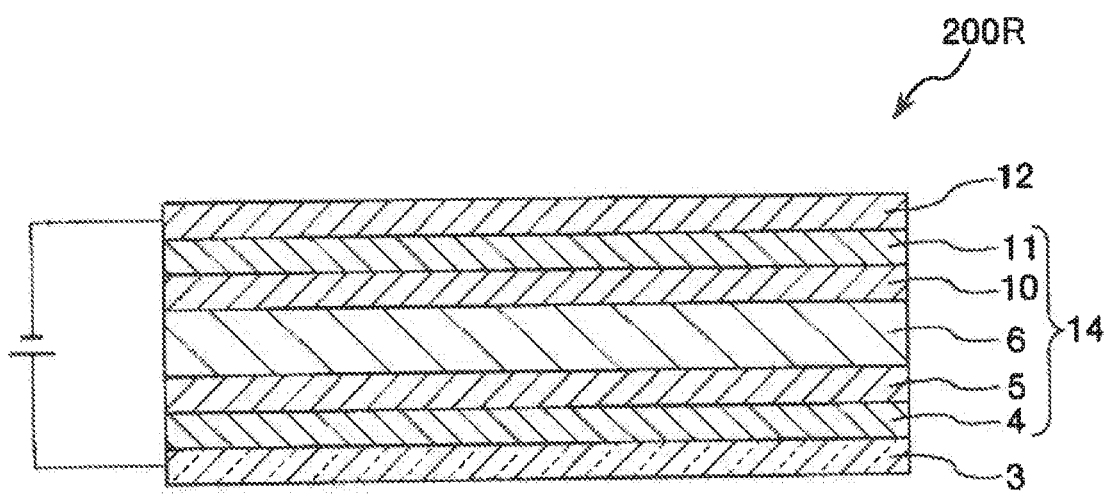
FIG. 5 is a cross-sectional view showing one example of a light-emitting element of the light-emitting device included in the display device shown in FIG. 4.

FIG. 4 is a cross-sectional view showing a display device including a light-emitting device and a color filter being one example of a device with a film of the invention, and FIG. 5 is a cross-sectional view showing one example of a light-emitting element of the light-emitting device included in the display device shown in FIG. 4. Incidentally, in the following description, for the sake of convenience of description, in FIG. 4 and in FIG. 5, the upper side is referred to as "upper", and the lower side is referred to as "lower".

A display device 300 shown in FIG. 4 includes a light-emitting device 101 including a plurality of light-emitting elements 200R, 200G, and 200B, and a transmission filter 102 including a transmission layer 19 provided corresponding to each of the light-emitting elements 200R, 200G, and 200B.

In such a display device 300, a plurality of light-emitting elements 200R, 200G, and 200B and a plurality of transmission layers 19 are provided corresponding to sub-pixels 300R, 300G, and 300B, and a display panel having a top emission structure is constituted.

Incidentally, in this embodiment, an example in which an active matrix system is adopted as the driving system of the display device is described, however, a passive matrix system may be adopted.

The light-emitting device 101 includes a substrate 21, the plurality of light-emitting elements 200R, 200G, and 200B, and a plurality of switching elements 24.

The substrate 21 supports the plurality of light-emitting elements 200R, 200G, and 200B and the plurality of switching elements 24. Each of the light-emitting elements 200R, 200G, and 200B of this embodiment has a configuration (top emission type) in which light is extracted from the opposite side to the substrate 21. Accordingly, it is possible to use either of a transparent substrate or a non-transparent substrate as the substrate 21. Incidentally, in the case where each of the light-emitting elements 200R, 200G, and 200B has a configuration (a bottom emission type) in which light is extracted from the substrate 21 side, as the substrate 21, a substrate which is substantially transparent (colorless and transparent, colored and transparent, or semi-transparent) is used.

Examples of the constituent material of the substrate 21 include resin materials such as polyethylene terephthalate, polyethylene naphthalate, polypropylene, a cycloolefin polymer, polyamide, polyether sulfone, polymethyl methacrylate, polycarbonate, and polyarylate, and glass materials such as quartz glass and soda glass, and it is possible to use one type or two or more types in combination among these.

Examples of the non-transparent substrate include a substrate constituted by a ceramic material such as alumina, a substrate in which an oxide film (insulating film) is formed on the surface of a substrate of a metal such as stainless steel, and a substrate constituted by a resin material.

The average thickness of such a substrate 21 is not particularly limited, but is preferably about 0.1 to 30 mm, more preferably about 0.1 to 10 mm.

On such a substrate 21, the plurality of switching elements 24 are arranged in a matrix form.

Each of the switching elements 24 is provided corresponding to each of the light-emitting elements 200R, 200G, and 200B and is a driving transistor for driving each of the light-emitting elements 200R, 200G, and 200B.

Each of such switching elements 24 includes a semiconductor layer 241 composed of silicon, a gate insulating layer 242 formed on the semiconductor layer 241, a gate electrode 243 formed on the gate insulating layer 242, a source electrode 244, and a drain electrode 245.

A flattening layer 22 constituted by an insulating material is formed so as to cover such a plurality of switching elements 24.

On the flattening layer 22, the light-emitting elements 200R, 200G, and 200B are provided corresponding to each of the switching elements 24.

In the light-emitting element 200R, on the flattening layer 22, a reflective film 32, an anti-corrosion film 33, an anode 3, a stacked body (organic EL light-emitting part) 14 (14R), a cathode 12, and a cathode cover 34 are stacked in this order. In this embodiment, the anode 3 of each of the light-emitting elements 200R, 200G, and 200B constitutes a pixel electrode and is electrically connected to the drain electrode 245 of each of the switching elements 24 through a conductive part (wiring) 27. In addition, as the cathode 12 of each of the light-emitting elements 200R, 200G, and 200B, a common electrode is used.

Each of the stacked bodies 14R, 14G, and 14B included in such light-emitting elements 200R, 200G, and 200B, respectively, can be formed by the film formation method as described above. In such a case, as the film-forming material of the film-forming ink, a constituent material contained in each layer included in the stacked bodies 14R, 14G, and 14B described later is contained. Incidentally, the production method for the stacked bodies 14R, 14G, and 14B will be described in detail later.

Further, as the configuration of each of the light-emitting elements 200G and 200B, the same configuration as that of the light-emitting element 200R can be adopted except for the configuration of the light-emitting layer 6 (that is, an emission color is different). Incidentally, the light-emitting elements 200R, 200G, and 200B may have mutually the same configuration except for the configuration of the light-emitting layer 6, or may have mutually different configurations. For example, the stacked bodies 14R, 14G, and 14B of the light-emitting elements 200R, 200G, and 200B may have mutually the same configuration except for the configuration of the light-emitting layer 6, or may have mutually different configurations. However, in the case where the stacked bodies 14R, 14G, and 14B have mutually different configurations, the effect of applying the film-forming ink and the film formation method of the invention becomes prominent.

A partition wall 31 is provided between the adjacent light-emitting elements 200R, 200G, and 200B.

This partition wall 31 has a function of preventing mutual interference with light emitted from the adjacent light-emitting elements 200R, 200G, and 200B. Further, as will be described in detail later, when the stacked bodies 14R, 14G, and 14B are produced by the liquid droplet ejection method, the partition wall 31 has a function of holding back the ink.

To the light-emitting device 101 configured in this manner, the transmission filter 102 is connected through a resin layer 35 constituted by a thermosetting resin such as an epoxy resin.

The transmission filter 102 includes a substrate 20, a plurality of transmission layers 19, and a light-shielding layer (partition wall) 36.

The substrate (sealing substrate) 20 supports each transmission layer 19 and the partition wall 36. Since each of the light-emitting elements 200R, 200G, and 200B of this embodiment is of a top emission type as described above, and therefore, as the substrate 20, a transparent substrate is used.

The constituent material of such a substrate 20 is not particularly limited as long as the substrate 20 has a light transmission property, and the same constituent material as that of the substrate 20 described above can be used.

The plurality of transmission layers 19 are provided corresponding to each of the light-emitting elements 200R, 200G, and 200B.

The respective transmission layers 19 are filter parts which transmit red light R from the light-emitting element 200R, green light G from the light-emitting element 200G, and blue light B from the light-emitting element 200B, respectively. By transmitting the light R, G, and B emitted from such light-emitting elements 200R, 200G, and 200B through the transmission layers 19, a full-color image can be displayed.

This transmission layer 19 is constituted by a resin material having a light transmission property. As this resin material, a material having a light transmission property is used among those listed as the constituent material of the substrate 21.

A partition wall 36 is formed between the adjacent transmission layers 19.

This partition wall 36 has a function of preventing undesired light emission of the sub-pixel 300R, 300G, or 300B. Further, as will be described in detail later, when the transmission filter 102 is produced by the liquid droplet ejection method, the partition wall 36 has a function of holding back the ink.

Light-Emitting Element

Here, the light-emitting elements 200R, 200G, and 200B will be described in detail with reference to FIG. 5. Incidentally, in the following description, the light-emitting element 200R will be representatively described, and with respect to the light-emitting elements 200G and 200B, points different from those of the light-emitting element 200R are mainly described, and the description of the same points as those of the light-emitting element 200R will be omitted.

The light-emitting element (electroluminescence element) 200R shown in FIG. 5 includes a red light-emitting layer 6 which emits light with an emission spectrum of R (red).

In such a light-emitting element 200R, as described above, the stacked body 14 is interposed between two electrodes (between the anode 3 and the cathode 12), and in this stacked body 14, as shown in FIG. 5, a hole injection layer 4, a hole transport layer 5, a red light-emitting layer 6, an electron transport layer 10, and an electron injection layer 11 are stacked in this order from the anode 3 side to the cathode 12 side.

In other words, the light-emitting element 200R is configured such that the anode 3, the hole injection layer 4, the hole transport layer 5, the red light-emitting layer 6, the electron transport layer 10, the electron injection layer 11, and the cathode 12 are stacked in this order.

Further, in this embodiment, between the anode 3 and the flattening layer 22, the reflective film 32 and the anti-corrosion film 33 are provided, and also on the opposite side to the stacked body 14 of the cathode 12, the cathode cover (sealing layer) 34 is provided.

In such a light-emitting element 200R, an electron is supplied (injected) to the red light-emitting layer 6 from the cathode 12 side, and also a hole is supplied (injected) thereto from the anode 3 side. Then, the hole and the electron are recombined in the red light-emitting layer 6, and an exciton is generated by energy emitted at the time of this recombination, and when the exciton is returned to a ground state, energy (red fluorescence or phosphorescence) is emitted (light emission). In this manner, the light-emitting element 200R emits red light. Then, when such emitted light is extracted from the transmission filter 102 side, the light is enhanced by a resonance effect in which the light is reflected between the reflective film 32 and the cathode 12, however, when the light is extracted, the stacked body 14R is formed with a uniform thickness by applying the film formation method of the invention as described later. Therefore, since the optical path length is made uniform, the emitted light can be enhanced without causing uneven enhancement in an edge portion of the partition wall 31.

The respective layers constituting such a light-emitting element 200R can be formed by the above-mentioned film formation method. In particular, it is preferred to form a layer constituted by an organic material, more preferably a light-emitting layer by the above-mentioned film formation method. In such a case, in the film-forming ink, a material constituting the light-emitting layer described later or a precursor thereof is contained.

Hereinafter, the respective parts constituting the light-emitting element 200R will be sequentially described.

(Anode)

The anode 3 is an electrode which injects holes into the hole transport layer 5 through the hole injection layer 4 described later. As the constituent material of the anode 3, a material having a large work function and excellent electrical conductivity is preferably used.

Examples of the constituent material of the anode 3 include oxides such as ITO (Indium Tin Oxide), IZO (Indium Zinc Oxide), $In_2O_3$, $SnO_2$, Sb-containing $SnO_2$, and Al-containing ZnO, Au, Pt, Ag, Cu, and an alloy containing any of these materials, and it is possible to use one type or two or more types in combination among these.

The average thickness of such an anode 3 is not particularly limited, but is preferably from about 10 to 200 nm, more preferably from about 50 to 150 nm.

(Cathode)

On the other hand, the cathode 12 is an electrode which injects electrons into the electron transport layer 10 through the below-mentioned electron injection layer 11. As the constituent material of this cathode 12, a material having a small work function is preferably used.

Examples of the constituent material of the cathode 12 include Li, Mg, Ca, Sr, La, Ce, Er, Eu, Sc, Y, Yb, Ag, Cu, Al, Cs, Rb, and an alloy containing any of these materials, and it is possible to use one type or two or more types in combination among these (for example, a stacked body of a plurality of layers or the like).

In particular, in the case where an alloy is used as the constituent material of the cathode 12, it is preferred to use an alloy containing a stable metal element such as Ag, Al, or Cu, specifically, an alloy such as MgAg, AlLi, or CuLi. By using such an alloy as the constituent material of the cathode 12, the electron injection efficiency and stability of the cathode 12 can be improved.

The average thickness of such a cathode 12 is not particularly limited, but is preferably from about 80 to 10000 nm, more preferably from about 100 to 500 nm.

(Hole Injection Layer)

The hole injection layer 4 has a function of improving the hole injection efficiency from the anode 3.

The constituent material (hole injection material) of this hole injection layer 4 is not particularly limited, however, examples thereof include poly(3,4-ethylenedioxythiophene/styrenesulfonic acid) (PEDOT/PSS), PEDOT/PSS/Nafion (registered trademark), polythiophene and derivatives thereof, polyaniline and derivatives thereof, polypyrrole and derivatives thereof, and N,N,N',N'-tetraphenyl-p-diaminobenzene and derivatives thereof, and it is possible to use one type or two or more types in combination among these.

The average thickness of such a hole injection layer 4 is not particularly limited, but is preferably from about 5 to 150 nm, more preferably from about 10 to 100 nm.

Incidentally, this hole injection layer 4 can be omitted.

(Hole Transport Layer)

The hole transport layer 5 has a function of transporting the injected holes from the anode 3 to the red light-emitting layer 6 through the hole injection layer 4.

The constituent material (hole transport material) of this hole transport layer 5 is not particularly limited, however, it is possible to use various p-type high-molecular weight materials or various p-type low-molecular weight materials alone or in combination.

Examples of the p-type high-molecular weight material (organic polymer) include materials having an arylamine skeleton such as polyarylamines including poly(2,7-(9,9-di-n-octylfluorene)-(1,4-phenylene-((4-sec-butylphenyl)imino)-1,4-phenylene (TFB), and the like, materials having a fluorene skeleton such as a fluorene bithiophene copolymer, materials having both of an arylamine skeleton and a fluorene skeleton such as a fluorene-arylamine copolymer, poly(N-vinylcarbazole), polyvinylpyrene, polyvinylanthracene, polythiophene, polyalkylthiophene, polyhexylthiophene, poly(p-phenylenevinylene), polythinylene vinylene, a pyreneformaldehyde resin, an ethyl carbazole formaldehyde resin, and derivatives thereof.

Such a p-type high-molecular weight material may also be used as a mixture with another compound. Examples of a mixture containing polythiophene include poly(3,4-ethylenedioxythiophene/styrenesulfonic acid) (PEDOT/PSS).

Examples of the p-type low-molecular weight material include arylcycloalkane-based compounds such as 1,1-bis(4-di-p-triaminophenyl)cyclohexane and 1, 1'-bis(4-di-p-tolylaminophenyl)-4-phenyl-cyclohexane, arylamine-based compounds such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), and N,N'-bis(1-naphthyl)-N,N'-diphenyl-1,1'-biphenyl-4,4'-diamine (α-NPD), and TPTE, phenylenediamine-based compounds such as N,N,N',N'-tetraphenyl-p-phenylenediamine, N,N,N',N'-tetra(p-tolyl)-p-phenylenediamine, and N,N,N',N'-tetra(m-tolyl)-m-phenylenediamine (PDA), carbazole-based compounds such as carbazole, N-isopropyl carbazole, and N-phenyl carbazole, stilbene-based compounds such as stilbene and 4-di-p-tolylaminostilbene, oxazole-based compounds such as $O_xZ$, triphenylmethane-based compounds such as triphenylmethane and m-MTDATA, pyrazoline-based compounds such as 1-phenyl-3-(p-dimethylaminophenyl)pyrazoline, benzine(cyclohexadiene)-based compounds, triazole-based compounds such as triazole, imidazole-based compounds such as imidazole, oxadiazole-based compounds such as 1,3,4-oxadiazole and 2,5-di(4-dimethylaminophenyl)-1,3,4-oxadiazole, anthracene-based compounds such as anthracene and 9-(4-diethylaminostyryl)anthracene, fluorenone-based compounds such as fluorenone, 2,4,7-trinitro-9-fluorenone, and 2,7-bis(2-hydroxy-3-(2-chlorophenylcarbamoyl)-1-naphthylazo)fluorenone, aniline-based compounds such as polyaniline, silane-based compounds, pyrrole-based compounds such as 1,4-dithioketo-3,6-diphenyl-pyrrolo-(3,4-c)pyrrolopyrrole, fluorene-based compounds such as fluorene, porphyrin-based compounds such as porphyrin and metal tetraphenylporphyrin, quinacridone-based compounds such as quinacridone, metallic or non-metallic phthalocyanine-based compounds such as phthalocyanine, copper phthalocyanine, tetra(t-butyl)copper phthalocyanine, and iron phthalocyanine, metallic or non-metallic naphthalocyanine-based compounds such as copper naphthalocyanine, vanadyl naphthalocyanine, and monochloro gallium naphthalocyanine, and benzidine-based compounds such as N,N'-di(naphthalen-1-yl)-N,N'-diphenyl-benzidine and N,N,N',N'-tetraphenylbenzidine.

The average thickness of such a hole transport layer 5 is not particularly limited, but is preferably from about 10 to 150 nm, more preferably from about 10 to 100 nm.

Incidentally, this hole transport layer 5 can be omitted.

(Red Light-Emitting Layer)

This red light-emitting layer (first light-emitting layer) 6 is configured to include a red light-emitting material which emits red (first color) light.

Such a red light-emitting material is not particularly limited, and it is possible to use one type or two or more types in combination among various red fluorescent materials and red phosphorescent materials.

The red fluorescent material is not particularly limited as long as it emits red fluorescence, and examples thereof include perylene derivatives, europium complexes, benzopyrane derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl]-4H-pyran-4-ylidene)propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}alt-co-{2,5-bis(N,N'-diphenylamino)-1,4-phenylene}], and poly[{2-methoxy-5-(2-ethylhexyloxy)-1,4-(1-cyanovinylenephenylene)}-co-{2,5-bis(N,N'-diphenylamino)-1,4-phenylene}].

The red phosphorescent material is not particularly limited as long as it emits red phosphorescence, and examples thereof include metal complexes of iridium, ruthenium, platinum, osmium, rhenium, palladium, or the like, and also includes metal complexes in which at least one of the ligands of these metal complexes has a phenylpyridine skeleton, a bipyridyl skeleton, a porphyrin skeleton, or the like. More specific examples thereof include tris(1-phenylisoquinoline) iridium, bis[2-(2'-benzo[4,5-α]thienyl)pyridinate-N,$C^{3'}$] iridium (acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,$C^{3'}$]iridium and bis(2-phenylpyridine) iridium (acetylacetonate).

Further, in the red light-emitting layer 6, in addition to the above-mentioned red light-emitting material, a host material to which a red light-emitting material is added as a guest material may be contained.

The host material has a function of recombining a hole and an electron to generate an exciton and also transferring the energy of the exciton to the red light-emitting material (Forster transfer or Dexter transfer) to excite the red light-emitting material. In the case where such a host material is used, for example, the host material can be doped with the red light-emitting material which is a guest material as a dopant, and used.

Such a host material is not particularly limited as long as it exhibits the function as described above for the red light-emitting material to be used, however, in the case where the red light-emitting material contains a red fluorescent material, examples thereof include acene derivatives (acene-based materials) such as naphthacene derivatives, naphthalene derivatives, and anthracene derivatives, quinolinate-based metal complexes such as distyrylarylene derivatives, perylene derivatives, distyryl benzene derivatives, distyrylamine derivatives, and tris(8-quinolinolate) aluminum complexes (Alq$_3$), triarylamine derivatives such as tetramers of triphenylamine, oxadiazole derivatives, silole derivatives, dicarbazole derivatives, oligothiophene derivatives, benzopyrane derivatives, triazole derivatives, benzoxazole derivatives, benzothiazole derivatives, quinoline derivatives, and 4,4'-bis(2,2'-diphenylvinyl)biphenyl (DPVBi). It is also possible to use one type or two or more types in combination among these.

In the case where the red light-emitting material (guest material) and the host material as described above are used, the content (doping amount) of the red light-emitting material in the red light-emitting layer 6 is preferably from 0.01 to 10 wt %, more preferably from 0.1 to 5 wt %. By setting the content of the red light-emitting material within such a range, the luminous efficiency can be optimized.

The average thickness of such a red light-emitting layer 6 is not particularly limited, but is preferably from about 10 to 150 nm, more preferably from about 10 to 100 nm.

(Electron Transport Layer)

The electron transport layer 10 has a function of transporting the injected electrons from the cathode 12 to the red light-emitting layer 6 through the electron injection layer 11.

Examples of the constituent material (electron transport material) of the electron transport layer 10 include quinoline derivatives of an organic metal complex or the like including, as a ligand, 8-quinolinol or a derivative thereof such as tris(8-quinolinolate) aluminum (Alq$_3$), oxadiazole derivatives, perylene derivatives, pyridine derivatives, pyrimidine derivatives, quinoxaline derivatives, diphenylquinone derivatives, and nitro-substituted fluorene derivatives, and it is possible to use one type or two or more types in combination among these.

The average thickness of the electron transport layer 10 is not particularly limited, but is preferably from about 0.5 to 100 nm, more preferably from about 1 to 50 nm.

Incidentally, this electron transport layer 10 can be omitted.

(Electron Injection Layer)

The electron injection layer 11 has a function of improving the electron injection efficiency from the cathode 12.

Examples of the constituent material (electron injection material) of the electron injection layer 11 include various inorganic insulating materials and various inorganic semiconductor materials.

Examples of such an inorganic insulating material include alkali metal chalcogenides (oxides, sulfates, selenides, and tellurides), alkaline earth metal chalcogenides, alkali metal halides, and alkaline earth metal halides, and it is possible to use one type or two or more types in combination among these. By constituting the electron injection layer using any of these materials as a main material, the electron injection property can be further improved. In particular, alkali metal compounds (alkali metal chalcogenides, alkali metal halides, and the like) have a very small work function, and by constituting the electron injection layer 11 using this, the light-emitting element 200 capable of obtaining high luminance is realized.

Examples of the alkali metal chalcogenide include Li$_2$O, LiO, Na$_2$S, Na$_2$Se, and NaO.

Examples of the alkaline earth metal chalcogenide include CaO, BaO, SrO, BeO, BaS, MgO, and CaSe.

Examples of the alkali metal halide include CsF, LiF, NaF, KF, LiCl, KCl, and NaCl.

Examples of the alkaline earth metal halide include CaF$_2$, BaF$_2$, SrF$_2$, MgF$_2$, and BeF$_2$.

Further, examples of the inorganic semiconductor material include oxides, nitrides, and oxide-nitrides containing at least one element of Li, Na, Ba, Ca, Sr, Yb, Al, Ga, In, Cd, Mg, Si, Ta, Sb, and Zn, and it is possible to use one type or two or more types in combination among these.

The average thickness of the electron injection layer 11 is not particularly limited, but is preferably from about 0.1 to 1000 nm, more preferably from about 0.2 to 100 nm, further more preferably from about 0.2 to 50 nm.

Incidentally, this electron injection layer 11 can be omitted.

The light-emitting element 200R is configured as described above. Further, the light-emitting elements 200G and 200B include a green light-emitting layer and a blue light-emitting layer as described below, respectively, in place of the red light-emitting layer 6 included in the light-emitting element 200R, and therefore emit light with an emission spectrum of G (green) and light with an emission spectrum of B (blue), respectively.

(Blue Light-Emitting Layer)

The blue light-emitting layer (second light-emitting layer) is configured to include a blue light-emitting material which emits blue (second color) light.

Examples of such a blue light-emitting material include various blue fluorescent materials and blue phosphorescent materials, and it is possible to use one type or two or more types in combination among these.

The blue fluorescent material is not particularly limited as long as it emits blue fluorescence, and examples thereof include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyryl benzene derivatives, tetraphenylbutadiene, 4,4'-bis(9-ethyl-3-carbazovinylene)-1,1'-biphenyl (BCzVBi), poly[(9,9-dioctylfluoren-2,7-diyl)-co-(2,5-dimethoxybenzen-1,4-diyl)], poly[(9,9-dihexyloxyfluoren-2,7-diyl)-alt-co-(2-methoxy-5-{2-ethoxyhexyloxy}phenylen-1,4-diyl)], and poly[(9,9-dioctylfluoren-2,7-diyl)-co-(ethynylbenzene)].

The blue phosphorescent material is not particularly limited as long as it emits blue phosphorescence, and examples thereof include metal complexes of iridium, ruthenium, platinum, osmium, rhenium, palladium, or the like. Specific examples thereof include bis[4,6-difluorophenylpyridinate-N,C$^{2'}$]-picolinate-iridium, tris[2-(2,4-difluorophenyl)pyridinate-N,C$^{2'}$]iridium, bis[2-(3,5-trifluoromethyl)pyridinate-N, C$^{2'}$]-picolinate-iridium, and bis(4,6-difluorophenylpyridinate-N,C$^{2'}$)iridium (acetylacetonate).

Further, in the blue light-emitting layer, in addition to the above-mentioned blue light-emitting material, a host material to which a blue light-emitting material is added as a guest material may be contained.

As such a host material, the same host material as described with respect to the above-mentioned red light-emitting layer (first light-emitting layer) 6 can be used.

Further, as the host material of such a blue light-emitting layer, it is preferred to use an acene derivative (acene-based material) in the same manner as the host material of the red light-emitting layer 6. According to this, the blue light-emitting layer can be made to emit red light with higher luminance and higher efficiency.

(Green Light-Emitting Layer)

The green light-emitting layer (third light-emitting layer) is configured to include a green light-emitting material which emits green (third color) light.

Such a green light-emitting material is not particularly limited, and examples thereof include various green fluorescent materials and green phosphorescent materials, and it is possible to use one type or two or more types in combination among these.

The green fluorescent material is not particularly limited as long as it emits green fluorescence, and examples thereof include coumarin derivatives, quinacridone and derivatives thereof such as quinacridone derivatives, 9,10-bis[(9-ethyl-3-carbazoyl)-vinylenyl]-anthracene, poly(9,9-dihexyl-2,7-vinylenefluorenylene), poly[(9,9-dioctylfluoren-2,7-diyl)-co-(1,4-diphenylenevinylene-2-methoxy-5-{2-ethylhexyloxy}benzene)], and poly[(9,9-dioctyl-2,7-divinylenefluorenylene)-alt-co-(2-methoxy-5-(2-ethoxylhexyloxy)-1,4-phenylene)].

The green phosphorescent material is not particularly limited as long as it emits green phosphorescence, and examples thereof include metal complexes of iridium, ruthenium, platinum, osmium, rhenium, palladium, or the like, and specific examples thereof include fac-tris(2-phenylpyridine)iridium (Ir(ppy)3), bis(2-phenylpyridinate-N,C$^{2'}$) iridium (acetylacetonate), and fac-tris[5-fluoro-2-(5-trifluoromethyl-2-pyridine)phenyl-C,N]iridium.

Further, in the green light-emitting layer, in addition to the above-mentioned green light-emitting material, a host material to which a green light-emitting material is added as a guest material may be contained.

As such a host material, the same host material as described with respect to the above-mentioned red light-emitting layer (first light-emitting layer) 6 can be used.

Further, as the host material of such a green light-emitting layer, it is preferred to use an acene derivative (acene-based material) in the same manner as the host material of the red light-emitting layer 6. According to this, the green light-emitting layer can be made to emit red light with higher luminance and higher efficiency.

(Production Method for Stacked Body in Light-Emitting Element)

The film formation method of the invention is applied to the formation of the stacked bodies 14R, 14G, and 14B of the light-emitting elements 200R, 200G, and 200B included in the display device 300 configured as described above.

Hereinafter, a production method (formation method) for the stacked bodies 14R, 14G, and 14B using the film formation method of the invention will be described.

FIG. 6 is a view illustrating a case where the film formation method of the invention is applied to the production of the stacked body of the light-emitting element included in the display device.

Incidentally, in the following description, the production method is the same as the above-mentioned film formation method except that the film-forming ink for forming each layer included in the stacked bodies 14R, 14G, and 14B is used, and therefore, the description of the same points as those of the above-mentioned film formation method will be omitted.

Further, in this embodiment, the stacked body 14R is configured such that the hole injection layer 4, the hole transport layer 5, the red light-emitting layer 6, the electron transport layer 10, and the electron injection layer 11 are stacked in this order from the anode 3 side to the cathode 12 side, and the stacked bodies 14G and 14B include the green light-emitting layer and the blue light-emitting layer, respectively, in place of the red light-emitting layer 6 included in the stacked body 14R, and therefore, a case where the stacked body 14R is formed on the anode 3 exposed from the opening part of the partition wall 31 provided on the flattening layer 22 will be described below as an example.

A-1

Figure 6A:
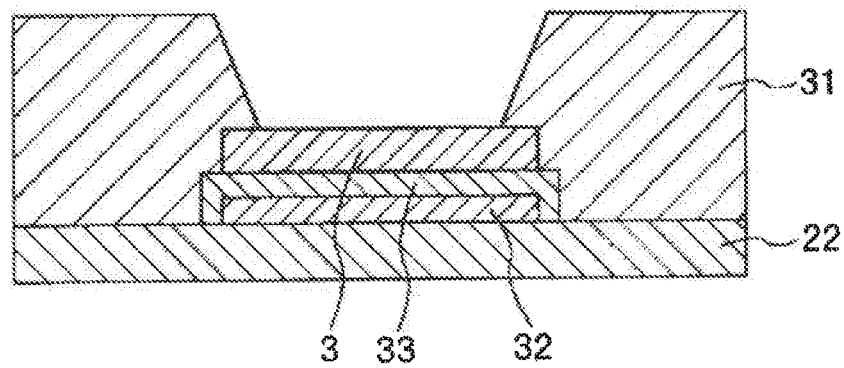
FIG. 6 is a view illustrating a case where the film formation method of the invention is applied to the production of a stacked body of the light-emitting element included in the display device.
Figure 6B:
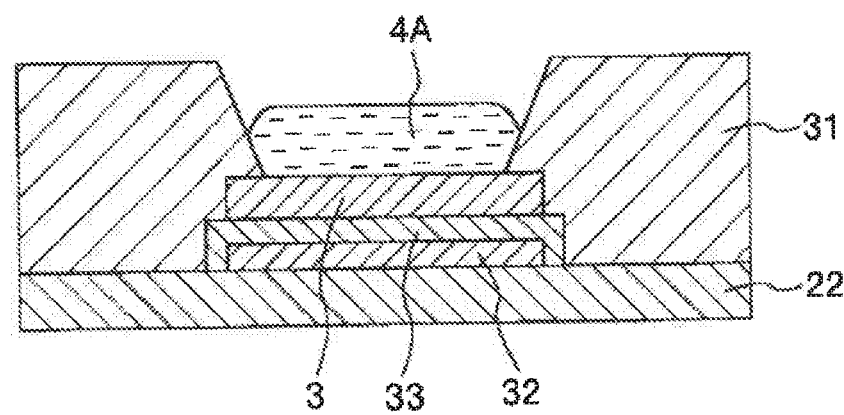

First, on the anode 3 exposed from the opening part of the partition wall 31 provided on the flattening layer 22 as shown in FIG. 6(a), a film-forming ink 4A is supplied (see FIG. 6(b)).

This step can be performed in the same manner as the ink application step [1] of the film formation method described above.

The film-forming ink 4A contains a film-forming material and a liquid medium, and is configured in the same manner as the above-mentioned film-forming ink 1.

Further, the film-forming ink 4A contains a hole injection material as the film-forming material.

Incidentally, on the surface of the anode 3 exposed from the opening part of the partition wall 31, a hydroxy group is exposed in the case where the above-mentioned oxide (metal oxide) is used as the constituent material of the anode 3. Due to this, by using a component including a hydroxy group as the second component, the surface of the anode 3 and the second component have excellent affinity. Therefore, the film-forming ink 4A supplied as a liquid droplet into the opening part can be made to wet and spread on the anode 3 more smoothly.

Further, in the case where the surface of a partition wall surface 311 of the partition wall 31 is subjected to a surface treatment of imparting liquid repellency, a fluorine element is exposed on this surface. Due to this, by using a component including a hydroxy group as the second component, a repelling force is generated between the surface of the partition wall surface 311 and the film-forming ink 4A. As a result, on the partition wall surface 311, seeping-up of the film-forming material contained in the film-forming ink 4A can be more accurately suppressed or prevented.

Then, the film-forming ink 4A applied onto the anode 3 is subjected to vacuum drying or heating drying in the same manner as the drying step [2] of the film formation method described above.

Figure 6C:
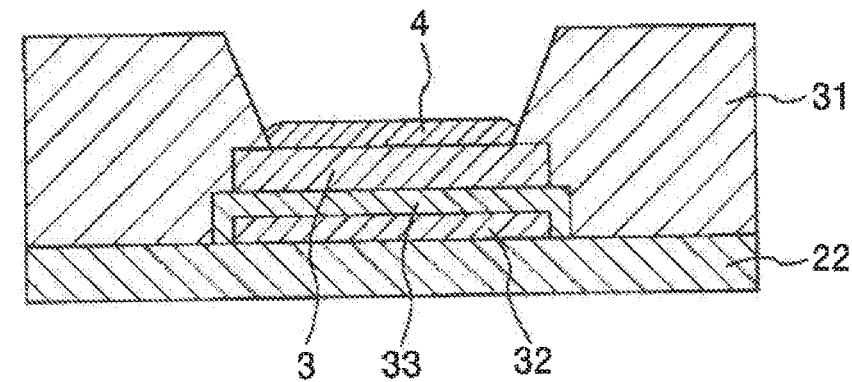

By doing this, as shown in FIG. 6(c), the first component is removed from the film-forming ink 4A, and as a result, the film-forming ink 4A is dried, whereby the hole injection layer 4 is formed.

A-2

Subsequently, on the hole injection layer 4 formed in the opening part of the partition wall 31, a film-forming ink 5A is supplied in the same manner as the ink application step [1] of the film formation method described above.

The film-forming ink 5A contains a film-forming material and a liquid medium, and is configured in the same manner as the above-mentioned film-forming ink 1.

Further, the film-forming ink 5A contains a hole transport material as the film-forming material.

Incidentally, in the case where the surface of the partition wall surface 311 of the partition wall 31 is subjected to a surface treatment of imparting liquid repellency, a fluorine element is exposed on this surface. Due to this, by using a component including a hydroxy group as the second component, a repelling force is generated between the surface of the partition wall surface 311 and the film-forming ink 5A. As a result, on the partition wall surface 311, seeping-up of the film-forming material contained in the film-forming ink 5A can be more accurately suppressed or prevented.

Then, the film-forming ink 5A applied onto the hole injection layer 4 is subjected to vacuum drying or heating drying in the same manner as the drying step [2] of the film formation method described above.

By doing this, the first component is removed from the film-forming ink 5A, and as a result, the film-forming ink 5A is dried, whereby the hole transport layer 5 is formed.

A-3

Subsequently, on the hole transport layer 5 formed in the opening part of the partition wall 31, a film-forming ink 6A is supplied in the same manner as the ink application step [1] of the film formation method described above.

Incidentally, in the case where the surface of the partition wall surface 311 of the partition wall 31 is subjected to a surface treatment of imparting liquid repellency, a fluorine element is exposed on this surface. Due to this, by using a component including a hydroxy group as the second component, a repelling force is generated between the surface of the partition wall surface 311 and the film-forming ink 6A. As a result, on the partition wall surface 311, seeping-up of the film-forming material contained in the film-forming ink 6A can be more accurately suppressed or prevented.

The film-forming ink 6A contains a film-forming material and a liquid medium, and is configured in the same manner as the above-mentioned film-forming ink 1.

Further, the film-forming ink 6A contains a red light-emitting material as the film-forming material.

Then, the film-forming ink 6A applied onto the hole transport layer 5 is subjected to vacuum drying or heating drying in the same manner as the drying step [2] of the film formation method described above.

By doing this, the first component is removed from the film-forming ink 6A, and as a result, the film-forming ink 6A is dried, whereby the red light-emitting layer 6 is formed.

A-4

Subsequently, on the red light-emitting layer 6 formed in the opening part of the partition wall 31, the electron transport layer 10 is formed.

This electron transport layer 10 is preferably formed using, for example, a gas-phase process such as a sputtering method, a vacuum vapor deposition method, or a CVD method, although it is not particularly limited. By using a gas-phase process, the electron transport layer 10 can be reliably formed while preventing layer dissolution between the red light-emitting layer 6 and the electron transport layer 10.

A-5

Subsequently, on the electron transport layer 10 formed in the opening part of the partition wall 31, the electron injection layer 11 is formed.

This electron injection layer 11 is preferably formed using, for example, a gas-phase process such as a sputtering method, a vacuum vapor deposition method, or a CVD method, although it is not particularly limited. By using a gas-phase process, the electron injection layer 11 can be reliably formed while preventing layer dissolution between the electron transport layer 10 and the electron injection layer 11.

As described above, on the anode 3 exposed from the opening part of the partition wall 31, the stacked body 14R can be produced. Incidentally, the stacked bodies 14R, 14G, and 14B may be formed independently of one another, or may be formed collectively.

The thus obtained stacked bodies 14R, 14G, and 14B included in the display device 300 which is the device with a film can be formed with excellent dimensional accuracy while preventing the stacked bodies from mixing with one another by the partition wall 31, and therefore have desired optical properties, and thus have excellent reliability.

The application of such a film formation method is not limited to the production of the stacked bodies 14R, 14G, and 14B, and the method can also be applied to the production of a color filter 103.

(Production Method for Color Filter)

Next, as a more specific application example of the film formation method of the invention, a production method for the color filter 103 described above will be described.

FIG. 7 is a view illustrating a case where the film formation method of the invention is applied to the production of the color filter.

Incidentally, in the following description, the production method is the same as the above-mentioned film formation method except that a plurality of types of film-forming inks of different colors are used, and therefore, the description of the same points as those of the above-mentioned film formation method will be omitted.

Figure 7A:
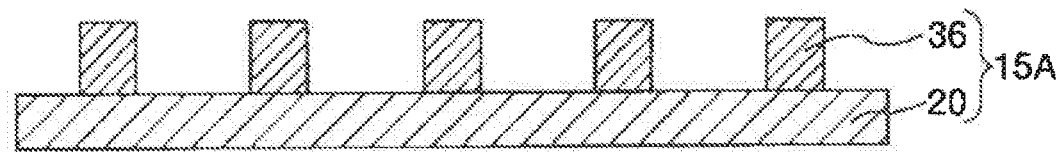
FIG. 7 is a view illustrating a case where the film formation method of the invention is applied to the production of the color filter.
Figure 7B:
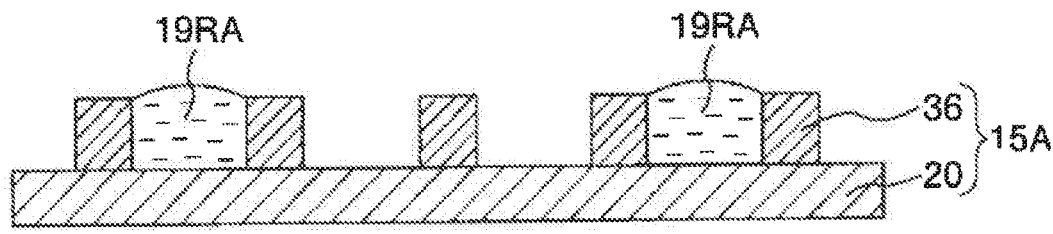
Figure 7C:
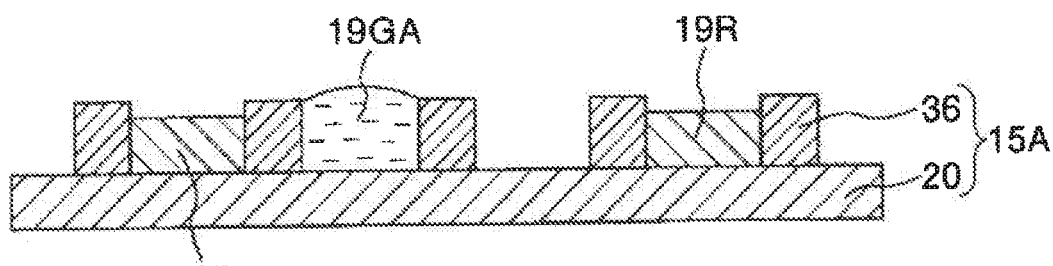
Figure 7D:
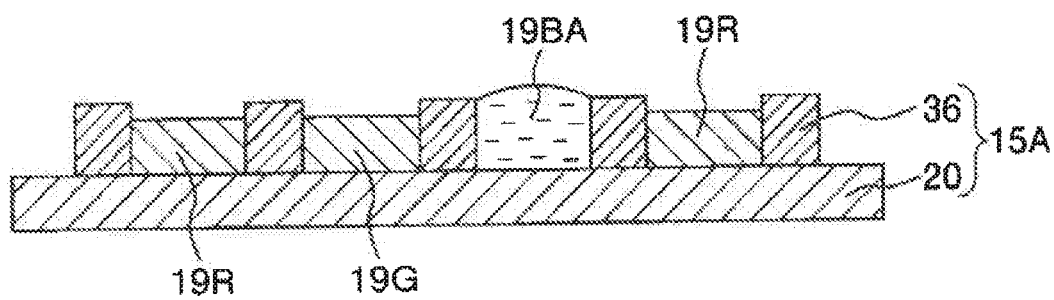
Figure 7E:
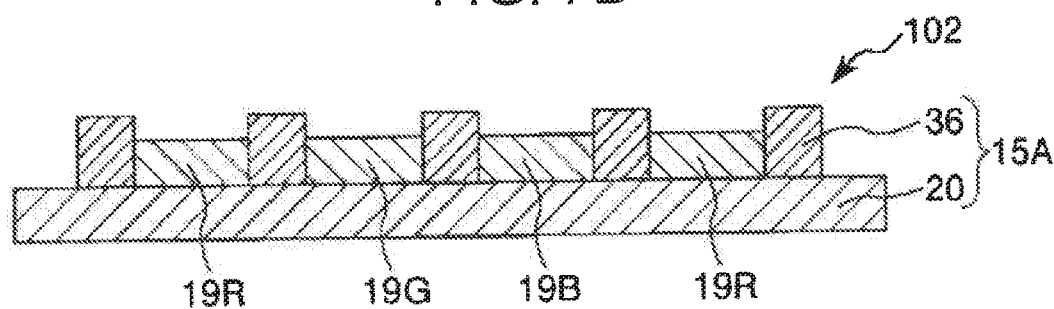

This color filter 103 includes a plurality of colored layers 19R, 19G, and 19B, a light-shielding layer (partition wall) 36, and a substrate 20 which supports the respective colored layers 19R, 19G, and 19B and the partition wall 36 as shown in FIG. 7(e).

In this color filter 103, the colored layer 19R is a filter part which converts light WR from the light-emitting element 200R into red. Further, the colored layer 19G is a filter part which converts light WG from the light-emitting element 200G into green. Further, the colored layer 19B is a filter part which converts light WB from the light-emitting element 200B into blue.

In the color filter 103 having such a configuration, the film-forming ink of the invention is used for the formation of each of the colored layers 19R, 19G, and 19B, however, hereinafter, a production method for the color filter 103 using the film-forming ink of the invention will be described.

B-1

First, as shown in FIG. 7(a), a base material 15A in which the partition wall 36 (bank) is formed on the substrate 20 is prepared.

Further, according to need, the base material 15A may be lyophilized by an oxygen plasma treatment under an atmospheric pressure before the partition wall 36 (bank) is formed.

Further, the surface of the partition wall 36 may be subjected to a surface treatment of imparting liquid repellency.

B-2

Subsequently, as shown in FIG. 7(b), a film-forming ink 19RA is supplied to a compartment in which the colored layer 19R is to be formed.

This step can be performed in the same manner as the ink application step [1] of the film formation method described above.

The film-forming ink 19RA contains a film-forming material and a liquid medium, and is configured in the same manner as the above-mentioned film-forming ink 1.

Further, the film-forming material of the film-forming ink 19RA contains a colorant such as a red dye or pigment. Further, in the film-forming material of the film-forming ink 19RA, for example, a resin material such as an acrylic resin may be contained.

B-3

Then, the film-forming ink 19RA applied onto the base material 15A is heated in the same manner as the drying step [2] of the film formation method described above.

By doing this, as shown in FIG. 7(c), the first component is removed from the film-forming ink 19RA, and as a result, the film-forming ink 19RA is dried, whereby the colored layer 19R is formed.

Thereafter, as shown in FIG. 7(c), a film-forming ink 19GA is supplied to a compartment in which the colored layer 19G is to be formed. At this time, the colored layer 19R is in a solid state, and therefore, does not flow out to the other compartments.

The application of the film-forming ink 19GA to the base material 15A in this step can also be performed in the same manner as the ink application step [1] of the film formation method described above.

The film-forming ink 19GA contains a film-forming material and a liquid medium, and is configured in the same manner as the above-mentioned film-forming ink 1.

Further, the film-forming material of the film-forming ink 19GA contains a colorant such as a green dye or pigment. Further, in the film-forming material of the film-forming ink 19GA, for example, a resin material such as an acrylic resin may be contained.

B-4

Then, the film-forming ink 19GA applied onto the base material 15A is heated in the same manner as the drying step [2] of the film formation method described above.

By doing this, as shown in FIG. 7(d), the first component is removed from the film-forming ink 19GA, and as a result, the film-forming ink 19GA is dried, whereby the colored layer 19G is formed.

Thereafter, as shown in FIG. 7(d), a film-forming ink 19BA is supplied to a compartment in which the colored layer 19B is to be formed. At this time, each of the colored layers 19R and 19G is in a solid state, and therefore, does not flow out to the other compartments.

The application of the film-forming ink 19BA to the base material 15A in this step can also be performed in the same manner as the ink application step [1] of the film formation method described above.

The film-forming ink 19BA contains a film-forming material and a liquid medium, and is configured in the same manner as the above-mentioned film-forming ink 1.

Further, the film-forming material of the film-forming ink 19BA contains a colorant such as a blue dye or pigment. Further, in the film-forming material of the film-forming ink 19BA, for example, a resin material such as an acrylic resin may be contained.

B-5

Then, the film-forming ink 19BA applied onto the base material 15A is heated in the same manner as the drying step [2] of the film formation method described above.

By doing this, as shown in FIG. 7(e), the first component is removed from the film-forming ink 19BA, and as a result, the film-forming ink 19BA is dried, whereby the colored layer 19B is formed.

As described above, the colored layers 19R, 19G, and 19B in a solid state are formed in the opening parts on the base material 15A. Incidentally, the colored layers 19R, 19G, and 19B may be collectively formed by collectively performing the same treatment as the drying step [2] of the film formation method described above after all the film-forming inks 19RA, 19GA, and 19BA are applied onto the base material 15A.

As described above, the color filter 103 can be produced.

In the thus obtained color filter 103 which is the device with a film, color mixing of the colored layers 19R, 19G, and 19B is prevented, and also the colored layers 19R, 19G, and 19B can be formed with excellent dimensional accuracy, and therefore, the color filter 103 has desired optical properties, and thus has excellent reliability.

( Other Application Example)

Further, the film-forming ink of the invention can be used for forming a conductor pattern of a wiring board.

The film-forming ink for forming the conductor pattern is an ink for forming a conductor pattern precursor.

Specifically, the film-forming material of the film-forming ink contains metal particles. Then, the film-forming ink is a dispersion liquid in which the metal particles are dispersed in a dispersion medium.

As such metal particles, silver particles are preferably used, and the average particle diameter of the silver particles is preferably 1 nm or more and 100 nm or less, more preferably 10 nm or more and 30 nm or less. According to this, the ejection stability of the ink can be further increased, and also a fine conductor pattern can be easily formed. Incidentally, in this description, the "average particle diameter" refers to an average particle diameter on a volume basis unless otherwise noted.

Further, the silver particles (metal particles) are preferably dispersed in a dispersion medium as silver colloidal particles (metal colloidal particles) with a dispersant attached to the surface thereof. According to this, the dispersibility of the silver particles in an aqueous dispersion medium becomes particularly excellent, and the ejection stability of the ink becomes particularly excellent.

The content of the silver colloidal particles in the ink is preferably 1 wt % or more and 60 wt % or less, more preferably 10 wt % or more and 50 wt % or less.

Further, the film-forming material of the film-forming ink for forming the conductor pattern may contain an organic binder. The organic binder prevents aggregation of the silver particles in the conductor pattern precursor formed by the film-forming ink. Further, during sintering, the organic binder can be decomposed and removed, and the silver particles in the conductor pattern precursor are bound to one another, thereby forming the conductor pattern.

The organic binder is not particularly limited, however, examples thereof include polyethylene glycols such as polyethylene glycol #200 (weight average molecular weight: 200), polyethylene glycol #300 (weight average molecular weight: 300), polyethylene glycol #400 (average molecular weight: 400), polyethylene glycol #600 (weight average molecular weight: 600), polyethylene glycol #1000 (weight average molecular weight: 1000), polyethylene glycol #1500 (weight average molecular weight: 1500), polyethylene glycol #1540 (weight average molecular weight: 1540), and polyethylene glycol #2000 (weight average molecular weight: 2000), polyvinyl alcohols such as polyvinyl alcohol

200 (weight average molecular weight: 200), polyvinyl alcohol #300 (weight average molecular weight: 300), polyvinyl alcohol #400 (average molecular weight: 400), polyvinyl alcohol #600 (weight average molecular weight: 600), polyvinyl alcohol #1000 (weight average molecular weight: 1000), polyvinyl alcohol #1500 (weight average molecular weight: 1500), polyvinyl alcohol #1540 (weight average molecular weight: 1540), and polyvinyl alcohol #2000 (weight average molecular weight: 2000), and polyglycerin compounds having a polyglycerin skeleton such as polyglycerin and polyglycerin esters, and it is possible to use one type or two or more types in combination among these. Further, examples of the polyglycerin ester include polyglycerin monostearate, tristearate, tetrastearate, monooleate, pentaoleate, monolaurate, monocaprylate, polyricinoleate, sesquistearate, decaoleate, and sesquioleate.

Further, the content of the organic binder in the ink is preferably 1 wt % or more and 30 wt % or less, more preferably 5 wt % or more and 20 wt % or less. According to this, while making the ejection stability of the ink particularly excellent, the occurrence of a crack or wiring disconnection can be more effectively prevented. On the other hand, when the content of the organic binder is less than the above lower limit, depending on the composition of the organic binder, the effect of preventing the occurrence of a crack is decreased in some cases. Further, when the content of the organic binder exceeds the above upper limit, depending on the composition of the organic binder, it is difficult to make the viscosity of the ink sufficiently low in some cases.

(Electronic Apparatus)

Figure 8:
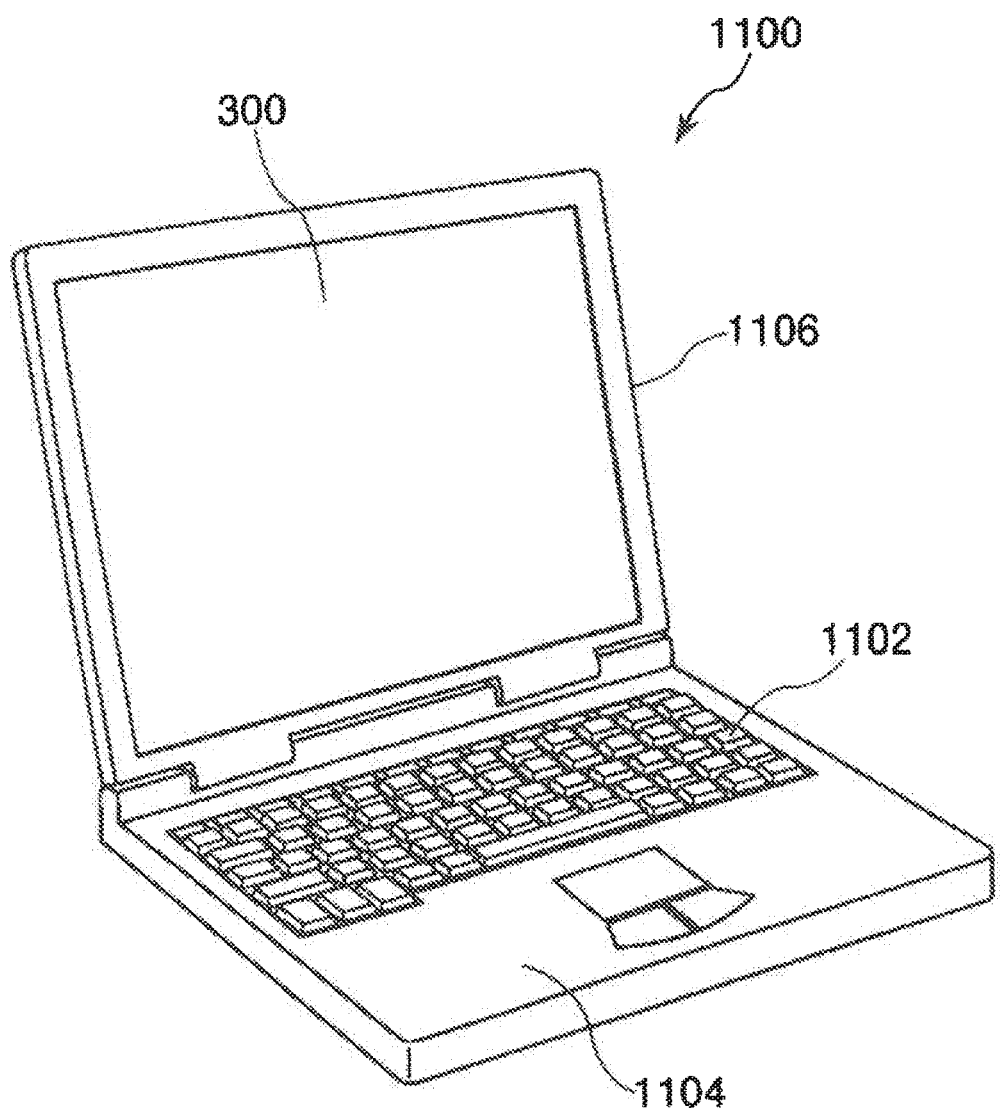
FIG. 8 is a perspective view showing a configuration of a mobile-type (or notebook-type) personal computer to which an electronic apparatus of the invention is applied.

FIG. 8 is a perspective view showing a configuration of a mobile-type (or notebook-type) personal computer to which an electronic apparatus of the invention is applied.

In this drawing, a personal computer 1100 is constituted by a main body part 1104 provided with a keyboard 1102 and a display unit 1106 provided with a display part, and the display unit 1106 is supported rotatably with respect to the main body part 1104 through a hinge structure part.

In this personal computer 1100, the display part included in the display unit 1106 is constituted by the above-mentioned display device 300.

Figure 9:
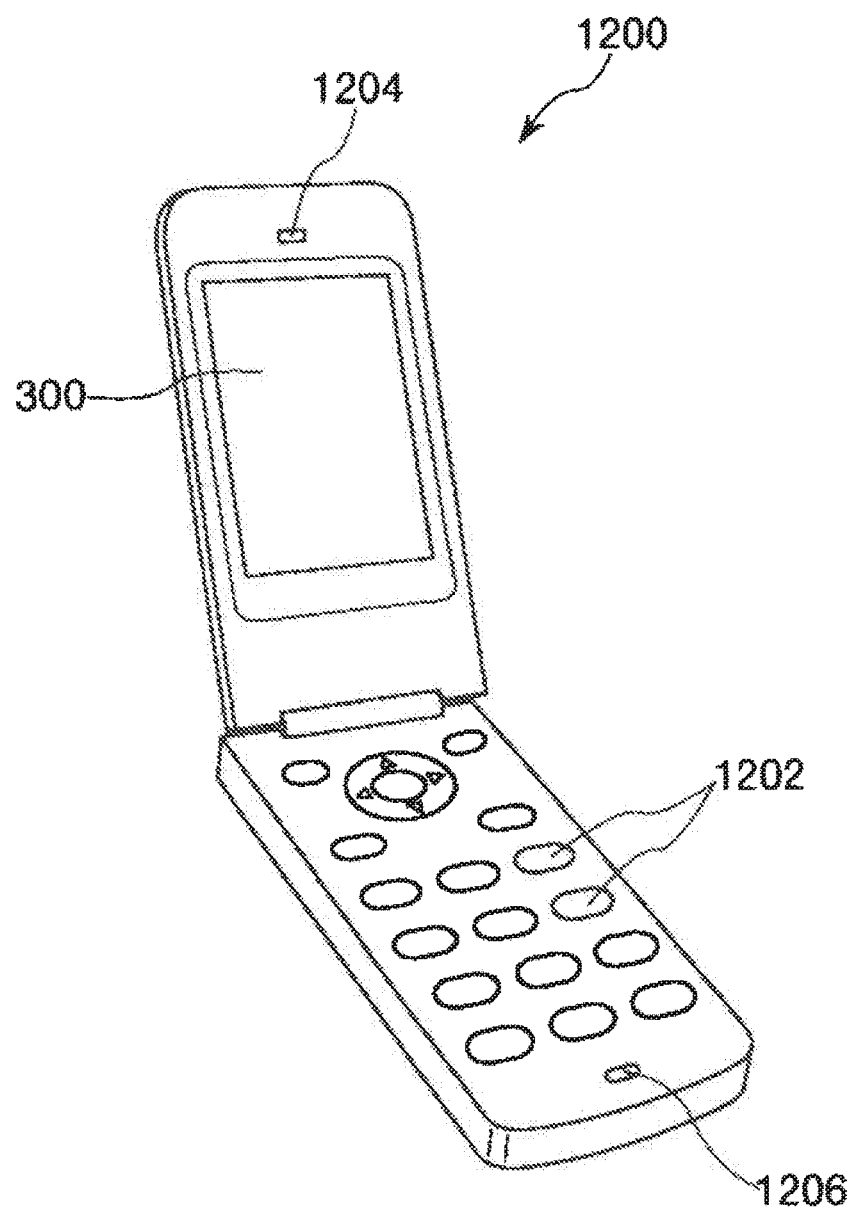
FIG. 9 is a perspective view showing a configuration of a mobile phone (also including a PHS) to which an electronic apparatus of the invention is applied.

FIG. 9 is a perspective view showing a configuration of a mobile phone (also including a PHS) to which an electronic apparatus of the invention is applied.

In this drawing, a mobile phone 1200 includes a plurality of operation buttons 1202, an earpiece 1204, and a mouthpiece 1206, and also a display part.

In the mobile phone 1200, this display part is constituted by the above-mentioned display device 300.

Figure 10:
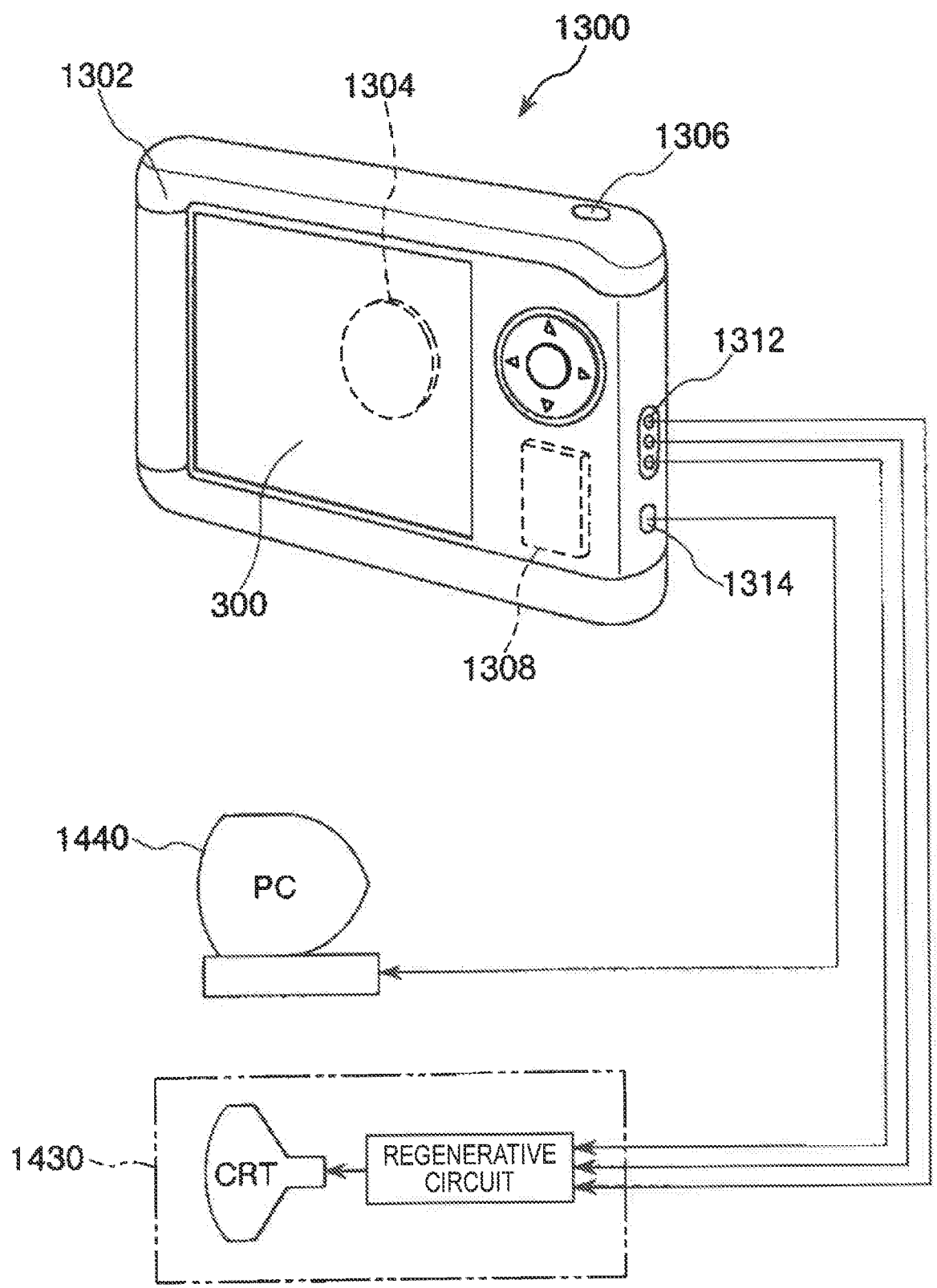
FIG. 10 is a perspective view showing a configuration of a digital still camera to which an electronic apparatus of the invention is applied.

FIG. 10 is a perspective view showing a configuration of a digital still camera to which an electronic apparatus of the invention is applied. Incidentally, in this drawing, connection to external apparatuses is also briefly shown.

Here, while a common camera exposes a silver halide photographic film to light according to an optical image of a subject, a digital still camera 1300 generates an imaging signal (image signal) by performing photoelectric conversion of an optical image of a subject using an imaging element such as a CCD (charge coupled device).

On the rear surface of a case (body) 1302 in the digital still camera 1300, a display part is provided and configured to perform display based on the imaging signal by the CCD, and functions as a finder which displays a subject as an electronic image.

In the digital still camera 1300, this display part is constituted by the above-mentioned display device 300.

In the inside of the case, a circuit board 1308 is installed. In this circuit board 1308, a memory capable of storing an imaging signal is installed.

In addition, a light receiving unit 1304 including an optical lens (imaging optical system), a CCD, and the like is provided on the front surface side (the rear surface side in the configuration shown in the drawing) of the case 1302.

When a photographer checks a subject image displayed on the display part and presses a shutter button 1306, an imaging signal of the CCD at that time point is transferred to and stored in the memory of the circuit board 1308.

In addition, in this digital still camera 1300, a video signal output terminal 1312 and an input/output terminal 1314 for data communication are provided on the side surface of the case 1302. Further, as shown in the drawing, a television monitor 1430 is connected to the video signal output terminal 1312 and a personal computer 1440 is connected to the input/output terminal 1314 for data communication as needed. In addition, it is configured such that an imaging signal stored in the memory of the circuit board 1308 is output to the television monitor 1430 or the personal computer 1440 by a predetermined operation.

The electronic apparatus having such a device with a film of the invention has excellent reliability.

The electronic apparatus of the invention can be applied not only to the personal computer (mobile-type personal computer) shown in FIG. 8, the mobile phone shown in FIG. 9, and the digital still camera shown in FIG. 10, but also, for example, to a television, a video camera, a view finder-type or monitor direct view-type video tape recorder, a laptop-type personal computer, a car navigation device, a pager, an electronic organizer (including an electronic organizer with a communication function), an electronic dictionary, an electronic calculator, an electronic gaming machine, a word processor, a workstation, a videophone, a security television monitor, electronic binoculars, a POS terminal, an apparatus provided with a touch panel (for example, a cash dispenser in financial institutions and an automatic ticket vending machine), a medical apparatus (for example, an electronic thermometer, a sphygmomanometer, a blood glucose meter, an electrocardiographic apparatus, an ultrasonic diagnostic apparatus, or a display device for an endoscope), a fish finder, various types of measurement apparatuses, meters and gauges (for example, meters and gauges for vehicles, aircrafts, and ships), a flight simulator, other various types of monitors, a projection-type display device such as a projector, and the like.

Hereinabove, the film-forming ink, the film formation method, the device with a film, and the electronic apparatus of the invention have been described with reference to the embodiments shown in the drawings, however, the invention is not limited thereto.

For example, in the above-mentioned embodiments, the light-emitting element having three light-emitting layers is described, however, the light-emitting element may have one light-emitting layer or two light-emitting layers, or may have four or more light-emitting layers. Further, the emission color of the light-emitting layer is not limited to R, G, and B in the above-mentioned embodiments.

In the case where a plurality of layers are stacked using the film formation method of the invention, by selecting the type of the liquid medium to be used in the subsequent film formation, or by subjecting the previously formed film to a crosslinking reaction, it is possible to prevent the dissolution of the previously formed film in the subsequent film formation.

Further, the device with a film of the invention is not limited to the above-mentioned color filter, light-emitting device, and wiring board, and the invention can be applied to various devices as long as they are devices having a film formed using the film-forming ink.

EXAMPLES

Next, specific Examples of the invention will be described.

Formation of Film Using Film-Forming Ink

1. When Using A-1) 1,1-Bis(3,4-Dimethylphenyl)Ethane as First Component 1-1. Preparation of Film-Forming Ink First, as a hole transport material, poly(2,7-(9,9-di-n-octylfluorene)-(1,4-phenylene-((4-sec-butylphenyl)imino)-1,4-phenylene (TFB) was prepared and dissolved in a liquid medium containing the first component (A-1) and the second component so that the content of this TFB was 0.8 wt %, whereby a film-forming ink for forming a hole transport layer was prepared.

Further, as a light-emitting material, each of 4,4'-N,N'-dicarbazol-biphenyl (CBP) and fac-tris(2-phenylpyridine) iridium ($Ir(ppy)_3$) was prepared and dissolved in a liquid medium containing the first component (A-1) and the second component so that the content of CBP was 0.5 wt % and the content of $Ir(ppy)_3$ was 0.5 wt %, whereby a film-forming ink for forming a light-emitting layer was prepared.

Incidentally, as for each of these film-forming inks for forming a hole transport layer and for forming a light-emitting layer, the second components (B-1, -2, . . . , -54) shown in Table 1 were used, and further, preparation was performed using each of the second components by setting the content thereof to 5, 30, and 50 wt %. However, such preparation was omitted for components for which the first component and the second component do not show compatibility with each other. Further, as the film-forming inks for forming a hole transport layer and for forming a light-emitting layer, inks in which the addition of the second component was omitted were prepared for comparison.

1-2. Film Formation of Hole Transport Layer and Light-Emitting Layer

First, on ITO of an opening part included in a partition wall provided on a base material, each of the prepared film-forming inks for forming a hole transport layer and for forming a light-emitting layer was supplied by an inkjet method, whereby liquid coating films were formed.

After undergoing a drying step, by heating for 30 minutes under the condition of 200° C. and normal pressure, a hole transport layer was formed, and by heating for 10 minutes under the condition of 160° C. and normal pressure, a light-emitting layer was formed.

Incidentally, the weight of the liquid droplet to be supplied by the inkjet method at the time of ejection was set to 10 ng, and the liquid droplets were supplied onto the silicon substrate until the weight after the ejection reached substantially 500 ng.

1-3. Evaluation 1-3-1. Storage Stability

Each of the prepared film-forming inks for forming a hole transport layer and for forming a light-emitting layer was stored for 7 days under the conditions of 24° C. and normal pressure, and the state of each of the film-forming inks for forming a hole transport layer and for forming a light-emitting layer thereafter was visually confirmed and evaluated according to the following four-step criteria.

A: The ink was very stable.

B: A slight volatilization after storage was observed.

C: Volatilization in the air was significant unless the container was an airtight container.

D: Volatilization in the air was particularly significant unless the container was an airtight container.

1-3-2. Ejection Stability

Each of the prepared film-forming inks for forming a hole transport layer and for forming a light-emitting layer was ejected as an liquid droplet in an ejection weight of 10 ng using an inkjet method, and the ejection stability of each of the film-forming inks for forming a hole transport layer and for forming a light-emitting layer was evaluated according to the following four-step criteria.

A: Stable ejection was obtained continuously.

B: After the ink was left for 8 hours, curving, missing, or clogging occurred when the ink was ejected, but such a defect was restored immediately.

C: After the ink was left for 8 hours, curving, missing, or clogging occurred when the ink was ejected, and such a defect was not restored immediately.

D: After the ink was left for 8 hours, curving, missing, and clogging occurred when the ink was ejected, and such a defect was not restored.

1-3-3. Film Forming Property

In the above 1-2, when the liquid coating film was formed by the inkjet method, the weight at the time of landing of the liquid droplet supplied onto the silicon substrate was measured as the weight after the ejection.

Further, the thickness of each of the hole transport layer and the light-emitting layer formed in the above 1-2 was measured. In addition, the state of each of the hole transport layer and the light-emitting layer was visually confirmed and evaluated according to the following four-step criteria.

A: A uniform and flat film can be formed without deposition.

B: A uniform film can be formed without deposition.

C: Deposition does not occur.

D: A film cannot be formed.

These evaluation results are shown in the following Table 1, respectively.

TABLE 1

First component (solvent A-1): 1,1-bis(3,4-dimethylphenyl)ethane, boiling point: 333° C., ejection weight: 10 ng, 50 droplets, film thickness: 50 nm
Film forming property: A (boiling point of first component: 250° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1 | 169 | 164 | A | A | 10 | 9.5 | 55 | A | A | 10 |
| B-2 | 165 | 168 | A | A | 10 | 9.5 | 55 | A | A | 10 |

TABLE 1-continued

First component (solvent A-1): 1,1-bis(3,4-dimethylphenyl)ethane, boiling point: 333° C., ejection weight: 10 ng, 50 droplets, film thickness: 50 nm
Film forming property: A (boiling point of first component: 250° C. or higher)

| | | | | | | | | | | |
|---|---|---|---|---|---|---|---|---|---|---|
| B-3 | 154 | 179 | A | A | 10 | 9.5 | 55 | A | A | 10 |
| B-4 | 150 | 183 | A | A | 10 | 9.5 | 55 | A | A | 10 |
| B-5 | 150 | 183 | A | A | 10 | 9.5 | 55 | A | A | 10 |
| B-6 | 148 | 185 | A | A | 10 | 9.5 | 55 | A | A | 10 |
| B-7 | 147 | 186 | A | A | 10 | 9.5 | 55 | A | A | 10 |
| B-8 | 145 | 188 | A | A | 10 | 9.5 | 55 | A | A | 10 |
| B-9 | 145 | 188 | A | A | 10 | 9.5 | 55 | A | A | 10 |
| B-10 | 144 | 189 | A | A | 10 | 9.5 | 55 | A | A | 10 |
| B-11 | 144 | 189 | A | A | 10 | 9.5 | 55 | A | A | 10 |
| B-12 | 142 | 191 | A | A | 10 | 9.5 | 55 | A | A | 10 |
| B-13 | 139 | 194 | A | A | 10 | 9.5 | 55 | A | A | 10 |
| B-14 | 138 | 195 | A | A | 10 | 9.5 | 55 | A | A | 10 |
| B-17 | 131 | 202 | A | A | 10 | 9.5 | 55 | A | A | 10 |
| B-18 | 130 | 203 | A | A | 10 | 9.5 | 55 | A | A | 10 |
| B-19 | 126 | 207 | A | B | 10 | 9.5 | 55 | A | B | 10 |
| B-20 | 124 | 209 | A | B | 10 | 9.5 | 55 | A | B | 10 |
| B-21 | 124 | 209 | A | B | 10 | 9.5 | 55 | A | B | 10 |
| B-22 | 124 | 209 | A | B | 10 | 9.5 | 55 | A | B | 10 |
| B-23 | 120 | 213 | A | B | 10 | 9.5 | 55 | A | B | 10 |
| B-24 | 120 | 213 | A | B | 10 | 9.5 | 55 | A | B | 10 |
| B-26 | 116 | 217 | A | B | 10 | 9.5 | 55 | A | B | 10 |
| B-28 | 115 | 218 | A | B | 10 | 9.5 | 55 | A | B | 10 |
| B-29 | 114 | 219 | A | B | 10 | 9.5 | 55 | A | B | 10 |
| B-30 | 113 | 220 | A | B | 10 | 9.5 | 55 | A | B | 10 |
| B-31 | 111 | 222 | A | B | 10 | 9.5 | 55 | A | B | 10 |
| B-32 | 102 | 231 | A | B | 10 | 9.5 | 55 | A | B | 10 |
| B-33 | 101 | 232 | A | B | 10 | 9.5 | 55 | A | B | 10 |
| B-34 | 101 | 232 | A | B | 10 | 9.5 | 55 | A | B | 10 |
| B-35 | 101 | 232 | A | B | 10 | 9.5 | 55 | A | B | 10 |
| B-36 | 100 | 233 | A | B | 10 | 9.5 | 55 | A | B | 10 |
| B-39 | 98 | 235 | B | C | 10 | 9.5 | 55 | B | C | 10 |
| B-41 | 97 | 236 | B | C | 10 | 9.5 | 55 | B | C | 10 |
| B-42 | 88 | 245 | B | C | 10 | 9.5 | 55 | B | C | 10 |
| B-43 | 85 | 248 | B | C | 10 | 9.5 | 55 | B | C | 10 |
| B-44 | 82 | 251 | B | C | 10 | 9.5 | 55 | B | C | 10 |
| B-46 | 81 | 252 | B | C | 10 | 9.5 | 55 | B | C | 10 |
| B-47 | 80 | 253 | B | C | 10 | 9.5 | 55 | B | C | 10 |
| B-49 | 76 | 257 | B | C | 10 | 9.5 | 55 | B | C | 10 |
| B-50 | 69 | 264 | B | C | 10 | 9.5 | 55 | B | C | 10 |
| B-51 | 66 | 267 | B | C | 10 | 9.5 | 55 | B | C | 10 |
| B-53 | 57 | 276 | B | C | 10 | 9.5 | 55 | B | C | 10 |
| B-54 | 55 | 278 | B | C | 10 | 9.5 | 55 | B | C | 10 |

| | Second component ratio: 30 wt % | | | | Second component ratio: 50 wt % | | |
|---|---|---|---|---|---|---|---|
| Second component solvent B | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |

TABLE 1-continued

First component (solvent A-1): 1,1-bis(3,4-dimethylphenyl)ethane, boiling point: 333° C., ejection weight: 10 ng,
50 droplets, film thickness: 50 nm
Film forming property: A (boiling point of first component: 250° C. or higher)

| | | | | | | | |
|---|---|---|---|---|---|---|---|
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 1, when the content of the second component was within a range of 5 wt % to 50 wt %, each of the hole transport material and the light-emitting material could be dissolved in the film-forming ink, and as compared with the case where the addition of the second component was omitted, each of the hole transport layer and the light-emitting layer could be formed with a uniform thickness as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

2. When Using A-5) 4-Isopropylbiphenyl as First Component

The above-mentioned 1-1 to 1-3 were performed except that A-5) 4-isopropylbiphenyl was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 2, respectively.

TABLE 2

First component (solvent A-5): 4-isopropylbiphenyl, boiling point: 298° C.,
ejection weight: 10 ng, 50 droplets, film thickness: 50 nm
Film forming property: A (boiling point of first component: 250° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1 | 169 | 129 | A | A | 10 | 9.5 | 55 | A | A | 10 |
| B-2 | 165 | 133 | A | A | 10 | 9.5 | 55 | A | A | 10 |
| B-3 | 154 | 144 | A | A | 10 | 9.5 | 55 | A | A | 10 |
| B-4 | 150 | 148 | A | A | 10 | 9.5 | 55 | A | A | 10 |
| B-5 | 150 | 148 | A | A | 10 | 9.5 | 55 | A | A | 10 |
| B-6 | 148 | 150 | A | A | 10 | 9.5 | 55 | A | A | 10 |
| B-7 | 147 | 151 | A | A | 10 | 9.5 | 55 | A | A | 10 |
| B-8 | 145 | 153 | A | A | 10 | 9.5 | 55 | A | A | 10 |
| B-9 | 145 | 153 | A | A | 10 | 9.5 | 55 | A | A | 10 |
| B-10 | 144 | 154 | A | A | 10 | 9.5 | 55 | A | A | 10 |
| B-11 | 144 | 154 | A | A | 10 | 9.5 | 55 | A | A | 10 |
| B-12 | 142 | 156 | A | A | 10 | 9.5 | 55 | A | A | 10 |
| B-13 | 139 | 159 | A | A | 10 | 9.5 | 55 | A | A | 10 |
| B-14 | 138 | 160 | A | A | 10 | 9.5 | 55 | A | A | 10 |
| B-17 | 131 | 167 | A | A | 10 | 9.5 | 55 | A | A | 10 |
| B-18 | 130 | 168 | A | A | 10 | 9.5 | 55 | A | A | 10 |
| B-19 | 126 | 172 | A | B | 10 | 9.5 | 55 | A | B | 10 |
| B-20 | 124 | 174 | A | B | 10 | 9.5 | 55 | A | B | 10 |
| B-21 | 124 | 174 | A | B | 10 | 9.5 | 55 | A | B | 10 |
| B-22 | 124 | 174 | A | B | 10 | 9.5 | 55 | A | B | 10 |
| B-23 | 120 | 178 | A | B | 10 | 9.5 | 55 | A | B | 10 |
| B-24 | 120 | 178 | A | B | 10 | 9.5 | 55 | A | B | 10 |
| B-26 | 116 | 182 | A | B | 10 | 9.5 | 55 | A | B | 10 |
| B-28 | 115 | 183 | A | B | 10 | 9.5 | 55 | A | B | 10 |
| B-29 | 114 | 184 | A | B | 10 | 9.5 | 55 | A | B | 10 |
| B-30 | 113 | 185 | A | B | 10 | 9.5 | 55 | A | B | 10 |

TABLE 2-continued

First component (solvent A-5): 4-isopropylbiphenyl, boiling point: 298° C.,
ejection weight: 10 ng, 50 droplets, film thickness: 50 nm
Film forming property: A (boiling point of first component: 250° C. or higher)

| | | | | | | | | | | |
|---|---|---|---|---|---|---|---|---|---|---|
| B-31 | 111 | 187 | A | B | 10 | 9.5 | 55 | A | B | 10 |
| B-32 | 102 | 196 | A | B | 10 | 9.5 | 55 | A | B | 10 |
| B-33 | 101 | 197 | A | B | 10 | 9.5 | 55 | A | B | 10 |
| B-34 | 101 | 197 | A | B | 10 | 9.5 | 55 | A | B | 10 |
| B-35 | 101 | 197 | A | B | 10 | 9.5 | 55 | A | B | 10 |
| B-36 | 100 | 198 | A | B | 10 | 9.5 | 55 | A | B | 10 |
| B-39 | 98 | 200 | B | C | 10 | 9.5 | 55 | B | C | 10 |
| B-41 | 97 | 201 | B | C | 10 | 9.5 | 55 | B | C | 10 |
| B-42 | 88 | 210 | B | C | 10 | 9.5 | 55 | B | C | 10 |
| B-43 | 85 | 213 | B | C | 10 | 9.5 | 55 | B | C | 10 |
| B-44 | 82 | 216 | B | C | 10 | 9.5 | 55 | B | C | 10 |
| B-46 | 81 | 217 | B | C | 10 | 9.5 | 55 | B | C | 10 |
| B-47 | 80 | 218 | B | C | 10 | 9.5 | 55 | B | C | 10 |
| B-49 | 76 | 222 | B | C | 10 | 9.5 | 55 | B | C | 10 |
| B-50 | 69 | 229 | B | C | 10 | 9.5 | 55 | B | C | 10 |
| B-51 | 66 | 232 | B | C | 10 | 9.5 | 55 | B | C | 10 |
| B-53 | 57 | 241 | B | C | 10 | 9.5 | 55 | B | C | 10 |
| B-54 | 55 | 243 | B | C | 10 | 9.5 | 55 | B | C | 10 |

| | Second component ratio: 30 wt % | | | | Second component ratio: 50 wt % | | |
|---|---|---|---|---|---|---|---|
| Second component solvent B | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 2, when the content of the second component was within a range of 5 wt % to 50 wt %, each of the hole transport material and the light-emitting material could be dissolved in the film-forming ink, and as compared with the case where the addition of the second component was omitted, each of the hole transport layer and the light-emitting layer could be formed with a uniform thickness as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

3. When Using A-7) dibenzyl Ether as First Component

The above-mentioned 1-1 to 1-3 were performed except that A-7) dibenzyl ether was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 3, respectively.

TABLE 3

First component (solvent A-7): dibenzyl ether, boiling point: 295° C., Storage stability: A, Ejection stability: A
ejection weight: 10 ng 50 droplets, film thickness: 50 nm

| Second component solvent B | Boiling point | Difference in boiling point | Second component ratio: 5 wt % | | | | | Second component ratio: 30 wt % | | |
|---|---|---|---|---|---|---|---|---|---|---|
| | | | Storage stability | Ejection stability | Weight before ejection ng | Weight after ejection ng | Film thickness after drying nm | Storage stability | Ejection stability | Weight before ejection ng |
| B-1 | 169 | 126 | A | A | 10 | 9.5 | 55 | A | A | 10 |
| B-2 | 165 | 130 | A | A | 10 | 9.5 | 55 | A | A | 10 |
| B-3 | 154 | 141 | A | A | 10 | 9.5 | 55 | A | A | 10 |
| B-4 | 150 | 145 | A | A | 10 | 9.5 | 55 | A | A | 10 |
| B-5 | 150 | 145 | A | A | 10 | 9.5 | 55 | A | A | 10 |
| B-6 | 148 | 147 | A | A | 10 | 9.5 | 55 | A | A | 10 |
| B-7 | 147 | 148 | A | A | 10 | 9.5 | 55 | A | A | 10 |
| B-8 | 145 | 150 | A | A | 10 | 9.5 | 55 | A | A | 10 |
| B-9 | 145 | 150 | A | A | 10 | 9.5 | 55 | A | A | 10 |
| B-10 | 144 | 151 | A | A | 10 | 9.5 | 55 | A | A | 10 |
| B-11 | 144 | 151 | A | A | 10 | 9.5 | 55 | A | A | 10 |
| B-12 | 142 | 153 | A | A | 10 | 9.5 | 55 | A | A | 10 |
| B-13 | 139 | 156 | A | A | 10 | 9.5 | 55 | A | A | 10 |
| B-14 | 138 | 157 | A | A | 10 | 9.5 | 55 | A | A | 10 |
| B-17 | 131 | 164 | A | A | 10 | 9.5 | 55 | A | A | 10 |
| B-18 | 130 | 165 | A | A | 10 | 9.5 | 55 | A | A | 10 |
| B-19 | 126 | 169 | A | B | 10 | 9.5 | 55 | A | B | 10 |
| B-20 | 124 | 171 | A | B | 10 | 9.5 | 55 | A | B | 10 |
| B-21 | 124 | 171 | A | B | 10 | 9.5 | 55 | A | B | 10 |
| B-22 | 124 | 171 | A | B | 10 | 9.5 | 55 | A | B | 10 |
| B-23 | 120 | 175 | A | B | 10 | 9.5 | 55 | A | B | 10 |
| B-24 | 120 | 175 | A | B | 10 | 9.5 | 55 | A | B | 10 |
| B-26 | 116 | 179 | A | B | 10 | 9.5 | 55 | A | B | 10 |
| B-28 | 115 | 180 | A | B | 10 | 9.5 | 55 | A | B | 10 |
| B-29 | 114 | 181 | A | B | 10 | 9.5 | 55 | A | B | 10 |
| B-30 | 113 | 182 | A | B | 10 | 9.5 | 55 | A | B | 10 |
| B-31 | 111 | 184 | A | B | 10 | 9.5 | 55 | A | B | 10 |
| B-32 | 102 | 193 | A | B | 10 | 9.5 | 55 | A | B | 10 |
| B-33 | 101 | 194 | A | B | 10 | 9.5 | 55 | A | B | 10 |
| B-34 | 101 | 194 | A | B | 10 | 9.5 | 55 | A | B | 10 |
| B-35 | 101 | 194 | A | B | 10 | 9.5 | 55 | A | B | 10 |
| B-36 | 100 | 195 | A | B | 10 | 9.5 | 55 | A | B | 10 |
| B-39 | 98 | 197 | B | C | 10 | 9.5 | 55 | B | C | 10 |
| B-41 | 97 | 198 | B | C | 10 | 9.5 | 55 | B | C | 10 |
| B-42 | 88 | 207 | B | C | 10 | 9.5 | 55 | B | C | 10 |
| B-43 | 85 | 210 | B | C | 10 | 9.5 | 55 | B | C | 10 |
| B-44 | 82 | 213 | B | C | 10 | 9.5 | 55 | B | C | 10 |
| B-46 | 81 | 214 | B | C | 10 | 9.5 | 55 | B | C | 10 |
| B-47 | 80 | 215 | B | C | 10 | 9.5 | 55 | B | C | 10 |
| B-49 | 76 | 219 | B | C | 10 | 9.5 | 55 | B | C | 10 |
| B-50 | 69 | 226 | B | C | 10 | 9.5 | 55 | B | C | 10 |
| B-51 | 66 | 229 | B | C | 10 | 9.5 | 55 | B | C | 10 |
| B-53 | 57 | 238 | B | C | 10 | 9.5 | 55 | B | C | 10 |
| B-54 | 55 | 240 | B | C | 10 | 9.5 | 55 | B | C | 10 |

| Second component solvent B | Second component ratio: 30 wt % | | Second component ratio: 50 wt % | | | | |
|---|---|---|---|---|---|---|---|
| | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |

TABLE 3-continued

First component (solvent A-7): dibenzyl ether, boiling point: 295° C.,
Storage stability: A, Ejection stability: A
ejection weight: 10 ng 50 droplets, film thickness: 50 nm

| | | | | | | | | |
|---|---|---|---|---|---|---|---|---|
| B-3 | 7 | 72 | A | A | 10 | 5 | 100 | |
| B-4 | 7 | 72 | A | A | 10 | 5 | 100 | |
| B-5 | 7 | 72 | A | A | 10 | 5 | 100 | |
| B-6 | 7 | 72 | A | A | 10 | 5 | 100 | |
| B-7 | 7 | 72 | A | A | 10 | 5 | 100 | |
| B-8 | 7 | 72 | A | A | 10 | 5 | 100 | |
| B-9 | 7 | 72 | A | A | 10 | 5 | 100 | |
| B-10 | 7 | 72 | A | A | 10 | 5 | 100 | |
| B-11 | 7 | 72 | A | A | 10 | 5 | 100 | |
| B-12 | 7 | 72 | A | A | 10 | 5 | 100 | |
| B-13 | 7 | 72 | A | A | 10 | 5 | 100 | |
| B-14 | 7 | 72 | A | A | 10 | 5 | 100 | |
| B-17 | 7 | 72 | A | A | 10 | 5 | 100 | |
| B-18 | 7 | 72 | A | A | 10 | 5 | 100 | |
| B-19 | 7 | 72 | A | B | 10 | 5 | 100 | |
| B-20 | 7 | 72 | A | B | 10 | 5 | 100 | |
| B-21 | 7 | 72 | A | B | 10 | 5 | 100 | |
| B-22 | 7 | 72 | A | B | 10 | 5 | 100 | |
| B-23 | 7 | 72 | A | B | 10 | 5 | 100 | |
| B-24 | 7 | 72 | A | B | 10 | 5 | 100 | |
| B-26 | 7 | 72 | A | B | 10 | 5 | 100 | |
| B-28 | 7 | 72 | A | B | 10 | 5 | 100 | |
| B-29 | 7 | 72 | A | B | 10 | 5 | 100 | |
| B-30 | 7 | 72 | A | B | 10 | 5 | 100 | |
| B-31 | 7 | 72 | A | B | 10 | 5 | 100 | |
| B-32 | 7 | 72 | A | B | 10 | 5 | 100 | |
| B-33 | 7 | 72 | A | B | 10 | 5 | 100 | |
| B-34 | 7 | 72 | A | B | 10 | 5 | 100 | |
| B-35 | 7 | 72 | A | B | 10 | 5 | 100 | |
| B-36 | 7 | 72 | A | B | 10 | 5 | 100 | |
| B-39 | 7 | 72 | B | C | 10 | 5 | 100 | |
| B-41 | 7 | 72 | B | C | 10 | 5 | 100 | |
| B-42 | 7 | 72 | B | C | 10 | 5 | 100 | |
| B-43 | 7 | 72 | B | C | 10 | 5 | 100 | |
| B-44 | 7 | 72 | B | C | 10 | 5 | 100 | |
| B-46 | 7 | 72 | B | C | 10 | 5 | 100 | |
| B-47 | 7 | 72 | B | C | 10 | 5 | 100 | |
| B-49 | 7 | 72 | B | C | 10 | 5 | 100 | |
| B-50 | 7 | 72 | B | C | 10 | 5 | 100 | |
| B-51 | 7 | 72 | B | C | 10 | 5 | 100 | |
| B-53 | 7 | 72 | B | C | 10 | 5 | 100 | |
| B-54 | 7 | 72 | B | C | 10 | 5 | 100 | |

As shown in Table 3, when the content of the second component was within a range of 5 wt % to 50 wt %, each of the hole transport material and the light-emitting material could be dissolved in the film-forming ink, and as compared with the case where the addition of the second component was omitted, each of the hole transport layer and the light-emitting layer could be formed with a uniform thickness as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

4. When Using A-9) 2,2,5-Tri-Methyl Biphenyl Ether as First Component

The above-mentioned 1-1 to 1-3 were performed except that A-9) 2,2,5-tri-methyl biphenyl ether was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 4, respectively.

TABLE 4

First component (solvent A-9): 2,2,5-tri-methyl diphenyl ether, boiling point: 290° C., ejection weight: 10 ng, 50 droplets, film thickness: 50 nm
Film forming property: A (boiling point of first solvent A: 250° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1 | 169 | 121 | A | A | 10 | 9.5 | 55 | A | A | 10 |
| B-2 | 165 | 125 | A | A | 10 | 9.5 | 55 | A | A | 10 |

TABLE 4-continued

First component (solvent A-9): 2,2,5-tri-methyl diphenyl ether, boiling point: 290° C., ejection weight: 10 ng, 50 droplets, film thickness: 50 nm
Film forming property: A (boiling point of first solvent A: 250° C. or higher)

| | | | | | | | | | | | |
|---|---|---|---|---|---|---|---|---|---|---|---|
| B-3 | 154 | 136 | A | A | 10 | 9.5 | 55 | A | A | 10 |
| B-4 | 150 | 140 | A | A | 10 | 9.5 | 55 | A | A | 10 |
| B-5 | 150 | 140 | A | A | 10 | 9.5 | 55 | A | A | 10 |
| B-6 | 148 | 142 | A | A | 10 | 9.5 | 55 | A | A | 10 |
| B-7 | 147 | 143 | A | A | 10 | 9.5 | 55 | A | A | 10 |
| B-8 | 145 | 145 | A | A | 10 | 9.5 | 55 | A | A | 10 |
| B-9 | 145 | 145 | A | A | 10 | 9.5 | 55 | A | A | 10 |
| B-10 | 144 | 146 | A | A | 10 | 9.5 | 55 | A | A | 10 |
| B-11 | 144 | 146 | A | A | 10 | 9.5 | 55 | A | A | 10 |
| B-12 | 142 | 148 | A | A | 10 | 9.5 | 55 | A | A | 10 |
| B-13 | 139 | 151 | A | A | 10 | 9.5 | 55 | A | A | 10 |
| B-14 | 138 | 152 | A | A | 10 | 9.5 | 55 | A | A | 10 |
| B-17 | 131 | 159 | A | A | 10 | 9.5 | 55 | A | A | 10 |
| B-18 | 130 | 160 | A | A | 10 | 9.5 | 55 | A | A | 10 |
| B-19 | 126 | 164 | A | B | 10 | 9.5 | 55 | A | B | 10 |
| B-20 | 124 | 166 | A | B | 10 | 9.5 | 55 | A | B | 10 |
| B-21 | 124 | 166 | A | B | 10 | 9.5 | 55 | A | B | 10 |
| B-22 | 124 | 166 | A | B | 10 | 9.5 | 55 | A | B | 10 |
| B-23 | 120 | 170 | A | B | 10 | 9.5 | 55 | A | B | 10 |
| B-24 | 120 | 170 | A | B | 10 | 9.5 | 55 | A | B | 10 |
| B-26 | 116 | 174 | A | B | 10 | 9.5 | 55 | A | B | 10 |
| B-28 | 115 | 175 | A | B | 10 | 9.5 | 55 | A | B | 10 |
| B-29 | 114 | 176 | A | B | 10 | 9.5 | 55 | A | B | 10 |
| B-30 | 113 | 177 | A | B | 10 | 9.5 | 55 | A | B | 10 |
| B-31 | 111 | 179 | A | B | 10 | 9.5 | 55 | A | B | 10 |
| B-32 | 102 | 188 | A | B | 10 | 9.5 | 55 | A | B | 10 |
| B-33 | 101 | 189 | A | B | 10 | 9.5 | 55 | A | B | 10 |
| B-34 | 101 | 189 | A | B | 10 | 9.5 | 55 | A | B | 10 |
| B-35 | 101 | 189 | A | B | 10 | 9.5 | 55 | A | B | 10 |
| B-36 | 100 | 190 | A | B | 10 | 9.5 | 55 | A | B | 10 |
| B-39 | 98 | 192 | B | C | 10 | 9.5 | 55 | B | C | 10 |
| B-41 | 97 | 193 | B | C | 10 | 9.5 | 55 | B | C | 10 |
| B-42 | 88 | 202 | B | C | 10 | 9.5 | 55 | B | C | 10 |
| B-43 | 85 | 205 | B | C | 10 | 9.5 | 55 | B | C | 10 |
| B-44 | 82 | 208 | B | C | 10 | 9.5 | 55 | B | C | 10 |
| B-46 | 81 | 209 | B | C | 10 | 9.5 | 55 | B | C | 10 |
| B-47 | 80 | 210 | B | C | 10 | 9.5 | 55 | B | C | 10 |
| B-49 | 76 | 214 | B | C | 10 | 9.5 | 55 | B | C | 10 |
| B-50 | 69 | 221 | B | C | 10 | 9.5 | 55 | B | C | 10 |
| B-51 | 66 | 224 | B | C | 10 | 9.5 | 55 | B | C | 10 |
| B-53 | 57 | 233 | B | C | 10 | 9.5 | 55 | B | C | 10 |
| B-54 | 55 | 235 | B | C | 10 | 9.5 | 55 | B | C | 10 |

| Second component solvent B | Second component ratio: 30 wt % | | | | Second component ratio: 50 wt % | | |
|---|---|---|---|---|---|---|---|
| | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |

TABLE 4-continued

First component (solvent A-9): 2,2,5-tri-methyl diphenyl ether, boiling point: 290° C., ejection weight: 10 ng, 50 droplets, film thickness: 50 nm
Film forming property: A (boiling point of first solvent A: 250° C. or higher)

| | | | | | | | |
|---|---|---|---|---|---|---|---|
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 4, when the content of the second component was within a range of 5 wt % to 50 wt %, each of the hole transport material and the light-emitting material could be dissolved in the film-forming ink, and as compared with the case where the addition of the second component was omitted, each of the hole transport layer and the light-emitting layer could be formed with a uniform thickness as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

5. When Using A-16) 3-Phenoxytoluene as First Component

The above-mentioned 1-1 to 1-3 were performed except that A-16) 3-phenoxytoluene was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 5, respectively.

TABLE 5

First component (solvent A-16): 3-phenoxytoluene, boiling point: 273° C., ejection weight: 10 ng, 50 droplets, film thickness: 50 nm
Film forming property: A (boiling point of first solvent A: 250° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1 | 169 | 104 | A | A | 10 | 9.5 | 55 | A | A | 10 |
| B-2 | 165 | 108 | A | A | 10 | 9.5 | 55 | A | A | 10 |
| B-3 | 154 | 119 | A | A | 10 | 9.5 | 55 | A | A | 10 |
| B-4 | 150 | 123 | A | A | 10 | 9.5 | 55 | A | A | 10 |
| B-5 | 150 | 123 | A | A | 10 | 9.5 | 55 | A | A | 10 |
| B-6 | 148 | 125 | A | A | 10 | 9.5 | 55 | A | A | 10 |
| B-7 | 147 | 126 | A | A | 10 | 9.5 | 55 | A | A | 10 |
| B-8 | 145 | 128 | A | A | 10 | 9.5 | 55 | A | A | 10 |
| B-9 | 145 | 128 | A | A | 10 | 9.5 | 55 | A | A | 10 |
| B-10 | 144 | 129 | A | A | 10 | 9.5 | 55 | A | A | 10 |
| B-11 | 144 | 129 | A | A | 10 | 9.5 | 55 | A | A | 10 |
| B-12 | 142 | 131 | A | A | 10 | 9.5 | 55 | A | A | 10 |
| B-13 | 139 | 134 | A | A | 10 | 9.5 | 55 | A | A | 10 |
| B-14 | 138 | 135 | A | A | 10 | 9.5 | 55 | A | A | 10 |
| B-17 | 131 | 142 | A | A | 10 | 9.5 | 55 | A | A | 10 |
| B-18 | 130 | 143 | A | A | 10 | 9.5 | 55 | A | A | 10 |
| B-19 | 126 | 147 | A | B | 10 | 9.5 | 55 | A | B | 10 |
| B-20 | 124 | 149 | A | B | 10 | 9.5 | 55 | A | B | 10 |
| B-21 | 124 | 149 | A | B | 10 | 9.5 | 55 | A | B | 10 |
| B-22 | 124 | 149 | A | B | 10 | 9.5 | 55 | A | B | 10 |
| B-23 | 120 | 153 | A | B | 10 | 9.5 | 55 | A | B | 10 |
| B-24 | 120 | 153 | A | B | 10 | 9.5 | 55 | A | B | 10 |
| B-26 | 116 | 157 | A | B | 10 | 9.5 | 55 | A | B | 10 |
| B-28 | 115 | 158 | A | B | 10 | 9.5 | 55 | A | B | 10 |
| B-29 | 114 | 159 | A | B | 10 | 9.5 | 55 | A | B | 10 |
| B-30 | 113 | 160 | A | B | 10 | 9.5 | 55 | A | B | 10 |
| B-31 | 111 | 162 | A | B | 10 | 9.5 | 55 | A | B | 10 |

TABLE 5-continued

First component (solvent A-16): 3-phenoxytoluene, boiling point: 273° C.,
ejection weight: 10 ng, 50 droplets, film thickness: 50 nm
Film forming property: A (boiling point of first solvent A: 250° C. or higher)

| | | | | | | | | | | | |
|---|---|---|---|---|---|---|---|---|---|---|---|
| B-32 | 102 | 171 | A | B | 10 | 9.5 | 55 | A | B | 10 |
| B-33 | 101 | 172 | A | B | 10 | 9.5 | 55 | A | B | 10 |
| B-34 | 101 | 172 | A | B | 10 | 9.5 | 55 | A | B | 10 |
| B-35 | 101 | 172 | A | B | 10 | 9.5 | 55 | A | B | 10 |
| B-36 | 100 | 173 | A | B | 10 | 9.5 | 55 | A | B | 10 |
| B-39 | 98 | 175 | B | C | 10 | 9.5 | 55 | B | C | 10 |
| B-41 | 97 | 176 | B | C | 10 | 9.5 | 55 | B | C | 10 |
| B-42 | 88 | 185 | B | C | 10 | 9.5 | 55 | B | C | 10 |
| B-43 | 85 | 188 | B | C | 10 | 9.5 | 55 | B | C | 10 |
| B-44 | 82 | 191 | B | C | 10 | 9.5 | 55 | B | C | 10 |
| B-46 | 81 | 192 | B | C | 10 | 9.5 | 55 | B | C | 10 |
| B-47 | 80 | 193 | B | C | 10 | 9.5 | 55 | B | C | 10 |
| B-49 | 76 | 197 | B | C | 10 | 9.5 | 55 | B | C | 10 |
| B-50 | 69 | 204 | B | C | 10 | 9.5 | 55 | B | C | 10 |
| B-51 | 66 | 207 | B | C | 10 | 9.5 | 55 | B | C | 10 |
| B-53 | 57 | 216 | B | C | 10 | 9.5 | 55 | B | C | 10 |
| B-54 | 55 | 218 | B | C | 10 | 9.5 | 55 | B | C | 10 |

| Second component solvent B | Second component ratio: 30 wt % | | | | Second component ratio: 50 wt % | | |
|---|---|---|---|---|---|---|---|
| | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 5, when the content of the second component was within a range of 5 wt % to 50 wt %, each of the hole transport material and the light-emitting material could be dissolved in the film-forming ink, and as compared with the case where the addition of the second component was omitted, each of the hole transport layer and the light-emitting layer could be formed with a uniform thickness as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

6. When Using A-20) 2-Phenoxytoluene as First Component

The above-mentioned 1-1 to 1-3 were performed except that A-20) 2-phenoxytoluene was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 6, respectively.

TABLE 6

First component (solvent A-20): 2-phenoxytoluene, boiling point: 265° C., ejection weight: 10 ng, 50 droplets, film thickness: 50 nm
Film forming property: A (boiling point of first solvent A: 250° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1 | 169 | 96 | A | A | 10 | 9.5 | 55 | A | A | 10 |
| B-2 | 165 | 100 | A | A | 10 | 9.5 | 55 | A | A | 10 |
| B-3 | 154 | 111 | A | A | 10 | 9.5 | 55 | A | A | 10 |
| B-4 | 150 | 115 | A | A | 10 | 9.5 | 55 | A | A | 10 |
| B-5 | 150 | 115 | A | A | 10 | 9.5 | 55 | A | A | 10 |
| B-6 | 148 | 117 | A | A | 10 | 9.5 | 55 | A | A | 10 |
| B-7 | 147 | 118 | A | A | 10 | 9.5 | 55 | A | A | 10 |
| B-8 | 145 | 120 | A | A | 10 | 9.5 | 55 | A | A | 10 |
| B-9 | 145 | 120 | A | A | 10 | 9.5 | 55 | A | A | 10 |
| B-10 | 144 | 121 | A | A | 10 | 9.5 | 55 | A | A | 10 |
| B-11 | 144 | 121 | A | A | 10 | 9.5 | 55 | A | A | 10 |
| B-12 | 142 | 123 | A | A | 10 | 9.5 | 55 | A | A | 10 |
| B-13 | 139 | 126 | A | A | 10 | 9.5 | 55 | A | A | 10 |
| B-14 | 138 | 127 | A | A | 10 | 9.5 | 55 | A | A | 10 |
| B-17 | 131 | 134 | A | A | 10 | 9.5 | 55 | A | A | 10 |
| B-18 | 130 | 135 | A | A | 10 | 9.5 | 55 | A | A | 10 |
| B-19 | 126 | 139 | A | B | 10 | 9.5 | 55 | A | B | 10 |
| B-20 | 124 | 141 | A | B | 10 | 9.5 | 55 | A | B | 10 |
| B-21 | 124 | 141 | A | B | 10 | 9.5 | 55 | A | B | 10 |
| B-22 | 124 | 141 | A | B | 10 | 9.5 | 55 | A | B | 10 |
| B-23 | 120 | 145 | A | B | 10 | 9.5 | 55 | A | B | 10 |
| B-24 | 120 | 145 | A | B | 10 | 9.5 | 55 | A | B | 10 |
| B-26 | 116 | 149 | A | B | 10 | 9.5 | 55 | A | B | 10 |
| B-28 | 115 | 150 | A | B | 10 | 9.5 | 55 | A | B | 10 |
| B-29 | 114 | 151 | A | B | 10 | 9.5 | 55 | A | B | 10 |
| B-30 | 113 | 152 | A | B | 10 | 9.5 | 55 | A | B | 10 |
| B-31 | 111 | 154 | A | B | 10 | 9.5 | 55 | A | B | 10 |
| B-32 | 102 | 163 | A | B | 10 | 9.5 | 55 | A | B | 10 |
| B-33 | 101 | 164 | A | B | 10 | 9.5 | 55 | A | B | 10 |
| B-34 | 101 | 164 | A | B | 10 | 9.5 | 55 | A | B | 10 |
| B-35 | 101 | 164 | A | B | 10 | 9.5 | 55 | A | B | 10 |
| B-36 | 100 | 165 | A | B | 10 | 9.5 | 55 | A | B | 10 |
| B-39 | 98 | 167 | B | C | 10 | 9.5 | 55 | B | C | 10 |
| B-41 | 97 | 168 | B | C | 10 | 9.5 | 55 | B | C | 10 |
| B-42 | 88 | 177 | B | C | 10 | 9.5 | 55 | B | C | 10 |
| B-43 | 85 | 180 | B | C | 10 | 9.5 | 55 | B | C | 10 |
| B-44 | 82 | 183 | B | C | 10 | 9.5 | 55 | B | C | 10 |
| B-46 | 81 | 184 | B | C | 10 | 9.5 | 55 | B | C | 10 |
| B-47 | 80 | 185 | B | C | 10 | 9.5 | 55 | B | C | 10 |
| B-49 | 76 | 189 | B | C | 10 | 9.5 | 55 | B | C | 10 |
| B-50 | 69 | 196 | B | C | 10 | 9.5 | 55 | B | C | 10 |
| B-51 | 66 | 199 | B | C | 10 | 9.5 | 55 | B | C | 10 |
| B-53 | 57 | 208 | B | C | 10 | 9.5 | 55 | B | C | 10 |
| B-54 | 55 | 210 | B | C | 10 | 9.5 | 55 | B | C | 10 |

| | Second component ratio: 30 wt % | | Second component ratio: 50 wt % | | | | |
|---|---|---|---|---|---|---|---|
| Second component solvent B | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |

TABLE 6-continued

First component (solvent A-20): 2-phenoxytoluene, boiling point: 265° C., ejection weight: 10 ng, 50 droplets, film thickness: 50 nm
Film forming property: A (boiling point of first solvent A: 250° C. or higher)

| | | | | | | | |
|---|---|---|---|---|---|---|---|
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 6, when the content of the second component was within a range of 5 wt % to 50 wt %, each of the hole transport material and the light-emitting material could be dissolved in the film-forming ink, and as compared with the case where the addition of the second component was omitted, each of the hole transport layer and the light-emitting layer could be formed with a uniform thickness as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

7. When Using A-24) Diphenyl Ether as First Component

The above-mentioned 1-1 to 1-3 were performed except that A-24) diphenyl ether was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 7, respectively.

TABLE 7

First component (solvent A-24): diphenyl ether, boiling point: 259° C.,
ejection weight: 10 ng, 50 droplets, film thickness: 50 nm
Film forming property: A (boiling point of first solvent A: 250° C. or higher)

| | | | | | Second component ratio: 5 wt % | | | | Second component ratio: 30 wt % | | |
|---|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | | Storage stability | Ejection stability | Weight before ejection ng |
| B-1 | 169 | 90 | A | A | 10 | 9.5 | 55 | | A | A | 10 |
| B-2 | 165 | 94 | A | A | 10 | 9.5 | 55 | | A | A | 10 |
| B-3 | 154 | 105 | A | A | 10 | 9.5 | 55 | | A | A | 10 |
| B-4 | 150 | 109 | A | A | 10 | 9.5 | 55 | | A | A | 10 |
| B-5 | 150 | 109 | A | A | 10 | 9.5 | 55 | | A | A | 10 |
| B-6 | 148 | 111 | A | A | 10 | 9.5 | 55 | | A | A | 10 |
| B-7 | 147 | 112 | A | A | 10 | 9.5 | 55 | | A | A | 10 |

TABLE 7-continued

First component (solvent A-24): diphenyl ether, boiling point: 259° C.,
ejection weight: 10 ng, 50 droplets, film thickness: 50 nm
Film forming property: A (boiling point of first solvent A: 250° C. or higher)

| | | | | | | | | | | |
|---|---|---|---|---|---|---|---|---|---|---|
| B-8  | 145 | 114 | A | A | 10 | 9.5 | 55 | A | A | 10 |
| B-9  | 145 | 114 | A | A | 10 | 9.5 | 55 | A | A | 10 |
| B-10 | 144 | 115 | A | A | 10 | 9.5 | 55 | A | A | 10 |
| B-11 | 144 | 115 | A | A | 10 | 9.5 | 55 | A | A | 10 |
| B-12 | 142 | 117 | A | A | 10 | 9.5 | 55 | A | A | 10 |
| B-13 | 139 | 120 | A | A | 10 | 9.5 | 55 | A | A | 10 |
| B-14 | 138 | 121 | A | A | 10 | 9.5 | 55 | A | A | 10 |
| B-17 | 131 | 128 | A | A | 10 | 9.5 | 55 | A | A | 10 |
| B-18 | 130 | 129 | A | A | 10 | 9.5 | 55 | A | A | 10 |
| B-19 | 126 | 133 | A | B | 10 | 9.5 | 55 | A | B | 10 |
| B-20 | 124 | 135 | A | B | 10 | 9.5 | 55 | A | B | 10 |
| B-21 | 124 | 135 | A | B | 10 | 9.5 | 55 | A | B | 10 |
| B-22 | 124 | 135 | A | B | 10 | 9.5 | 55 | A | B | 10 |
| B-23 | 120 | 139 | A | B | 10 | 9.5 | 55 | A | B | 10 |
| B-24 | 120 | 139 | A | B | 10 | 9.5 | 55 | A | B | 10 |
| B-26 | 116 | 143 | A | B | 10 | 9.5 | 55 | A | B | 10 |
| B-28 | 115 | 144 | A | B | 10 | 9.5 | 55 | A | B | 10 |
| B-29 | 114 | 145 | A | B | 10 | 9.5 | 55 | A | B | 10 |
| B-30 | 113 | 146 | A | B | 10 | 9.5 | 55 | A | B | 10 |
| B-31 | 111 | 148 | A | B | 10 | 9.5 | 55 | A | B | 10 |
| B-32 | 102 | 157 | A | B | 10 | 9.5 | 55 | A | B | 10 |
| B-33 | 101 | 158 | A | B | 10 | 9.5 | 55 | A | B | 10 |
| B-34 | 101 | 158 | A | B | 10 | 9.5 | 55 | A | B | 10 |
| B-35 | 101 | 158 | A | B | 10 | 9.5 | 55 | A | B | 10 |
| B-36 | 100 | 159 | A | B | 10 | 9.5 | 55 | A | B | 10 |
| B-39 | 98  | 161 | B | C | 10 | 9.5 | 55 | B | C | 10 |
| B-41 | 97  | 162 | B | C | 10 | 9.5 | 55 | B | C | 10 |
| B-42 | 88  | 171 | B | C | 10 | 9.5 | 55 | B | C | 10 |
| B-43 | 85  | 174 | B | C | 10 | 9.5 | 55 | B | C | 10 |
| B-44 | 82  | 177 | B | C | 10 | 9.5 | 55 | B | C | 10 |
| B-46 | 81  | 178 | B | C | 10 | 9.5 | 55 | B | C | 10 |
| B-47 | 80  | 179 | B | C | 10 | 9.5 | 55 | B | C | 10 |
| B-49 | 76  | 183 | B | C | 10 | 9.5 | 55 | B | C | 10 |
| B-50 | 69  | 190 | B | C | 10 | 9.5 | 55 | B | C | 10 |
| B-51 | 66  | 193 | B | C | 10 | 9.5 | 55 | B | C | 10 |
| B-53 | 57  | 202 | B | C | 10 | 9.5 | 55 | B | C | 10 |
| B-54 | 55  | 204 | B | C | 10 | 9.5 | 55 | B | C | 10 |

| | Second component ratio: 30 wt % | | | | Second component ratio: 50 wt % | | | |
|---|---|---|---|---|---|---|---|---|
| Second component solvent B | Weight after ejection ng | Film thickness after drying nm | Storage stability | Ejection stability | Weight before ejection ng | Weight after ejection ng | Film thickness after drying nm |
| B-1  | 7 | 72 | A | A | 10 | 5 | 100 |
| B-2  | 7 | 72 | A | A | 10 | 5 | 100 |
| B-3  | 7 | 72 | A | A | 10 | 5 | 100 |
| B-4  | 7 | 72 | A | A | 10 | 5 | 100 |
| B-5  | 7 | 72 | A | A | 10 | 5 | 100 |
| B-6  | 7 | 72 | A | A | 10 | 5 | 100 |
| B-7  | 7 | 72 | A | A | 10 | 5 | 100 |
| B-8  | 7 | 72 | A | A | 10 | 5 | 100 |
| B-9  | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |

TABLE 7-continued

First component (solvent A-24): diphenyl ether, boiling point: 259° C.,
ejection weight: 10 ng, 50 droplets, film thickness: 50 nm
Film forming property: A (boiling point of first solvent A: 250° C. or higher)

| | | | | | | | |
|---|---|---|---|---|---|---|---|
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 7, when the content of the second component was within a range of 5 wt % to 50 wt %, each of the hole transport material and the light-emitting material could be dissolved in the film-forming ink, and as compared with the case where the addition of the second component was omitted, each of the hole transport layer and the light-emitting layer could be formed with a uniform thickness as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

8. When Using A-29) Cyclohexylbenzene as First Component

The above-mentioned 1-1 to 1-3 were performed except that A-29) cyclohexylbenzene was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 8, respectively.

TABLE 8

First component (solvent A-29): cyclohexylbenzene, boiling point: 236° C.,
ejection weight: 10 ng, 50 droplets, film thickness: 50 nm
Film forming property: B (boiling point of first solvent A: 200° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1 | 169 | 67 | A | A | 10 | 9.5 | 55 | A | A | 10 |
| B-2 | 165 | 71 | A | A | 10 | 9.5 | 55 | A | A | 10 |
| B-3 | 154 | 82 | A | A | 10 | 9.5 | 55 | A | A | 10 |
| B-4 | 150 | 86 | A | A | 10 | 9.5 | 55 | A | A | 10 |
| B-5 | 150 | 86 | A | A | 10 | 9.5 | 55 | A | A | 10 |
| B-6 | 148 | 88 | A | A | 10 | 9.5 | 55 | A | A | 10 |
| B-7 | 147 | 89 | A | A | 10 | 9.5 | 55 | A | A | 10 |
| B-8 | 145 | 91 | A | A | 10 | 9.5 | 55 | A | A | 10 |
| B-9 | 145 | 91 | A | A | 10 | 9.5 | 55 | A | A | 10 |
| B-10 | 144 | 92 | A | A | 10 | 9.5 | 55 | A | A | 10 |
| B-11 | 144 | 92 | A | A | 10 | 9.5 | 55 | A | A | 10 |
| B-12 | 142 | 94 | A | A | 10 | 9.5 | 55 | A | A | 10 |
| B-13 | 139 | 97 | A | A | 10 | 9.5 | 55 | A | A | 10 |
| B-14 | 138 | 98 | A | A | 10 | 9.5 | 55 | A | A | 10 |
| B-17 | 131 | 105 | A | A | 10 | 9.5 | 55 | A | A | 10 |
| B-18 | 130 | 106 | A | A | 10 | 9.5 | 55 | A | A | 10 |
| B-19 | 126 | 110 | A | B | 10 | 9.5 | 55 | A | B | 10 |
| B-20 | 124 | 112 | A | B | 10 | 9.5 | 55 | A | B | 10 |
| B-21 | 124 | 112 | A | B | 10 | 9.5 | 55 | A | B | 10 |
| B-22 | 124 | 112 | A | B | 10 | 9.5 | 55 | A | B | 10 |
| B-23 | 120 | 116 | A | B | 10 | 9.5 | 55 | A | B | 10 |
| B-24 | 120 | 116 | A | B | 10 | 9.5 | 55 | A | B | 10 |
| B-26 | 116 | 120 | A | B | 10 | 9.5 | 55 | A | B | 10 |
| B-28 | 115 | 121 | A | B | 10 | 9.5 | 55 | A | B | 10 |
| B-29 | 114 | 122 | A | B | 10 | 9.5 | 55 | A | B | 10 |
| B-30 | 113 | 123 | A | B | 10 | 9.5 | 55 | A | B | 10 |
| B-31 | 111 | 125 | A | B | 10 | 9.5 | 55 | A | B | 10 |
| B-32 | 102 | 134 | A | B | 10 | 9.5 | 55 | A | B | 10 |
| B-33 | 101 | 135 | A | B | 10 | 9.5 | 55 | A | B | 10 |
| B-34 | 101 | 135 | A | B | 10 | 9.5 | 55 | A | B | 10 |
| B-35 | 101 | 135 | A | B | 10 | 9.5 | 55 | A | B | 10 |

TABLE 8-continued

First component (solvent A-29): cyclohexylbenzene, boiling point: 236° C.,
ejection weight: 10 ng, 50 droplets, film thickness: 50 nm
Film forming property: B (boiling point of first solvent A: 200° C. or higher)

| | | | | | | | | | | |
|---|---|---|---|---|---|---|---|---|---|---|
| B-36 | 100 | 136 | A | B | 10 | 9.5 | 55 | A | B | 10 |
| B-39 | 98 | 138 | B | C | 10 | 9.5 | 55 | B | C | 10 |
| B-41 | 97 | 139 | B | C | 10 | 9.5 | 55 | B | C | 10 |
| B-42 | 88 | 148 | B | C | 10 | 9.5 | 55 | B | C | 10 |
| B-43 | 85 | 151 | B | C | 10 | 9.5 | 55 | B | C | 10 |
| B-44 | 82 | 154 | B | C | 10 | 9.5 | 55 | B | C | 10 |
| B-46 | 81 | 155 | B | C | 10 | 9.5 | 55 | B | C | 10 |
| B-47 | 80 | 156 | B | C | 10 | 9.5 | 55 | B | C | 10 |
| B-49 | 76 | 160 | B | C | 10 | 9.5 | 55 | B | C | 10 |
| B-50 | 69 | 167 | B | C | 10 | 9.5 | 55 | B | C | 10 |
| B-51 | 66 | 170 | B | C | 10 | 9.5 | 55 | B | C | 10 |
| B-53 | 57 | 179 | B | C | 10 | 9.5 | 55 | B | C | 10 |
| B-54 | 55 | 181 | B | C | 10 | 9.5 | 55 | B | C | 10 |

| | Second component ratio: 30 wt % | | | | Second component ratio: 50 wt % | | | |
|---|---|---|---|---|---|---|---|---|
| Second component solvent B | Weight after ejection ng | Film thickness after drying nm | Storage stability | Ejection stability | Weight before ejection ng | Weight after ejection ng | Film thickness after drying nm | |
| B-1 | 7 | 72 | A | A | 10 | 5 | 100 | |
| B-2 | 7 | 72 | A | A | 10 | 5 | 100 | |
| B-3 | 7 | 72 | A | A | 10 | 5 | 100 | |
| B-4 | 7 | 72 | A | A | 10 | 5 | 100 | |
| B-5 | 7 | 72 | A | A | 10 | 5 | 100 | |
| B-6 | 7 | 72 | A | A | 10 | 5 | 100 | |
| B-7 | 7 | 72 | A | A | 10 | 5 | 100 | |
| B-8 | 7 | 72 | A | A | 10 | 5 | 100 | |
| B-9 | 7 | 72 | A | A | 10 | 5 | 100 | |
| B-10 | 7 | 72 | A | A | 10 | 5 | 100 | |
| B-11 | 7 | 72 | A | A | 10 | 5 | 100 | |
| B-12 | 7 | 72 | A | A | 10 | 5 | 100 | |
| B-13 | 7 | 72 | A | A | 10 | 5 | 100 | |
| B-14 | 7 | 72 | A | A | 10 | 5 | 100 | |
| B-17 | 7 | 72 | A | A | 10 | 5 | 100 | |
| B-18 | 7 | 72 | A | A | 10 | 5 | 100 | |
| B-19 | 7 | 72 | A | B | 10 | 5 | 100 | |
| B-20 | 7 | 72 | A | B | 10 | 5 | 100 | |
| B-21 | 7 | 72 | A | B | 10 | 5 | 100 | |
| B-22 | 7 | 72 | A | B | 10 | 5 | 100 | |
| B-23 | 7 | 72 | A | B | 10 | 5 | 100 | |
| B-24 | 7 | 72 | A | B | 10 | 5 | 100 | |
| B-26 | 7 | 72 | A | B | 10 | 5 | 100 | |
| B-28 | 7 | 72 | A | B | 10 | 5 | 100 | |
| B-29 | 7 | 72 | A | B | 10 | 5 | 100 | |
| B-30 | 7 | 72 | A | B | 10 | 5 | 100 | |
| B-31 | 7 | 72 | A | B | 10 | 5 | 100 | |
| B-32 | 7 | 72 | A | B | 10 | 5 | 100 | |
| B-33 | 7 | 72 | A | B | 10 | 5 | 100 | |
| B-34 | 7 | 72 | A | B | 10 | 5 | 100 | |
| B-35 | 7 | 72 | A | B | 10 | 5 | 100 | |
| B-36 | 7 | 72 | A | B | 10 | 5 | 100 | |
| B-39 | 7 | 72 | B | C | 10 | 5 | 100 | |
| B-41 | 7 | 72 | B | C | 10 | 5 | 100 | |
| B-42 | 7 | 72 | B | C | 10 | 5 | 100 | |
| B-43 | 7 | 72 | B | C | 10 | 5 | 100 | |
| B-44 | 7 | 72 | B | C | 10 | 5 | 100 | |
| B-46 | 7 | 72 | B | C | 10 | 5 | 100 | |
| B-47 | 7 | 72 | B | C | 10 | 5 | 100 | |
| B-49 | 7 | 72 | B | C | 10 | 5 | 100 | |
| B-50 | 7 | 72 | B | C | 10 | 5 | 100 | |
| B-51 | 7 | 72 | B | C | 10 | 5 | 100 | |
| B-53 | 7 | 72 | B | C | 10 | 5 | 100 | |
| B-54 | 7 | 72 | B | C | 10 | 5 | 100 | |

As shown in Table 8, when the content of the second component was within a range of 5 wt % to 50 wt %, although each of the hole transport material and the light-emitting material could be dissolved in the film-forming ink, the film forming property resulted in being slightly poor because the stability thereof was low, however, as compared with the case where the addition of the second component was omitted, each of the hole transport layer and the light-emitting layer could be formed as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

9. When Using A-31) 1,3-Dimethyl-2-Imidazolidinone as First Component

The above-mentioned 1-1 to 1-3 were performed except that A-31) 1,3-dimethyl-2-imidazolidinone was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 9, respectively.

TABLE 9

First component (solvent A-31): 1,3-dimethyl-2-imidazolidinone, boiling point: 220° C., ejection weight: 10 ng, 50 droplets, film thickness: 50 nm
Film forming property: B (boiling point of first solvent A: 200° C. or higher)

| Second component solvent B | Boiling point | Difference in boiling point | Second component ratio: 5 wt % | | | | | Second component ratio: 30 wt % | | |
|---|---|---|---|---|---|---|---|---|---|---|
| | | | Storage stability | Ejection stability | Weight before ejection ng | Weight after ejection ng | Film thickness after drying nm | Storage stability | Ejection stability | Weight before ejection ng |
| B-1 | 169 | 51 | A | A | 10 | 9.5 | 55 | A | A | 10 |
| B-2 | 165 | 55 | A | A | 10 | 9.5 | 55 | A | A | 10 |
| B-3 | 154 | 66 | A | A | 10 | 9.5 | 55 | A | A | 10 |
| B-4 | 150 | 70 | A | A | 10 | 9.5 | 55 | A | A | 10 |
| B-5 | 150 | 70 | A | A | 10 | 9.5 | 55 | A | A | 10 |
| B-6 | 148 | 72 | A | A | 10 | 9.5 | 55 | A | A | 10 |
| B-7 | 147 | 73 | A | A | 10 | 9.5 | 55 | A | A | 10 |
| B-8 | 145 | 75 | A | A | 10 | 9.5 | 55 | A | A | 10 |
| B-9 | 145 | 75 | A | A | 10 | 9.5 | 55 | A | A | 10 |
| B-10 | 144 | 76 | A | A | 10 | 9.5 | 55 | A | A | 10 |
| B-11 | 144 | 76 | A | A | 10 | 9.5 | 55 | A | A | 10 |
| B-12 | 142 | 78 | A | A | 10 | 9.5 | 55 | A | A | 10 |
| B-13 | 139 | 81 | A | A | 10 | 9.5 | 55 | A | A | 10 |
| B-14 | 138 | 82 | A | A | 10 | 9.5 | 55 | A | A | 10 |
| B-17 | 131 | 89 | A | A | 10 | 9.5 | 55 | A | A | 10 |
| B-18 | 130 | 90 | A | A | 10 | 9.5 | 55 | A | A | 10 |
| B-19 | 126 | 94 | A | B | 10 | 9.5 | 55 | A | B | 10 |
| B-20 | 124 | 96 | A | B | 10 | 9.5 | 55 | A | B | 10 |
| B-21 | 124 | 96 | A | B | 10 | 9.5 | 55 | A | B | 10 |
| B-22 | 124 | 96 | A | B | 10 | 9.5 | 55 | A | B | 10 |
| B-23 | 120 | 100 | A | B | 10 | 9.5 | 55 | A | B | 10 |
| B-24 | 120 | 100 | A | B | 10 | 9.5 | 55 | A | B | 10 |
| B-26 | 116 | 104 | A | B | 10 | 9.5 | 55 | A | B | 10 |
| B-28 | 115 | 105 | A | B | 10 | 9.5 | 55 | A | B | 10 |
| B-29 | 114 | 106 | A | B | 10 | 9.5 | 55 | A | B | 10 |
| B-30 | 113 | 107 | A | B | 10 | 9.5 | 55 | A | B | 10 |
| B-31 | 111 | 109 | A | B | 10 | 9.5 | 55 | A | B | 10 |
| B-32 | 102 | 118 | A | B | 10 | 9.5 | 55 | A | B | 10 |
| B-33 | 101 | 119 | A | B | 10 | 9.5 | 55 | A | B | 10 |
| B-34 | 101 | 119 | A | B | 10 | 9.5 | 55 | A | B | 10 |
| B-35 | 101 | 119 | A | B | 10 | 9.5 | 55 | A | B | 10 |
| B-36 | 100 | 120 | A | B | 10 | 9.5 | 55 | A | B | 10 |
| B-39 | 98 | 122 | B | C | 10 | 9.5 | 55 | B | C | 10 |
| B-41 | 97 | 123 | B | C | 10 | 9.5 | 55 | B | C | 10 |
| B-42 | 88 | 132 | B | C | 10 | 9.5 | 55 | B | C | 10 |
| B-43 | 85 | 135 | B | C | 10 | 9.5 | 55 | B | C | 10 |
| B-44 | 82 | 138 | B | C | 10 | 9.5 | 55 | B | C | 10 |
| B-46 | 81 | 139 | B | C | 10 | 9.5 | 55 | B | C | 10 |
| B-47 | 80 | 140 | B | C | 10 | 9.5 | 55 | B | C | 10 |
| B-49 | 76 | 144 | B | C | 10 | 9.5 | 55 | B | C | 10 |
| B-50 | 69 | 151 | B | C | 10 | 9.5 | 55 | B | C | 10 |
| B-51 | 66 | 154 | B | C | 10 | 9.5 | 55 | B | C | 10 |
| B-53 | 57 | 163 | B | C | 10 | 9.5 | 55 | B | C | 10 |
| B-54 | 55 | 165 | B | C | 10 | 9.5 | 55 | B | C | 10 |

| Second component solvent B | Second component ratio: 30 wt % | | Second component ratio: 50 wt % | | | | |
|---|---|---|---|---|---|---|---|
| | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |

TABLE 9-continued

First component (solvent A-31): 1,3-dimethyl-2-imidazolidinone, boiling point: 220° C., ejection weight: 10 ng, 50 droplets, film thickness: 50 nm
Film forming property: B (boiling point of first solvent A: 200° C. or higher)

| | | | | | | | |
|---|---|---|---|---|---|---|---|
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 9, when the content of the second component was within a range of 5 wt % to 50 wt %, although each of the hole transport material and the light-emitting material could be dissolved in the film-forming ink, the film forming property resulted in being slightly poor because the stability thereof was low, however, as compared with the case where the addition of the second component was omitted, each of the hole transport layer and the light-emitting layer could be formed as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

10. When Using A-32) p-Tolunitrile as First Component

The above-mentioned 1-1 to 1-3 were performed except that A-32) p-tolunitrile was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 10, respectively.

TABLE 10

First component (solvent A-32): p-tolunitrile, boiling point: 218° C.,
ejection weight: 10 ng, 50 droplets, film thickness: 50 nm
Film forming property: B (boiling point of first solvent A: 200° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1 | 169 | 49 | A | A | 10 | 9.5 | 55 | A | A | 10 |
| B-2 | 165 | 53 | A | A | 10 | 9.5 | 55 | A | A | 10 |
| B-3 | 154 | 64 | A | A | 10 | 9.5 | 55 | A | A | 10 |
| B-4 | 150 | 68 | A | A | 10 | 9.5 | 55 | A | A | 10 |
| B-5 | 150 | 68 | A | A | 10 | 9.5 | 55 | A | A | 10 |
| B-6 | 148 | 70 | A | A | 10 | 9.5 | 55 | A | A | 10 |
| B-7 | 147 | 71 | A | A | 10 | 9.5 | 55 | A | A | 10 |
| B-8 | 145 | 73 | A | A | 10 | 9.5 | 55 | A | A | 10 |
| B-9 | 145 | 73 | A | A | 10 | 9.5 | 55 | A | A | 10 |

TABLE 10-continued

First component (solvent A-32): p-tolunitrile, boiling point: 218° C.,
ejection weight: 10 ng, 50 droplets, film thickness: 50 nm
Film forming property: B (boiling point of first solvent A: 200° C. or higher)

| | | | | | | | | | | | |
|---|---|---|---|---|---|---|---|---|---|---|---|
| B-10 | 144 | 74 | A | A | 10 | 9.5 | 55 | A | A | 10 |
| B-11 | 144 | 74 | A | A | 10 | 9.5 | 55 | A | A | 10 |
| B-12 | 142 | 76 | A | A | 10 | 9.5 | 55 | A | A | 10 |
| B-13 | 139 | 79 | A | A | 10 | 9.5 | 55 | A | A | 10 |
| B-14 | 138 | 80 | A | A | 10 | 9.5 | 55 | A | A | 10 |
| B-17 | 131 | 87 | A | A | 10 | 9.5 | 55 | A | A | 10 |
| B-18 | 130 | 88 | A | A | 10 | 9.5 | 55 | A | A | 10 |
| B-19 | 126 | 92 | A | B | 10 | 9.5 | 55 | A | B | 10 |
| B-20 | 124 | 94 | A | B | 10 | 9.5 | 55 | A | B | 10 |
| B-21 | 124 | 94 | A | B | 10 | 9.5 | 55 | A | B | 10 |
| B-22 | 124 | 94 | A | B | 10 | 9.5 | 55 | A | B | 10 |
| B-23 | 120 | 98 | A | B | 10 | 9.5 | 55 | A | B | 10 |
| B-24 | 120 | 98 | A | B | 10 | 9.5 | 55 | A | B | 10 |
| B-26 | 116 | 102 | A | B | 10 | 9.5 | 55 | A | B | 10 |
| B-28 | 115 | 103 | A | B | 10 | 9.5 | 55 | A | B | 10 |
| B-29 | 114 | 104 | A | B | 10 | 9.5 | 55 | A | B | 10 |
| B-30 | 113 | 105 | A | B | 10 | 9.5 | 55 | A | B | 10 |
| B-31 | 111 | 107 | A | B | 10 | 9.5 | 55 | A | B | 10 |
| B-32 | 102 | 116 | A | B | 10 | 9.5 | 55 | A | B | 10 |
| B-33 | 101 | 117 | A | B | 10 | 9.5 | 55 | A | B | 10 |
| B-34 | 101 | 117 | A | B | 10 | 9.5 | 55 | A | B | 10 |
| B-35 | 101 | 117 | A | B | 10 | 9.5 | 55 | A | B | 10 |
| B-36 | 100 | 118 | A | B | 10 | 9.5 | 55 | A | B | 10 |
| B-39 | 98 | 120 | B | C | 10 | 9.5 | 55 | B | C | 10 |
| B-41 | 97 | 121 | B | C | 10 | 9.5 | 55 | B | C | 10 |
| B-42 | 88 | 130 | B | C | 10 | 9.5 | 55 | B | C | 10 |
| B-43 | 85 | 133 | B | C | 10 | 9.5 | 55 | B | C | 10 |
| B-44 | 82 | 136 | B | C | 10 | 9.5 | 55 | B | C | 10 |
| B-46 | 81 | 137 | B | C | 10 | 9.5 | 55 | B | C | 10 |
| B-47 | 80 | 138 | B | C | 10 | 9.5 | 55 | B | C | 10 |
| B-49 | 76 | 142 | B | C | 10 | 9.5 | 55 | B | C | 10 |
| B-50 | 69 | 149 | B | C | 10 | 9.5 | 55 | B | C | 10 |
| B-51 | 66 | 152 | B | C | 10 | 9.5 | 55 | B | C | 10 |
| B-53 | 57 | 161 | B | C | 10 | 9.5 | 55 | B | C | 10 |
| B-54 | 55 | 163 | B | C | 10 | 9.5 | 55 | B | C | 10 |

| | Second component ratio: 30 wt % | | | | Second component ratio: 50 wt % | | | |
|---|---|---|---|---|---|---|---|---|
| Second component solvent B | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |

TABLE 10-continued

First component (solvent A-32): p-tolunitrile, boiling point: 218° C.,
ejection weight: 10 ng, 50 droplets, film thickness: 50 nm
Film forming property: B (boiling point of first solvent A: 200° C. or higher)

| | | | | | | | |
|---|---|---|---|---|---|---|---|
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 10, when the content of the second component was within a range of 5 wt % to 50 wt %, although each of the hole transport material and the light-emitting material could be dissolved in the film-forming ink, the film forming property resulted in being slightly poor because the stability thereof was low, however, as compared with the case where the addition of the second component was omitted, each of the hole transport layer and the light-emitting layer could be formed as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

11. When Using A-36) o-Tolunitrile as First Component

The above-mentioned 1-1 to 1-3 were performed except that A-36) o-tolunitrile was used as the first component in place of A-1) 1,1-bis(3,4-dimethylphenyl)ethane, and the preparation of film-forming inks, formation of a hole transport layer and a light-emitting layer, and evaluation thereof were performed.

The evaluation results obtained as described above are shown in the following Table 11, respectively.

TABLE 11

First component (solvent A-36): o-tolunitrile, boiling point: 205° C.,
ejection weight: 10 ng, 50 droplets, film thickness: 50 nm
Film forming property: B (boiling point of first solvent A: 200° C. or higher)

| | | | Second component ratio: 5 wt % | | | | | Second component ratio: 30 wt % | | |
|---|---|---|---|---|---|---|---|---|---|---|
| Second component solvent B | Boiling point | Difference in boiling point | Storage stability | Ejection stability | Weight before ejection ng | Weight after ejection ng | Film thickness after drying nm | Storage stability | Ejection stability | Weight before ejection ng |
| B-1  | 169 | 36  | A | A | 10 | 9.5 | 55 | A | A | 10 |
| B-2  | 165 | 40  | A | A | 10 | 9.5 | 55 | A | A | 10 |
| B-3  | 154 | 51  | A | A | 10 | 9.5 | 55 | A | A | 10 |
| B-4  | 150 | 55  | A | A | 10 | 9.5 | 55 | A | A | 10 |
| B-5  | 150 | 55  | A | A | 10 | 9.5 | 55 | A | A | 10 |
| B-6  | 148 | 57  | A | A | 10 | 9.5 | 55 | A | A | 10 |
| B-7  | 147 | 58  | A | A | 10 | 9.5 | 55 | A | A | 10 |
| B-8  | 145 | 60  | A | A | 10 | 9.5 | 55 | A | A | 10 |
| B-9  | 145 | 60  | A | A | 10 | 9.5 | 55 | A | A | 10 |
| B-10 | 144 | 61  | A | A | 10 | 9.5 | 55 | A | A | 10 |
| B-11 | 144 | 63  | A | A | 10 | 9.5 | 55 | A | A | 10 |
| B-12 | 142 | 66  | A | A | 10 | 9.5 | 55 | A | A | 10 |
| B-13 | 139 | 67  | A | A | 10 | 9.5 | 55 | A | A | 10 |
| B-14 | 138 | 74  | A | A | 10 | 9.5 | 55 | A | A | 10 |
| B-17 | 131 | 75  | A | A | 10 | 9.5 | 55 | A | A | 10 |
| B-18 | 130 | 79  | A | A | 10 | 9.5 | 55 | A | A | 10 |
| B-19 | 126 | 81  | A | B | 10 | 9.5 | 55 | A | B | 10 |
| B-20 | 124 | 81  | A | B | 10 | 9.5 | 55 | A | B | 10 |
| B-21 | 124 | 81  | A | B | 10 | 9.5 | 55 | A | B | 10 |
| B-22 | 124 | 85  | A | B | 10 | 9.5 | 55 | A | B | 10 |
| B-23 | 120 | 85  | A | B | 10 | 9.5 | 55 | A | B | 10 |
| B-24 | 120 | 85  | A | B | 10 | 9.5 | 55 | A | B | 10 |
| B-26 | 116 | 89  | A | B | 10 | 9.5 | 55 | A | B | 10 |
| B-28 | 115 | 90  | A | B | 10 | 9.5 | 55 | A | B | 10 |
| B-29 | 114 | 91  | A | B | 10 | 9.5 | 55 | A | B | 10 |
| B-30 | 113 | 92  | A | B | 10 | 9.5 | 55 | A | B | 10 |
| B-31 | 111 | 94  | A | B | 10 | 9.5 | 55 | A | B | 10 |
| B-32 | 102 | 103 | A | B | 10 | 9.5 | 55 | A | B | 10 |
| B-33 | 101 | 104 | A | B | 10 | 9.5 | 55 | A | B | 10 |
| B-34 | 101 | 104 | A | B | 10 | 9.5 | 55 | A | B | 10 |

TABLE 11-continued

First component (solvent A-36): o-tolunitrile, boiling point: 205° C.,
ejection weight: 10 ng, 50 droplets, film thickness: 50 nm
Film forming property: B (boiling point of first solvent A: 200° C. or higher)

| | | | | | | | | | | | |
|---|---|---|---|---|---|---|---|---|---|---|---|
| B-35 | 101 | 104 | A | B | 10 | 9.5 | 55 | A | B | 10 |
| B-36 | 100 | 105 | A | B | 10 | 9.5 | 55 | A | B | 10 |
| B-39 | 98 | 107 | B | C | 10 | 9.5 | 55 | B | C | 10 |
| B-41 | 97 | 108 | B | C | 10 | 9.5 | 55 | B | C | 10 |
| B-42 | 88 | 117 | B | C | 10 | 9.5 | 55 | B | C | 10 |
| B-43 | 85 | 120 | B | C | 10 | 9.5 | 55 | B | C | 10 |
| B-44 | 82 | 123 | B | C | 10 | 9.5 | 55 | B | C | 10 |
| B-46 | 81 | 124 | B | C | 10 | 9.5 | 55 | B | C | 10 |
| B-47 | 80 | 125 | B | C | 10 | 9.5 | 55 | B | C | 10 |
| B-49 | 76 | 129 | B | C | 10 | 9.5 | 55 | B | C | 10 |
| B-50 | 69 | 136 | B | C | 10 | 9.5 | 55 | B | C | 10 |
| B-51 | 66 | 139 | B | C | 10 | 9.5 | 55 | B | C | 10 |
| B-53 | 57 | 148 | B | C | 10 | 9.5 | 55 | B | C | 10 |
| B-54 | 55 | 150 | B | C | 10 | 9.5 | 55 | B | C | 10 |

| | Second component ratio: 30 wt % | | | Second component ratio: 50 wt % | | | | |
|---|---|---|---|---|---|---|---|---|
| Second component solvent B | Weight after ejection ng | Film thickness after drying nm | Storage stability | Ejection stability | Weight before ejection ng | Weight after ejection ng | Film thickness after drying nm |
| B-1 | 7 | 72 | A | A | 10 | 5 | 100 |
| B-2 | 7 | 72 | A | A | 10 | 5 | 100 |
| B-3 | 7 | 72 | A | A | 10 | 5 | 100 |
| B-4 | 7 | 72 | A | A | 10 | 5 | 100 |
| B-5 | 7 | 72 | A | A | 10 | 5 | 100 |
| B-6 | 7 | 72 | A | A | 10 | 5 | 100 |
| B-7 | 7 | 72 | A | A | 10 | 5 | 100 |
| B-8 | 7 | 72 | A | A | 10 | 5 | 100 |
| B-9 | 7 | 72 | A | A | 10 | 5 | 100 |
| B-10 | 7 | 72 | A | A | 10 | 5 | 100 |
| B-11 | 7 | 72 | A | A | 10 | 5 | 100 |
| B-12 | 7 | 72 | A | A | 10 | 5 | 100 |
| B-13 | 7 | 72 | A | A | 10 | 5 | 100 |
| B-14 | 7 | 72 | A | A | 10 | 5 | 100 |
| B-17 | 7 | 72 | A | A | 10 | 5 | 100 |
| B-18 | 7 | 72 | A | A | 10 | 5 | 100 |
| B-19 | 7 | 72 | A | B | 10 | 5 | 100 |
| B-20 | 7 | 72 | A | B | 10 | 5 | 100 |
| B-21 | 7 | 72 | A | B | 10 | 5 | 100 |
| B-22 | 7 | 72 | A | B | 10 | 5 | 100 |
| B-23 | 7 | 72 | A | B | 10 | 5 | 100 |
| B-24 | 7 | 72 | A | B | 10 | 5 | 100 |
| B-26 | 7 | 72 | A | B | 10 | 5 | 100 |
| B-28 | 7 | 72 | A | B | 10 | 5 | 100 |
| B-29 | 7 | 72 | A | B | 10 | 5 | 100 |
| B-30 | 7 | 72 | A | B | 10 | 5 | 100 |
| B-31 | 7 | 72 | A | B | 10 | 5 | 100 |
| B-32 | 7 | 72 | A | B | 10 | 5 | 100 |
| B-33 | 7 | 72 | A | B | 10 | 5 | 100 |
| B-34 | 7 | 72 | A | B | 10 | 5 | 100 |
| B-35 | 7 | 72 | A | B | 10 | 5 | 100 |
| B-36 | 7 | 72 | A | B | 10 | 5 | 100 |
| B-39 | 7 | 72 | B | C | 10 | 5 | 100 |
| B-41 | 7 | 72 | B | C | 10 | 5 | 100 |
| B-42 | 7 | 72 | B | C | 10 | 5 | 100 |
| B-43 | 7 | 72 | B | C | 10 | 5 | 100 |
| B-44 | 7 | 72 | B | C | 10 | 5 | 100 |
| B-46 | 7 | 72 | B | C | 10 | 5 | 100 |
| B-47 | 7 | 72 | B | C | 10 | 5 | 100 |
| B-49 | 7 | 72 | B | C | 10 | 5 | 100 |
| B-50 | 7 | 72 | B | C | 10 | 5 | 100 |
| B-51 | 7 | 72 | B | C | 10 | 5 | 100 |
| B-53 | 7 | 72 | B | C | 10 | 5 | 100 |
| B-54 | 7 | 72 | B | C | 10 | 5 | 100 |

As shown in Table 11, when the content of the second component was within a range of 5 wt % to 50 wt %, although each of the hole transport material and the light-emitting material could be dissolved in the film-forming ink, the film forming property resulted in being slightly poor because the stability thereof was low, however, as compared with the case where the addition of the second component was omitted, each of the hole transport layer and the light-emitting layer could be formed as a film having a large thickness.

Incidentally, when the boiling point of the second component was lower than 130° C., accompanying the volatilization thereof, the formation of a liquid droplet at the time of ejection was affected, and the ejection stability showed a tendency to become unstable, and in particular, when the boiling point of the second component was lower than 100° C., the tendency resulted in being prominently observed.

REFERENCE SIGNS LIST

1: film-forming ink, 1A: liquid coating film, 1B: film, 3: anode, 4: hole injection layer, 4A: film-forming ink, 5: hole transport layer, 6: red light-emitting layer, 10: electron transport layer, 11: electron injection layer, 12: cathode, 14: stacked body, 14R, 14G, 14B: stacked body, 15, 15A: base material, 16: partition wall, 17: opening part, 19: transmission layer, 19B: colored layer, 19BA: film-forming ink, 19G: colored layer, 19GA: film-forming ink, 19R: colored layer, 19RA: film-forming ink, 20: substrate, 21: substrate, 22: flattening layer, 24: switching element, 27: conductive part, 31: partition wall, 32: reflective film, 33: anti-corrosion film, 34: cathode cover, 35: resin layer, 36: partition wall, 100: liquid droplet ejection device, 101: light-emitting device, 102: transmission filter, 103: color filter, 110: head, 111: head main body, 112: vibrating plate, 113: piezo element, 114: main body, 115: nozzle plate, 115P: ink ejection surface, 116: reservoir, 117: ink chamber, 118: nozzle, 130: base, 140: table, 170: table positioning unit, 171: first moving unit, 172: motor, 180: head positioning unit, 181: second moving unit, 182: linear motor, 183, 184, 185: motor, 190: control device, 191: driving circuit, 200: light-emitting element, 200R, 200G, 200B: light-emitting element, 241: semiconductor layer, 242: gate insulating layer, 243: gate electrode, 244: source electrode, 245: drain electrode, 300: display device, 300R, 300G, 300B: sub-pixel, 311: partition wall surface, 1100: personal computer, 1102: key board, 1104: main body part, 1106: display unit, 1200: mobile phone, 1202: operation button, 1204: earpiece, 1206: mouthpiece, 1300: digital still camera, 1302: case, 1304: light receiving unit, 1306: shutter button, 1308: circuit board, 1312: video signal output terminal, 1314: input/output terminal, 1430: television monitor, 1440: personal computer The entire disclosure of Japanese Patent Application No. 2014-244520,filed Dec. 2, 2014 is expressly incorporated by reference herein.

The invention claimed is:

1. A film-forming ink comprising:
a film-forming material; and
a liquid medium in which the film-forming material is dissolved or dispersed,
wherein the liquid medium contains a first component which has a boiling point at an atmospheric pressure of 250° C. or higher and 298° C. or lower, and a second component which has a boiling point at an atmospheric pressure lower than the first component, and
a content of the second component with respect to a total amount of the film-forming ink is 5.0 wt % or more and 30 wt % or less.

2. The film-forming ink according to claim 1, wherein the second component has a boiling point at an atmospheric pressure of 50° C. or higher and 170° C. or lower.

3. The film-forming ink according to claim 1, wherein the first component and the second component have a difference in boiling point at an atmospheric pressure of 30° C. or more.

4. The film-forming ink according to claim 1, wherein the first component has a solubility capable of dissolving the film-forming material in an amount of 1.5 wt % or more and 4.5 wt % or less of the first component.

5. The film-forming ink according to claim 1, wherein the film-forming ink is supplied as a liquid droplet to a concave part included in a wall part on a substrate, followed by drying, thereby forming a film.

6. The film-forming ink according to claim 5, wherein the liquid droplet has a weight of 2 ng or more and 12 ng or less when it is ejected.

7. The film-forming ink according to claim 5, wherein the volume of the liquid droplet is set such that the volume thereof at the time of landing is smaller than the volume thereof at the time of ejection by volatilization of the second component after the ejection.

8. A film formation method, characterized by comprising:
a step of supplying the film-forming ink according to claim 1 as a liquid droplet into a concave part included in a partition wall provided on a base material, thereby forming a liquid coating film; and
a step of drying the liquid coating film by heating, thereby forming a film in the concave part.

9. A device with a film, characterized by comprising a film formed by the film formation method according to claim 8 or a film obtained by treating the film.

10. An electronic apparatus, characterized by comprising the device with a film according to claim 9.

11. The film-forming ink according to claim 1, wherein the first component has a solubility capable of dissolving the film-forming material in an amount of 0.5 wt % or more of the first component, and
the second component has a solubility capable of dissolving the film-forming material in an amount of 0.1 wt % or more of the second component.

12. The film-forming ink according to claim 1, wherein the film-forming material is hole transport material.

13. A film-forming ink comprising:
hole transport material;
a first liquid medium that is at least one kind of liquid medium selected from a first group consisting of 1,1-bis(3,4-dimethylphenyl)ethane, 4-isopropylbiphenyl, and 2-phenoxytoluene; and
a second liquid medium that is at least one kind of liquid medium selected from a second group consisting of 1,2,4-trimethylbenzene, 1,3,5-trimethylbenzene, 3-fluoro-o-xylene, 2-fluoro-m-xylene, ethylene glycol monomethyl ether acetate, 2,6-lutidine, 1,2,4-trimethylcyclohexane, 2-hexanol, chlorobenzene, and cyclopentanone.

14. A film-forming ink comprising:
hole transport material;
a first liquid medium that is at least one kind of liquid medium selected from a first group consisting of 1,1-bis(3,4-dimethylphenyl)ethane, 4-isopropylbiphenyl, biphenyl ether, 2,2,5-tri-methyl biphenyl ether, and 2-phenoxytoluene; and
a second liquid medium that is at least one kind of liquid medium selected from a second group consisting of 1,2,4-trimethylbenzene, 1,3,5-trimethylbenzene, 3-fluoro-o-xylene, 4-heptane, 3-heptane, 2-fluoro-m-xylene, 2-heptane, ethylene glycol monomethyl ether acetate, 2,6-lutidine, 1,2,4-trimethylcyclohexane, 2-hexanol, chlorobenzene, and cyclopentanone.

* * * * *